(12) United States Patent
Watanabe et al.

(10) Patent No.: US 12,113,064 B2
(45) Date of Patent: Oct. 8, 2024

(54) DIODE CHIP

(71) Applicant: ROHM CO., LTD., Kyoto (JP)

(72) Inventors: Keishi Watanabe, Kyoto (JP); Junya Yamagami, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 133 days.

(21) Appl. No.: 17/018,486

(22) Filed: Sep. 11, 2020

(65) Prior Publication Data

US 2021/0098449 A1    Apr. 1, 2021

(30) Foreign Application Priority Data

Sep. 30, 2019  (JP) ................................. 2019-180820

(51) Int. Cl.
*H01L 27/08*      (2006.01)
*H01L 29/861*     (2006.01)
*H01L 29/866*     (2006.01)

(52) U.S. Cl.
CPC ........ *H01L 27/0814* (2013.01); *H01L 29/861* (2013.01); *H01L 29/866* (2013.01)

(58) Field of Classification Search
CPC ............. H01L 27/0814; H01L 29/0649; H01L 29/0692; H01L 29/66121; H01L 29/861; H01L 29/866; H01L 29/6609; H01L 29/66106; H01L 29/868
See application file for complete search history.

(56) References Cited

U.S. PATENT DOCUMENTS

| 8,981,425 B2 * | 3/2015 | Bobde ............... H01L 29/66106 |
| | | 257/361 |
| 9,773,777 B2 * | 9/2017 | Strachan ............. H01L 29/0623 |
| 2010/0244090 A1 | 9/2010 | Bobde et al. |

(Continued)

FOREIGN PATENT DOCUMENTS

| CN | 112038335 A | 12/2020 |
| JP | 2012-004350 A | 1/2012 |
| JP | 2018067663 A | 4/2018 |

OTHER PUBLICATIONS

Chinese Office Action and Search Report Issued by Chinese Patent Office dated May 8, 2023 with English Translation.
(Continued)

*Primary Examiner* — Shouxiang Hu
(74) *Attorney, Agent, or Firm* — Rabin & Berdo, P.C.

(57) ABSTRACT

The present disclosure provides a diode chip capable of attaining excellent electrical characteristics.
The present disclosure provides a diode chip (1), including: a semiconductor chip (10) having a first main surface (11); a first pin junction portion (31) formed on a surface of the first main surface (11) with a first polarity direction; a first diode pair (37) (rectifier pair) including a first pn junction portion (35) separated from the first pin junction portion (31) and formed in the semiconductor chip (10) with the first polarity direction and a first reversed pin junction portion (38) connected to the first pn junction portion (35) in reversed direction and formed on the first main surface (11) with a second polarity direction; and a first junction separation trench (46) formed on the first main surface (11) in a manner of separating the first pin junction portion (31) and the first diode pair (37).

24 Claims, 39 Drawing Sheets

(56) References Cited

U.S. PATENT DOCUMENTS

2016/0093605 A1* 3/2016 Sai ..................... H01L 27/0814
                                                       257/491
2018/0175018 A1* 6/2018 Suresh ................ H01L 29/0649
2020/0381424 A1* 12/2020 Shukla .............. H01L 23/49562

OTHER PUBLICATIONS

Japanese Office Action for Japan Patent Office on Aug. 17, 2023 and its English Translation.
Japanese Search Report Conducted by Japan Patent Office on Aug. 8, 2023 and its English Translation.

* cited by examiner

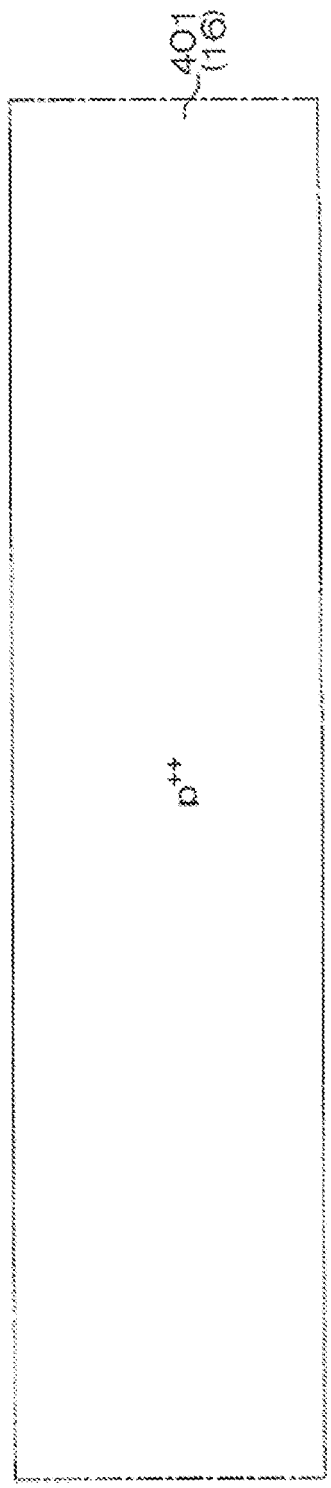

DIODE CHIP

BACKGROUND OF THE INVENTION

Field of the Invention

The present disclosure relates to a diode chip.

Description of the Prior Art

Citation Document 1 discloses a semiconductor device which includes a semiconductor substrate and a TVS circuit (transient voltage suppressor circuit) formed on the semiconductor substrate. The TVS circuit includes multiple diodes including a Zener diode.

PRIOR ART DOCUMENT

Patent Document

[Citation Document 1] Japan published patent application 2012-4350, filed on Jun. 17, 2010, entitled "Semiconductor device and method of manufacturing the same," the disclosure of which is hereby incorporated herein by reference.

SUMMARY OF THE INVENTION

Problem to be Solved by Present Disclosure

The present disclosure provides, in an embodiment, a diode chip capable of attaining excellent electrical characteristics.

Technical Means to Solve Problem

The present disclosure provides, in an embodiment, a diode chip, including: a semiconductor chip, having a main surface; a pin junction portion, formed on a surface of the main surface with a first polarity direction; a rectifier pair, including a pn junction portion and a reversed pin junction portion, wherein the pn junction portion is separated from the pin junction portion and formed in the semiconductor chip with the first polarity direction, and the reversed pin junction portion is connected to the pn junction portion in reversed direction and formed on the surface of the main surface with a second polarity direction; and a junction separation trench, formed on the main surface and adapted to separate the pin junction portion and the rectifier pair.

The diode chip uses the junction separation trench to suppress undesirable diffusion of dopants between the pin junction portion, pn junction portion and reversed pin junction portion. Therefore, the pin junction portion, pn junction portion and reversed pin junction portion are appropriately formed. Therefore, the present disclosure can provide a diode chip capable of attaining excellent electrical characteristics.

The present disclosure provides, in an embodiment, a diode chip, including: a semiconductor chip; a region separation structure, adapted to divide the semiconductor chip into a first device region and a second device region; a first pin junction portion, formed on a surface of the first device region with a first polarity direction; a first rectifier pair, including a first pn junction portion and a first reversed pin junction portion, wherein the first pn junction portion is separated from the first pin junction portion and formed in the first device region with the first polarity direction, and the first reversed pin junction portion is connected to the first pn junction portion in reversed direction and formed on the surface of the first device region with a second polarity direction; a first junction separation trench, formed in the first device region and adapted to separate the first pin junction portion and the first rectifier pair; a second pin junction portion, formed on the surface of the second device region with the first polarity direction; a second rectifier pair, including a second pn junction portion and a second reversed pin junction portion, wherein the second pn junction portion is separated from the second pin junction portion and formed in the second device region with the first polarity direction, and the second reversed pin junction portion is connected to the second pn junction portion in reversed direction and formed on the surface of the second device region with the second polarity direction; and a second junction separation trench, formed in the second device region and adapted to separate the second pin junction portion and the second rectifier pair.

In the first device region of the diode chip, the first junction separation trench suppresses undesirable diffusion of dopants between the first pin junction portion, the first pn junction portion and the first reversed pin junction portion. Therefore, in the first device region, the first pin junction portion, the first pn junction portion and the first reversed pin junction portion are appropriately formed.

In the second device region, the second junction separation trench suppresses undesirable diffusion of dopants between the second pin junction portion, the second pn junction portion and the second reversed pin junction portion. Therefore, the second pin junction portion, the second pn junction portion and the second reversed pin junction portion are appropriately formed in the second device region. Therefore, the present disclosure can provide a diode chip capable of attaining excellent electrical characteristics.

BRIEF DESCRIPTION OF THE DRAWINGS

FIG. 15A is a cross-sectional view of a manufacturing method applicable to the diode chip shown in FIG. 1 in an embodiment of the present disclosure.

DETAILED DESCRIPTION OF THE EMBODIMENTS

Embodiments of the present disclosure are hereunder described with reference made to the accompanying diagrams.

Figure 1:
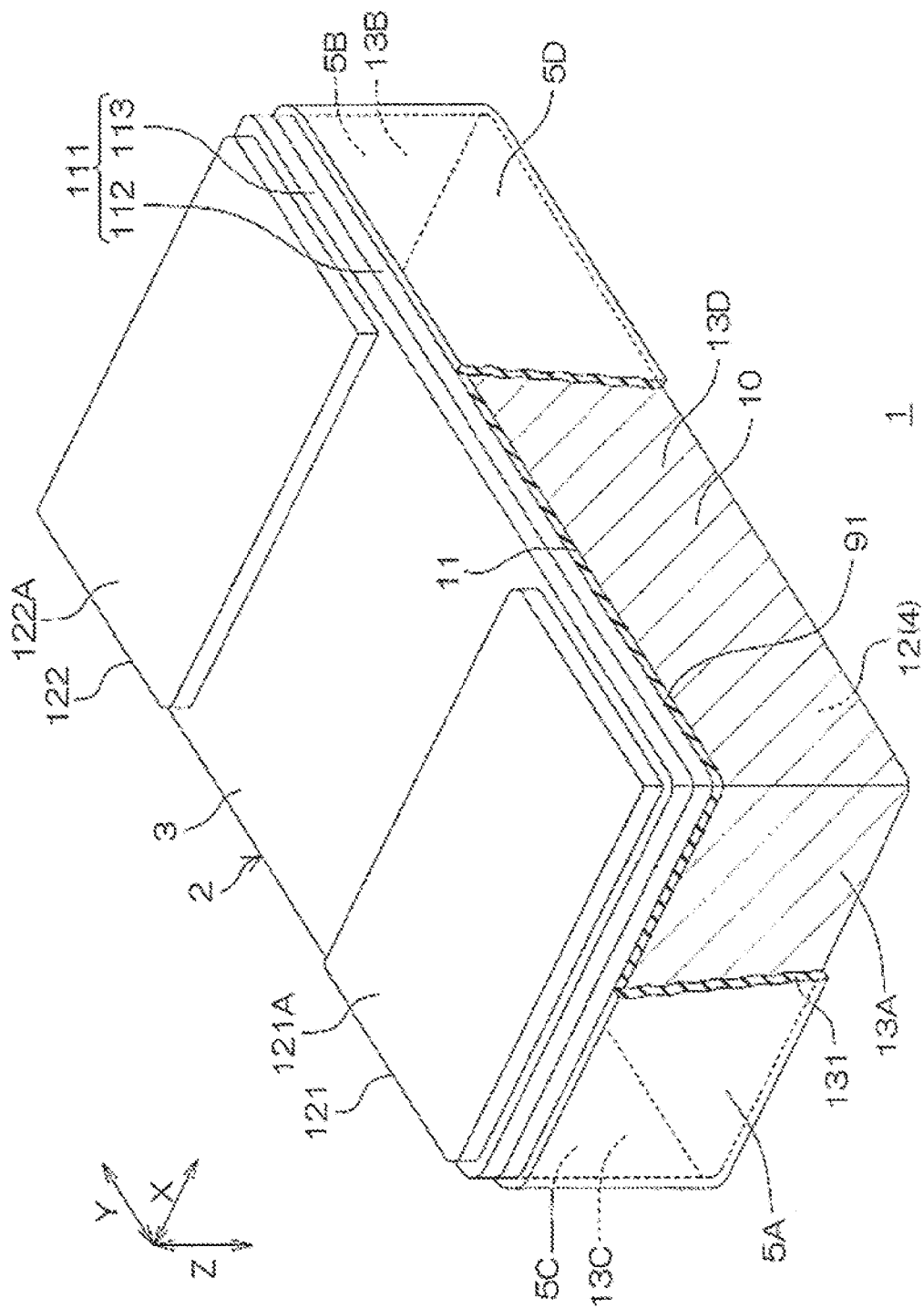
FIG. 1 is a cutaway view of a diode chip in the first embodiment of the present disclosure.
Figure 2:
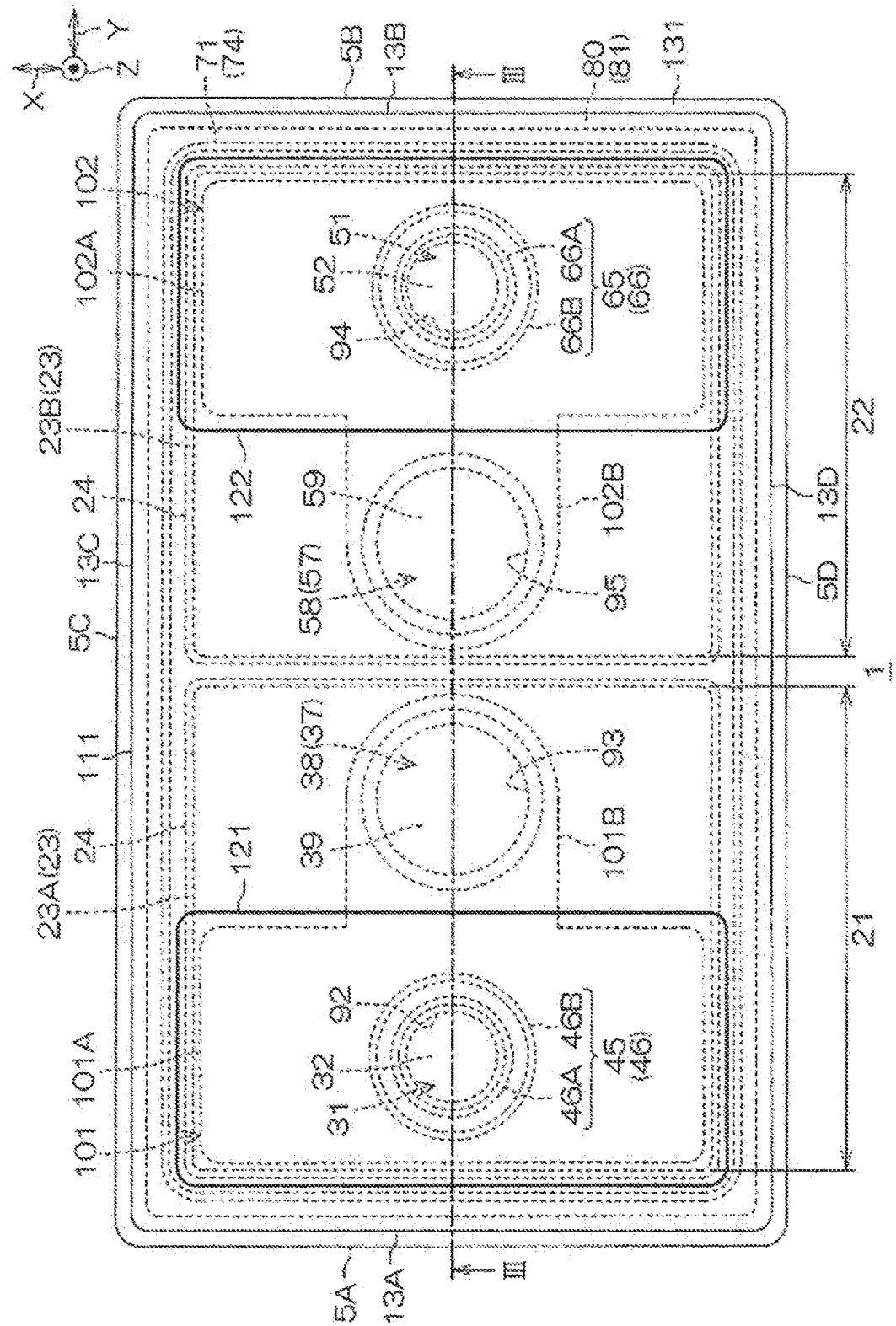
FIG. 2 is a top view of the diode chip shown in FIG. 1.
Figure 3:
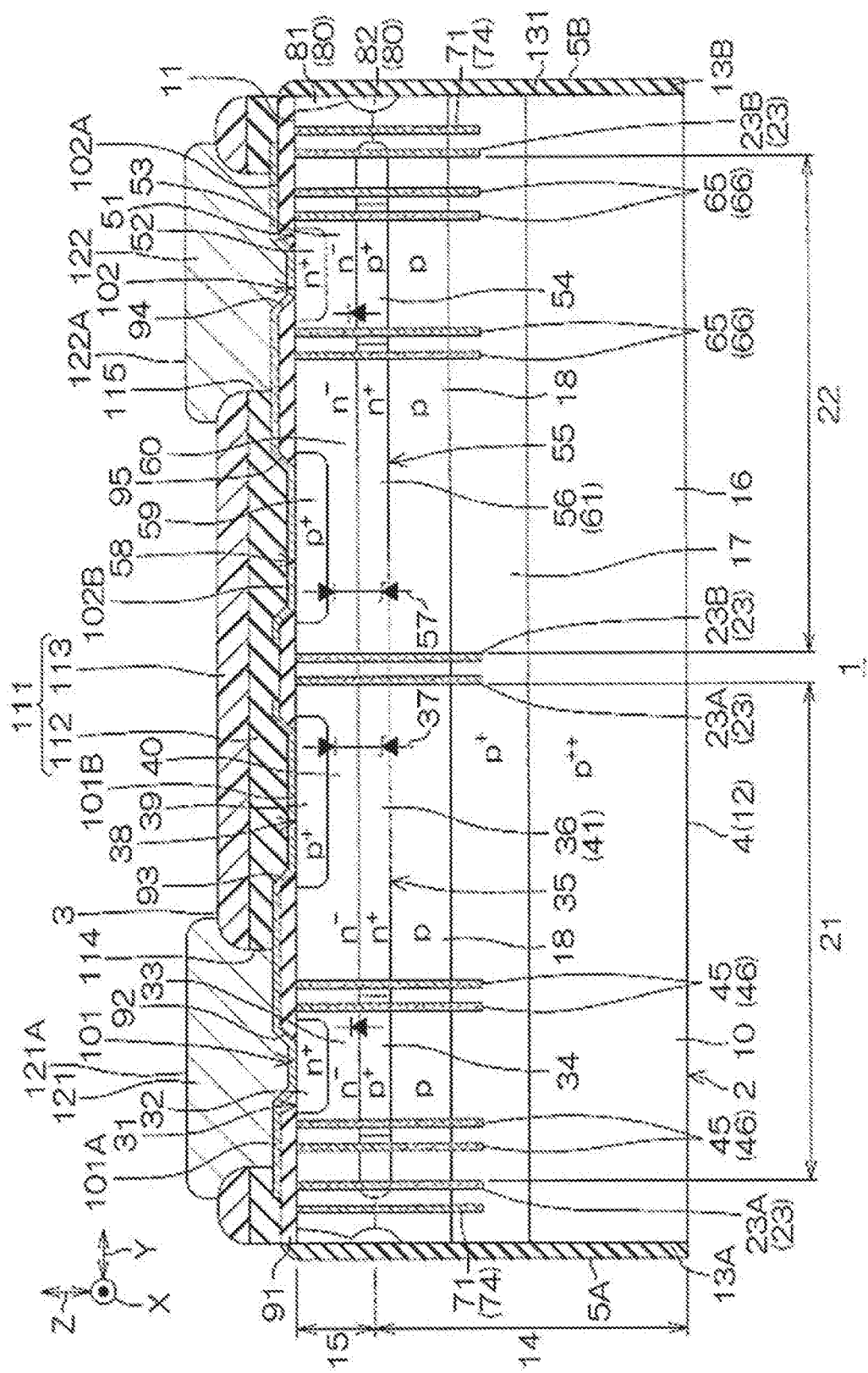
FIG. 3 is a cross-sectional view taken along line III-III of FIG. 2.
Figure 4:
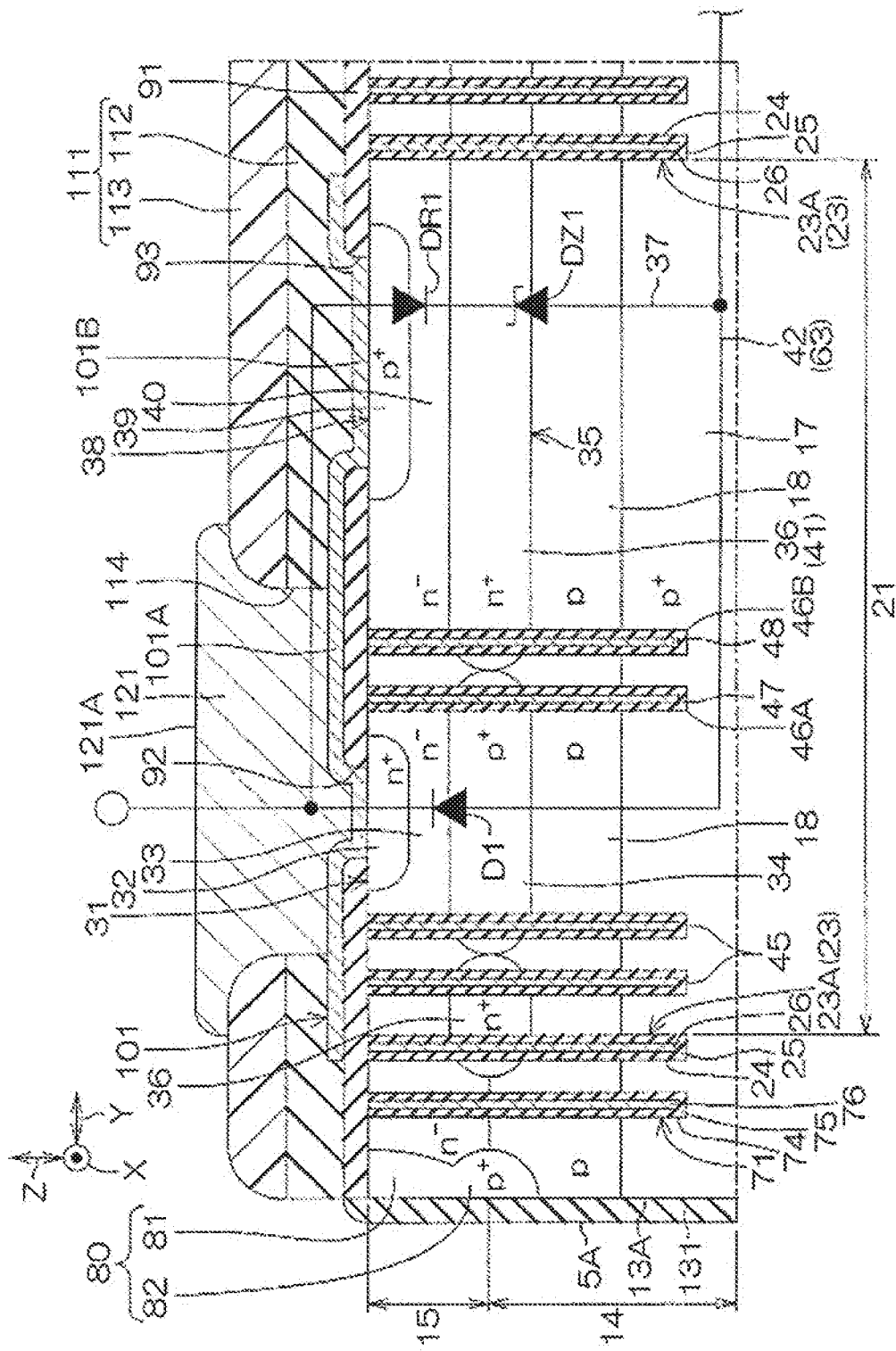
FIG. 4 is an enlarged cross-sectional view of a first device region shown in FIG. 3.
Figure 5:
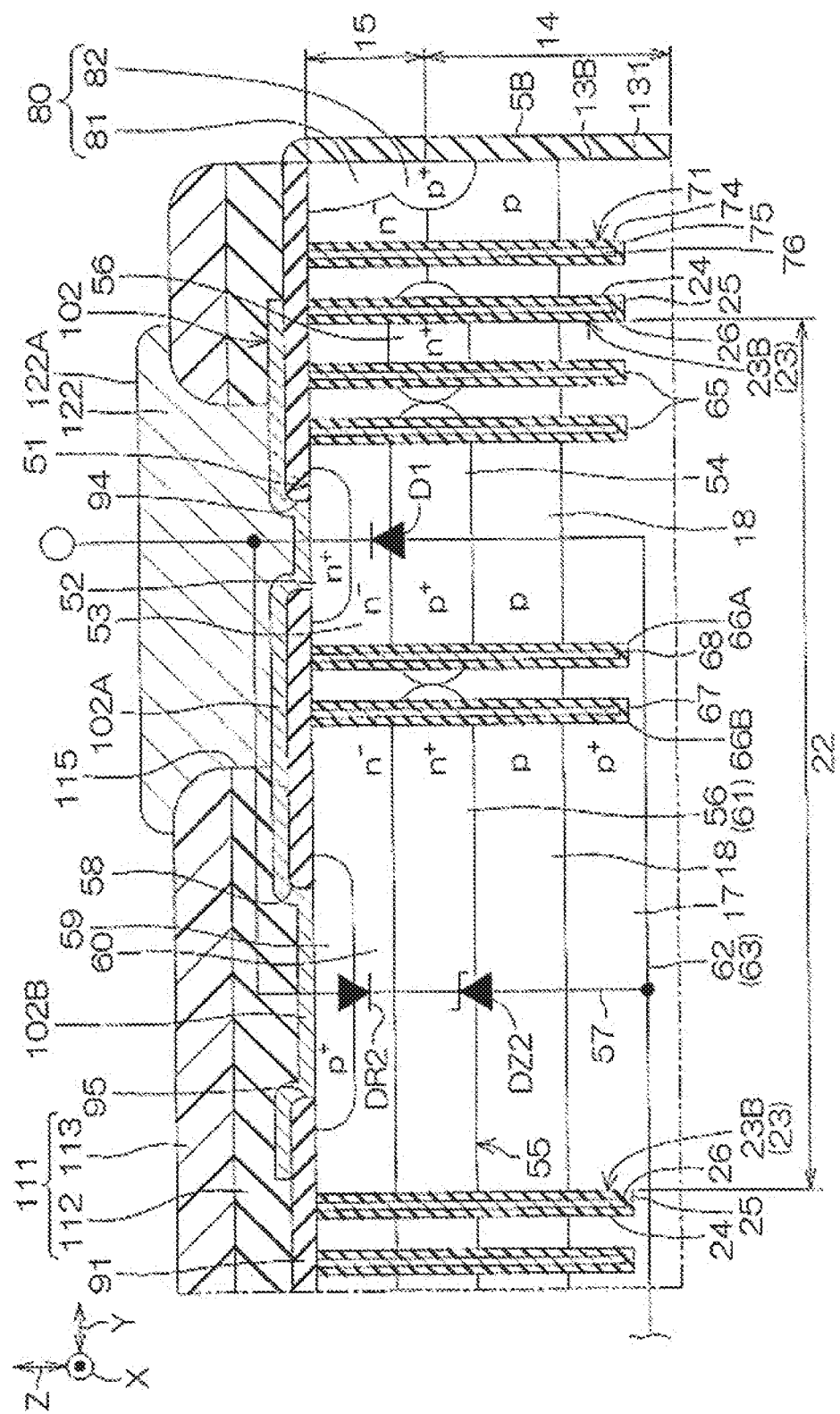
FIG. 5 is an enlarged cross-sectional view of a second device region shown in FIG. 3.
Figure 6:
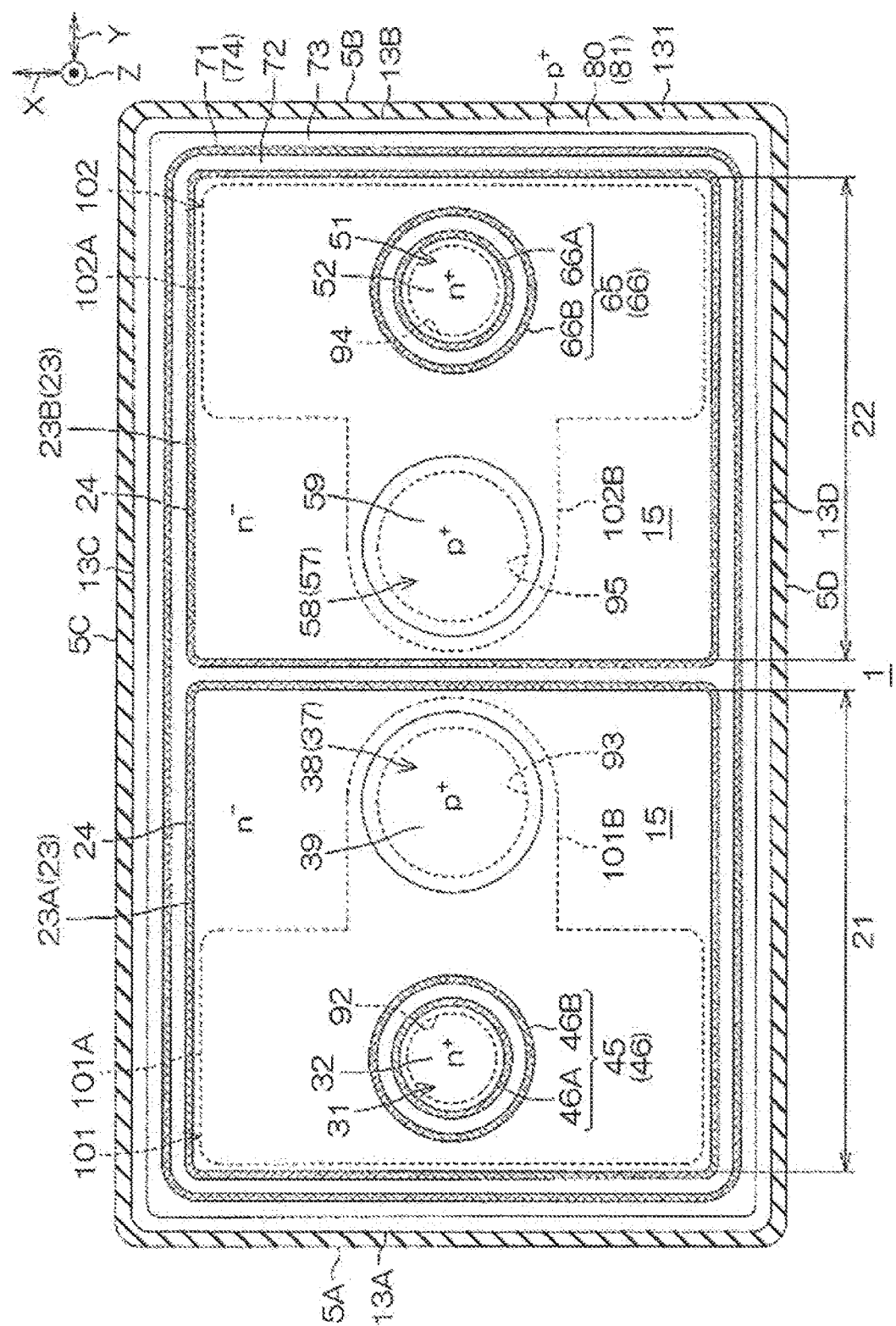
FIG. 6 is a top view of a first main surface of a semiconductor chip.
Figure 7:
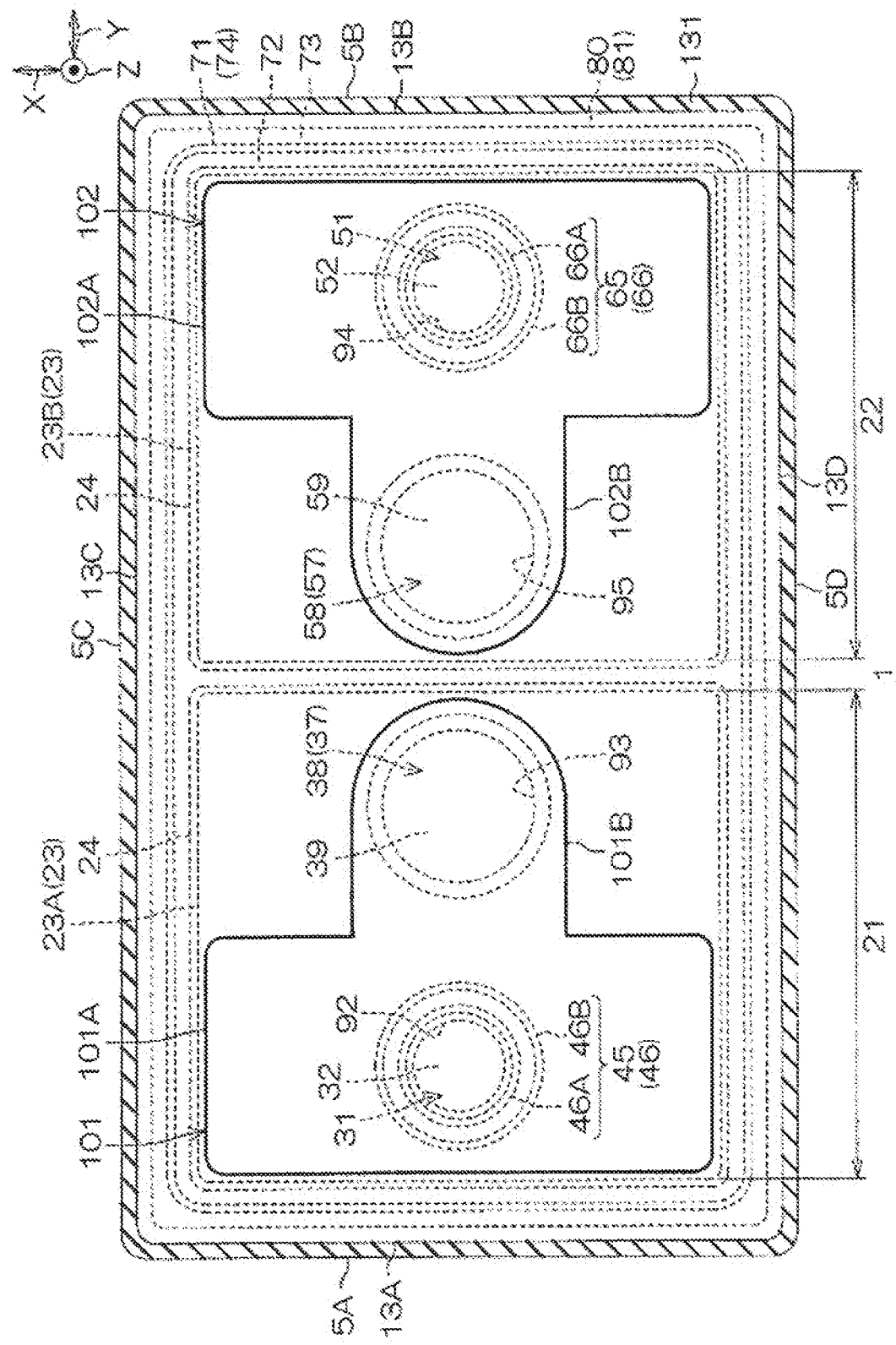
FIG. 7 is a top view of a first electrode layer and a second electrode layer.

FIG. 1 is a cutaway view of a diode chip 1 in the first embodiment of the present disclosure. FIG. 2 is a top view of the diode chip 1 shown in FIG. 1. FIG. 3 is a cross-sectional view taken along line III-III of FIG. 2. FIG. 4 is an enlarged cross-sectional view of a first device region 21 shown in FIG. 3. FIG. 5 is an enlarged cross-sectional view of a second device region 22 shown in FIG. 3. FIG. 6 is a top view of a first main surface 11 of a semiconductor chip 10. FIG. 7 is a top view of a first electrode layer 101 and a second electrode layer 102.

Referring to FIG. 1 to FIG. 7, the diode chip 1 is a small-sized chip component (semiconductor device) which comes in various forms known as chip 1005 (1 mm×0.5 mm), chip 0603 (0.6 mm×0.3 mm), chip 0402 (0.4 mm×0.2 mm), and chip 03015 (0.3 mm×0.15 mm) in accordance with their planar dimensions. In this embodiment, the diode chip 1 includes an ESD protection chip for protecting the circuit against ESD (Electro-Static Discharge).

The diode chip 1 includes a chip body 2 which is cuboid in shape. The chip body 2 further serves a packaging purpose. In other words, the diode chip 1 (chip body 2) includes a chip scale package which has chip dimensions and serves a packaging purpose. The chip body 2 includes a first chip main surface 3, an opposing second chip main surface 4, and four chip lateral surfaces 5A, 5B, 5C, 5D which connect the first chip main surface 3 and the second chip main surface 4.

The first chip main surface 3 and the second chip main surface 4 are four-sided (rectangular) when viewed in their normal direction Z (hereinafter referred to as "when viewed from above"). The first chip main surface 3 is a connecting surface (mounting surface) which is opposite a connection target connected to a mounting substrate. The second chip main surface 4 is a non-connecting surface (non-mounting surface) opposing the connecting surface. The second chip main surface 4 includes a ground surface or mirror surface having ground marks.

The chip lateral surfaces 5A to 5D include the first chip lateral surface 5A, second chip lateral surface 5B, third chip lateral surface 5C and fourth chip lateral surface 5D. The first chip lateral surface 5A and second chip lateral surface 5B extend in first direction X and are opposite each other in second direction Y which crosses first direction X. The first chip lateral surface 5A (second chip lateral surface 5B) forms the short side of the chip body 2. The third chip lateral surface 5C and fourth chip lateral surface 5D extend in second direction Y and are opposite each other in first direction X. The third chip lateral surface 5C (fourth chip lateral surface 5D) forms the long side of the chip body 2. Second direction Y is perpendicular to first direction X. The chip lateral surfaces 5A to 5D include flat surfaces extending in normal direction Z.

In this embodiment, when viewed from above, four corner portions of the chip body 2 bend (undergo R beveling) toward the outside of the chip body 2. Alternatively, the four corner portions of the chip body 2 may undergo C beveling. Alternatively, the four corner portions of the chip body 2 may not undergo beveling but are sharp corners.

The reference numerals "0603", "0402", and "03015" are based on the short side length and long side length of the chip body 2. The short side length of the chip body 2 is not limited to the foregoing numeric values and thus may also range from equal to or more than 0.05 mm to equal to or less than 1 mm. Likewise, the chip body 2 may also have long side length of equal to or more than 0.05 mm to equal to or less than 0.1 mm, equal to or more than 0.1 mm to equal to or less than 0.2 mm, equal to or more than 0.2 mm to equal to or less than 0.3 mm, equal to or more than 0.3 mm to equal to or less than 0.4 mm, equal to or more than 0.4 mm to equal to or less than 0.5 mm, equal to or more than 0.5 mm to equal to or less than 0.6 mm, equal to or more than 0.6 mm to equal to or less than 0.7 mm, equal to or more than 0.7 mm to equal to or less than 0.8 mm, equal to or more than 0.8 mm to equal to or less than 0.9 mm, or equal to or more than 0.9 mm to equal to or less than 1 mm.

The long side length of the chip body 2 is not limited to the foregoing numeric values and thus may also range from equal to or more than 0.1 mm to equal to or less than 2 mm. Likewise, the chip body 2 may also have long side length of equal to or more than 0.1 mm to equal to or less than 0.2 mm, equal to or more than 0.2 mm to equal to or less than 0.4 mm, equal to or more than 0.4 mm to equal to or less than 0.6 mm, equal to or more than 0.6 mm to equal to or less than 0.8 mm, equal to or more than 0.8 mm to equal to or less than 1 mm, equal to or more than 1 mm to equal to or less than 1.2 mm, equal to or more than 1.2 mm to equal to or less than 1.4 mm, equal to or more than 1.4 mm to equal to or less than 1.6 mm, equal to or more than 1.6 mm to equal to or less than 1.8 mm, or equal to or more than 1.8 mm to equal to or less than 2 mm. The long side length of the chip body 2 is preferably one to three times greater than the short side length of the chip body 2.

The chip body 2 may be of a thickness of equal to or more than 50 μm to equal to or less than 1000 μm. Alternatively, the chip body 2 may also be of a thickness of equal to or more than 50 μm to equal to or less than 100 μm, equal to or more than 100 m to equal to or less than 200 μm, equal to or more than 200 μm to equal to or less than 400 μm, equal to or more than 400 μm to equal to or less than 600 μm, equal to or more than 600 μm to equal to or less than 800 μm, or equal to or more than 800 μm to equal to or less than 1000 μm. Preferably, the chip body 2 is of a thickness of equal to or more than 50 μm to equal to or less than 500 μm.

The diode chip 1 (chip body 2) includes the semiconductor chip 10 which is made of silicon and is cuboid in shape. The semiconductor chip 10 includes the first main surface 11, an opposing second main surface 12, and four lateral surfaces 13A, 13B, 13C, 13D which connect the first main surface 11 and the second main surface 12. When viewed from above, the first main surface 11 and the second main surface 12 are quadrilateral in shape (rectangular in shape in the embodiment).

The first main surface 11 is a device surface which a functional device is formed on. The second main surface 12 forms the second chip main surface 4. The lateral surfaces 13A to 13D include the first lateral surface 13A, second lateral surface 13B, third lateral surface 13C and fourth lateral surface 13D.

The diode chip 1 includes a p-type first semiconductor layer 14 and an n-type second semiconductor layer 15, which are arranged in the order from the second main surface 12 of the semiconductor chip 10 to the first main surface 11 of the semiconductor chip 10. The first semiconductor layer 14 is exposed from the second main surface 12 and the lateral surfaces 13A to 13D of the semiconductor chip 10. The second semiconductor layer 15 is exposed from the first main surface 11 and the lateral surfaces 13A to 13D of the semiconductor chip 10.

Figure 8:
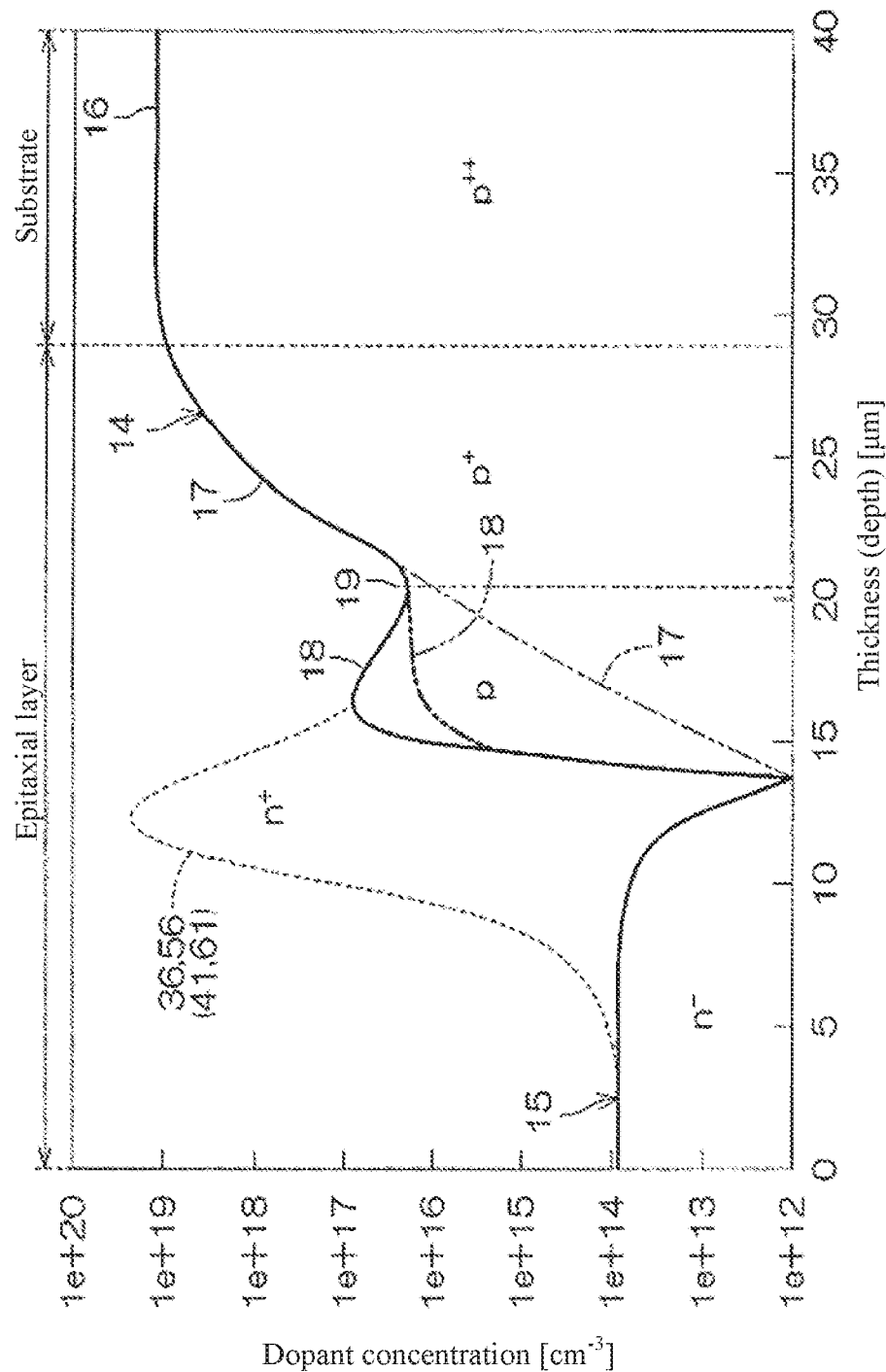
FIG. 8 is a graph of a concentration gradient of the semiconductor chip.

Referring to FIG. 8, the first semiconductor layer 14 and the second semiconductor layer 15 are described below. FIG. 8 is a graph of a concentration gradient of the semiconductor chip 10. As shown in FIG. 8, the vertical axis represents dopant concentration [cm$^{-3}$], and the horizontal axis represents thickness (depth) [μm]. The concentration gradient of the semiconductor chip 10 is figured out by simulation.

Referring to FIG. 8, the p-type dopant concentration in the first semiconductor layer 14 ranges from equal to or more than $1 \times 10^{12}$ cm$^{-3}$ to equal to or less than $1 \times 10^{21}$ cm$^{-3}$. The first semiconductor layer 14 is formed in such a manner that the p-type dopant concentration on the first main surface 11 is less than the p-type dopant concentration on the second main surface 12. The first semiconductor layer 14 includes a p++-type high concentration layer 16, a p+-type concentration decreasing layer 17, and a p-type concentration keeping layer 18, which are arranged in the order from the second main surface 12 to the first main surface 11.

The average p-type dopant concentration in the high concentration layer 16 in its thickness direction is denoted by first value A. The average p-type dopant concentration in the concentration decreasing layer 17 in its thickness direction is denoted by second value B, where B<A. The average p-type dopant concentration in the concentration keeping layer 18 in its thickness direction is denoted by third value C, where B<A<C.

When the concentration gradient of the semiconductor chip 10 is defined by function f(x), the first, second and third values A, B, C are figured out in accordance with the average of function f(x) within the range specified by the high concentration layer 16, the concentration decreasing layer 17, and the concentration keeping layer 18, respectively.

The high concentration layer 16 is formed from p++-type semiconductor substrate. The high concentration layer 16 has substantially constant p-type dopant concentration in its entirety. The p-type dopant concentration in the high concentration layer 16 may range from equal to or more than $1 \times 10^{19}$ cm$^{-3}$ to equal to or less than $1 \times 10^{21}$ cm$^{-3}$. In this embodiment, the p-type dopant concentration in the high concentration layer 16 ranges from equal to or more than $1 \times 10^{19}$ cm$^{-3}$ to equal to or less than $1 \times 10^{21}$ cm$^{-3}$.

The high concentration layer 16 may be of a thickness of equal to or more than 10 μm to equal to or less than 800 μm. Alternatively, the high concentration layer 16 may also be of a thickness of equal to or more than 10 μm to equal to or less than 100 μm, equal to or more than 100 μm to equal to or less than 200 μm, equal to or more than 200 m to equal to or less than 400 μm, equal to or more than 400 μm to equal to or less than 600 μm, or equal to or more than 600 μm to equal to or less than 800 μm. Preferably, the high concentration layer 16 is of a thickness of equal to or more than 30 μm to equal to or less than 400 μm.

The concentration decreasing layer 17 is made from a p+-type epitaxial layer formed on the high concentration layer 16 (semiconductor substrate). The concentration decreasing layer 17 has a p-type dopant which diffuses from the high concentration layer 16, and the p-type dopant concentration in the concentration decreasing layer 17 is less than that in the high concentration layer 16. The concentration decreasing layer 17 has a concentration gradient, that is, its p-type dopant concentration decreases from the high concentration layer 16 and in the crystal growth direction. The rate of decrease in the p-type dopant concentration in the concentration decreasing layer 17 increases from the high concentration layer 16 and in the crystal growth direction.

The p-type dopant concentration in the concentration decreasing layer 17 decreases gradually until its lowest level ranges from equal to or more than $1 \times 10^{15}$ cm$^{-3}$ to equal to or less than $1 \times 10^{17}$ cm$^{-3}$. In this embodiment, the lowest level of the p-type dopant concentration in the concentration decreasing layer 17 ranges from equal to or more than $1 \times 10^{16}$ cm$^{-3}$ to equal to or less than $1 \times 10^{17}$ cm$^{-3}$.

The concentration decreasing layer 17 may be of a thickness of equal to or more than 5 μm to equal to or less than 20 μm. Alternatively, the concentration decreasing layer 17 may also be of a thickness of equal to or more than 5 μm to equal to or less than 10 µm, equal to or more than 10 µm to equal to or less than 15 µm, or equal to or more than 15 µm to equal to or less than 20 µm. In this embodiment, the concentration decreasing layer 17 is of a thickness of equal to or more than 6 µm to equal to or less than 8 µm.

The concentration keeping layer 18 is formed from a p-type epitaxial layer formed on the concentration decreasing layer 17 (epitaxial layer). The concentration keeping layer 18 keeps a specified p-type dopant concentration within a specified thickness range to suppress the decrease of the p-type dopant concentration in the concentration decreasing layer 17. In other words, the concentration keeping layer 18 reduces the rate of decrease of the p-type dopant concentration in the concentration decreasing layer 17 within the specified thickness range.

Preferably, the concentration keeping layer 18 keeps the p-type dopant concentration at equal to or more than $5 \times 10^{15}$ cm$^{-3}$ to equal to or less than $5 \times 10^{17}$ cm$^{-3}$ within the specified thickness range. Therefore, the concentration keeping layer 18 suppresses abrupt decrease of the concentration gradient in the first semiconductor layer 14. As shown in FIG. 8, the double dotted line represents the concentration gradient of the concentration decreasing layer 17 in the absence of the concentration keeping layer 18.

The concentration keeping layer 18 is formed on the concentration decreasing layer 17 and spaced apart from the concentration changing layer 19. The concentration changing layer 19 is a concentration stopping region where the concentration gradient is zero or may be basically regarded as zero. In this embodiment, the concentration keeping layer 18 has the lowest level p-type dopant concentration which is greater than the p-type dopant concentration in the concentration decreasing layer 17. The concentration keeping layer 18 has a p-type dopant concentration with a concentration gradient which increases from the concentration decreasing layer 17 and in the crystal growth direction.

In other words, it is the concentration changing layer 19 at which not only does the concentration gradient for the p-type dopant stop decreasing to increase, but the p-type dopant concentration in the concentration decreasing layer 17 is also replaced with the p-type dopant concentration in the concentration keeping layer 18. The concentration keeping layer 18 has the p-type dopant which diffuses from the concentration decreasing layer 17 and the p-type dopant which is introduced from the outside.

The concentration keeping layer 18 is formed by selectively introducing p-type dopant onto the surface of the concentration decreasing layer 17, then forming an epitaxial layer on the concentration decreasing layer 17, and finally allowing the p-type dopant introduced into the concentration decreasing layer 17 to diffuse to the epitaxial layer. Alternatively, the concentration keeping layer 18 may also be formed by forming an epitaxial layer of relatively high concentration directly on the concentration decreasing layer 17 by epitaxial growth whose occurrence is accompanied by introduction of p-type dopant.

Alternatively, the p-type dopant concentration in the concentration keeping layer 18 may also gradually increase until it is greater than the lowest level of the p-type dopant concentration in the concentration decreasing layer 17 and equal to or less than $5 \times 10^{17}$ cm$^{-3}$. The highest level of the p-type dopant concentration in the concentration keeping layer 18 is preferably greater than the lowest level of the p-type dopant concentration in the concentration decreasing layer 17 and equal to or less than $1 \times 10^{17}$ cm$^{-3}$.

The concentration keeping layer 18 does not necessarily have a concentration gradient of the increase in the p-type dopant concentration. Alternatively, the concentration keeping layer 18 may, for example, also have a concentration gradient represented by the bold double dotted line in FIG. 8 and defining a p-type dopant concentration which decreases in the crystal growth direction, provided that the concentration keeping layer 18 keeps the p-type dopant concentration within the specified thickness.

The concentration keeping layer 18 may be of a thickness of equal to or more than 1 µm to equal to or less than 10 µm. Alternatively, the concentration keeping layer 18 may also be of a thickness of equal to or more than 1 µm to equal to or less than 2 m, equal to or more than 2 µm to equal to or less than 4 µm, equal to or more than 4 m to equal to or less than 6 µm, equal to or more than 6 µm to equal to or less than 8 m, or equal to or more than 8 µm to equal to or less than 10 µm. The thickness of the concentration keeping layer 18 preferably ranges from equal to or more than 2 µm to equal to or less than 5 µm.

The second semiconductor layer 15 is formed from an n-type epitaxial layer formed on the concentration keeping layer 18 (epitaxial layer). The second semiconductor layer 15 has an n-type dopant concentration which is less than the p-type dopant concentration in the first semiconductor layer 14. The peak level of the n-type dopant concentration of the second semiconductor layer 15 may range from equal to or more than $1 \times 10^{13}$ cm$^{-3}$ to equal to or less than $1 \times 10^{15}$ cm$^{-3}$. The peak level of the n-type dopant concentration in the second semiconductor layer 15 preferably ranges from equal to or more than $5 \times 10^{13}$ cm$^{-3}$ to equal to or less than $5 \times 10^{14}$ cm$^{-3}$.

The second semiconductor layer 15 is an n-type high-resistance layer of relatively low n-type dopant concentration. The second semiconductor layer 15 may have resistivity ranging from equal to or more than 50 Ω·cm to equal to or less than 150 Ω·cm. Alternatively, the resistivity of the second semiconductor layer 15 may also range from equal to or more than 50 Ω·cm to equal to or less than 75 Ω·cm, from equal to or more than 75 Ω·cm to equal to or less than 100 Ω·cm, from equal to or more than 100 Ω·cm to equal to or less than 125 Ω·cm, or from equal to or more than 125 Ω·cm to equal to or less than 150 Ω·cm. The resistivity of the second semiconductor layer 15 preferably ranges from equal to or more than 80 Ω·cm to equal to or less than 120 Ω·cm.

The second semiconductor layer 15 is of a smaller thickness than the first semiconductor layer 14. The second semiconductor layer 15 may be of a thickness of equal to or more than 5 µm to equal to or less than 20 µm. Alternatively, the second semiconductor layer 15 may be of a thickness of equal to or more than 5 µm to equal to or less than 10 µm, equal to or more than 10 µm to equal to or less than 15 µm, or equal to or more than 15 µm to equal to or less than 20 µm. The thickness of the second semiconductor layer 15 preferably ranges from equal to or more than 8 µm to equal to or less than 15 µm.

Referring to FIG. 2 to FIG. 6, the semiconductor chip 10 includes the first device region 21 and the second device region 22.

The first device region 21 is formed on one side (i.e., the side of the first lateral surface 13A) of the semiconductor chip 10. In this embodiment, when viewed from above, the first device region 21 is formed on the side of the first lateral surface 13A and opposite the center of the first main surface 11. When viewed from above, the first device region 21 is in the shape of a quadrilateral with four sides parallel to the lateral surfaces 13A to 13D. The first device region 21 is of any planar shape. Alternatively, when viewed from above, the first device region 21 may also be in the shape of any polygon other than a quadrilateral or in round (or elliptical) shape.

In second direction Y, the second device region 22 and the first device region 21 are separated and formed on the other side (i.e., the side of the second lateral surface 13B) of the semiconductor chip 10. In this embodiment, when viewed from above, the second device region 22 is formed on the side of the second lateral surface 13B and opposite the center of the first main surface 11. When viewed from above, the second device region 22 is in the shape of a quadrilateral with four sides parallel to the lateral surfaces 13A to 13D. The second device region 22 is of any planar shape. Alternatively, when viewed from above, the second device region 22 may also be in the shape of any polygon other than a quadrilateral or in round (or elliptical) shape.

When the second device region 22 is configured with a central line which traverses a central portion of the semiconductor chip 10 in first direction X, the second device region 22 is preferably linearly symmetrical to the first device region 21 with respect to the central line. Furthermore, the second device region 22 is preferably point-symmetrical to the first device region 21 with respect to the central portion of the semiconductor chip 10.

The side of the first lateral surface 13A in the first device region 21 is referred to as one side of the first device region 21 (i.e., the side of the first lateral surface 13A). The side of the second lateral surface 13B in the first device region 21 is referred to as the other side of the first device region 21 (i.e., the side of the second lateral surface 13B). The side of the first lateral surface 13A in the second device region 22 is referred to as one side of the second device region 22 (i.e., the side of the first lateral surface 13A). The side of the second lateral surface 13B in the second device region 22 is referred to as the other side of the second device region 22 (i.e., the side of the second lateral surface 13B).

The diode chip 1 includes a region separation structure 23 which separates the first device region 21 and the second device region 22. For illustrative sake, cross hatching in some of the accompanying drawings depicts the region separation structure 23. The region separation structure 23 includes a first region separation structure 23A for surrounding the first device region 21 and a second region separation structure 23B for surrounding the second device region 22.

When viewed from above, the first region separation structure 23A is in annular shape (square enclosing shape in the embodiment) to surround the first device region 21. The planar shape of the first device region 21 is adjusted with the first region separation structure 23A. When viewed from above, the second region separation structure 23B is separated from the first region separation structure 23A and is in annular shape (square enclosing shape in the embodiment) to surround the second device region 22. The planar shape of the second device region 22 is adjusted with the second region separation structure 23B. Alternatively, the second region separation structure 23B may also be disposed between the first device region 21 and the second device region 22 and formed integrally with the first region separation structure 23A.

The region separation structure 23 has a groove insulating structure including a region separation trench 24, a region separation insulation layer 25 and a polysilicon 26. The region separation trench 24 is formed by etching the first main surface 11 toward the second main surface 12. The region separation trench 24 penetrates the second semiconductor layer 15 and reaches the first semiconductor layer 14. The region separation trench 24 penetrates the second semiconductor layer 15 and the concentration keeping layer 18 and reaches the concentration decreasing layer 17.

The region separation trench 24 includes a lateral wall and a bottom wall. The lateral wall of the region separation trench 24 may be perpendicular to the first main surface 11. Alternatively, the lateral wall of the region separation trench 24 may also be oblique with respect to the first main surface 11. Under this condition, the region separation trench 24 may also taper, that is, with its bottom side area being less than its opening area.

The bottom wall of the region separation trench 24 is positioned proximate to the concentration decreasing layer 17 relative to the high concentration layer 16. Therefore, the lateral wall of the region separation trench 24 allows the second semiconductor layer 15, the concentration keeping layer 18 and the concentration decreasing layer 17 to be exposed. The bottom wall of the region separation trench 24 allows the concentration decreasing layer 17 to be exposed.

In this embodiment, the region separation trench 24 is provided in the form of a deep groove of an aspect ratio greater than 1. The aspect ratio is the ratio of the depth of the region separation trench 24 to the width of the region separation trench 24. The aspect ratio preferably ranges from 5 to 20.

The region separation trench 24 may be of a width of equal to or more than 0.1 m to equal to or less than 3 μm. Alternatively, the region separation trench 24 may also be of a width of equal to or more than 0.1 μm to equal to or less than 0.5 μm, equal to or more than 0.5 μm to equal to or less than 1 μm, equal to or more than 1 μm to equal to or less than 1.5 μm, equal to or more than 1.5 μm to equal to or less than 2 μm, equal to or more than 2 μm to equal to or less than 2.5 μm, or equal to or more than 2.5 m to equal to or less than 3 μm. The width of the region separation trench 24 preferably ranges from equal to or more than 1.5 μm to equal to or less than 2.5 μm.

The region separation trench 24 may also be of a width of equal to or more than 1 μm to equal to or less than 50 μm. Alternatively, the region separation trench 24 may also be of a depth of equal to or more than 1 μm to equal to or less than 5 μm, equal to or more than 5 μm to equal to or less than 10 μm, equal to or more than 10 μm to equal to or less than 15 μm, equal to or more than 15 μm to equal to or less than 20 μm, equal to or more than 20 μm to equal to or less than 25 μm, equal to or more than 25 μm to equal to or less than 30 μm, equal to or more than 30 μm to equal to or less than 40 μm, or equal to or more than 40 μm to equal to or less than 50 μm. The depth of the region separation trench 24 preferably ranges from equal to or more than 15 μm to equal to or less than 35 μm.

The region separation insulation layer 25 is formed in the region separation trench 24. The region separation insulation layer 25 extends across the inner wall of the region separation trench 24 and thus is film-like. Therefore, the region separation insulation layer 25 divides the inside of the region separation trench 24 into recess spaces.

The region separation insulation layer 25 may include at least one of a silicon oxide layer and a silicon nitride layer. The region separation insulation layer 25 may have a laminate structure formed by laminating together the silicon oxide layer and the silicon nitride layer in any order. The region separation insulation layer 25 may also have a monolayer structure composed of the silicon oxide layer or silicon nitride layer. In this embodiment, the region separation insulation layer 25 has a monolayer structure composed of the silicon oxide layer.

The polysilicon 26 is spaced apart from the region separation insulation layer 25 and disposed in the region separation trench 24. The polysilicon 26 is formed to be electrically floating. Alternatively, the region separation structure 23 may also dispense with the polysilicon 26 but includes the region separation insulation layer 25 integrally embedded in the region separation trench 24.

Therefore, the region separation insulation layer 25 allows the first device region 21 to be electrically connected to the second device region 22 through the semiconductor chip 10 (first semiconductor layer 14). Furthermore, owing to the region separation insulation layer 25, the second semiconductor layer 15 in the first device region 21 and the second semiconductor layer 15 in the second device region 22 are electrically separated.

Referring to FIG. 2 to FIG. 6, the diode chip 1 includes a first pin junction portion 31 (p-intrinsic-n junction portion) formed on the surface of the first device region 21 in the first polarity direction. The first pin junction portion 31 forms a first pin diode D1 on the surface of the first device region 21.

The "polarity direction" is the direction in which a forward current flows (in other words, the direction of polarity of the diode). The first polarity direction is the direction in which a forward current flows in the thickness direction (i.e., normal direction Z) of the semiconductor chip 10. In this embodiment, the first polarity direction is the direction in which a forward current flows from the second main surface 12 to the first main surface 11.

When viewed from above, the first pin junction portion 31 is formed on one side of the surface of the first device region 21 (i.e., on the side of the first lateral surface 13A). The first pin junction portion 31 is formed at a central portion of the first device region 21 in first direction X.

The first pin junction portion 31 includes an n+-type first N layer 32 (first upper semiconductor layer), an n-type first I layer 33 (first resistance layer), and a p+-type first P layer 34 (first lower semiconductor layer) which are formed sequentially in the thickness direction, starting from the surface of the first device region 21.

The first N layer 32 is formed on the surface of the second semiconductor layer 15. The first N layer 32 is in round (or elliptical) shape when viewed from above. The first N layer 32 is of any planar shape. Alternatively, the first N layer 32 may also be in the shape of a polygon (for example, a quadrilateral).

The first N layer 32 has an n-type dopant concentration greater than the n-type dopant concentration of the second semiconductor layer 15. The peak level of the n-type dopant concentration of the first N layer 32 may range from equal to or more than $1 \times 10^{18}$ cm$^{-3}$ to equal to or less than $1 \times 10^{21}$ cm$^{-3}$. The peak level of the n-type dopant concentration in the first N layer 32 preferably ranges from equal to or more than $5 \times 10^{18}$ cm$^{-3}$ to equal to or less than $1 \times 10^{20}$ cm$^{-3}$.

The first I layer 33 is formed from the second semiconductor layer 15. The first I layer 33 has an n-type dopant concentration equal to the n-type dopant concentration of the second semiconductor layer 15. The peak level of the n-type dopant concentration in the first I layer 33 may range from equal to or more than $1 \times 10^{13}$ cm$^{-3}$ to equal to or less than $1 \times 10^{15}$ cm$^{-3}$. The peak level of the n-type dopant concentration in the first I layer 33 preferably ranges from equal to or more than $5 \times 10^{13}$ cm$^{-3}$ to equal to or less than $5 \times 10^{14}$ cm$^{-3}$.

The first P layer 34 is formed at the junctional portion between the first semiconductor layer 14 (i.e., the concentration keeping layer 18) and the second semiconductor layer 15. The first P layer 34 is opposite the first N layer 32 in its entirety in such a manner as to be spaced apart from the first I layer 33. The first P layer 34 is opposite the concentration decreasing layer 17 in such a manner as to be spaced apart from a portion of the concentration keeping layer 18.

The first P layer 34 is of a greater width than the first N layer 32 when viewed from above. When viewed from above, the edge of the first P layer 34 surrounds the first N layer 32. The first P layer 34 is in round (or elliptical) shape when viewed from above. The first P layer 34 is of any planar shape. Alternatively, the first P layer 34 may also be in the shape of a polygon (for example, a quadrilateral).

The first P layer 34 has a p-type dopant concentration greater than the n-type dopant concentration in the first I layer 33. The first P layer 34 has a p-type dopant concentration which is at least greater than the p-type dopant concentration in the concentration keeping layer 18. The first P layer 34 may also have a p-type dopant concentration greater than the p-type dopant concentration in the high concentration layer 16. The peak level of the p-type dopant concentration in the first P layer 34 may range from equal to or more than $1 \times 10^{18}$ cm$^{-3}$ to equal to or less than $1 \times 10^{21}$ cm$^{-3}$. Preferably, the peak level of the p-type dopant concentration in the first P layer 34 ranges from equal to or more than $5 \times 10^{18}$ cm$^{-3}$ to equal to or less than $1 \times 10^{21}$ cm$^{-3}$.

Pin junctions are formed on the first N layer 32, the first I layer 33 and the first P layer 34 and arranged in the thickness direction (i.e., normal direction Z) of the semiconductor chip 10. Therefore, the first pin diode D1 is formed on the surface of the first device region 21, with the first N layer 32 functioning as the cathode, and the first P layer 34 as the anode. The anode of the first pin diode D1 is electrically connected to the first semiconductor layer 14.

Referring to FIG. 2 to FIG. 6, the diode chip 1 includes a first pn junction portion 35. The first pn junction portion 35 is separated from the first pin junction portion 31 and formed in the first device region 21 with the first polarity direction. The first pn junction portion 35 forms a first Zener diode DZ1 within the first device region 21.

The first pn junction portion 35 is electrically connected to the first pin junction portion 31 through the semiconductor chip 10 (first semiconductor layer 14). The first pn junction portion 35 is connected in reverse biased to the first pin junction portion 31 through the semiconductor chip 10 (first semiconductor layer 14).

The first pn junction portion 35 includes an n+-type first inner N layer 36 (first inner semiconductor layer). The first inner N layer 36 is formed within the first device region 21. A pn junction is formed between the first inner N layer 36 and the first semiconductor layer 14 (i.e., the concentration keeping layer 18). The first inner N layer 36 is formed at a junctional portion between the first semiconductor layer 14 (i.e., the concentration keeping layer 18) and the second semiconductor layer 15. The first inner N layer 36 formed within the first device region 21 is confined to a region other than the first pin junction portion 31 (i.e., the first P layer 34). Alternatively, the first inner N layer 36 may also be confined to substantially the entire region other than the first pin junction portion 31 (first P layer 34).

The first inner N layer 36 has an inner peripheral portion which surrounds the first pin junction portion 31 (first P layer 34). The inner peripheral portion of the first inner N layer 36 may be connected to the first P layer 34 and may also be separated from the first P layer 34. Alternatively, an outer peripheral portion of the first inner N layer 36 may also be disposed outside the first device region 21. In other words, the outer peripheral portion of the first inner N layer 36 may also be separated from an inner portion of the first inner N layer 36 by the first region separation structure 23A.

Referring to FIG. 8, the first inner N layer 36 has an n-type dopant concentration greater than the n-type dopant concentration in the second semiconductor layer 15. Referring to FIG. 8, the dashed line represents a concentration gradient of the n-type dopant of the first inner N layer 36. The first inner N layer 36 has an n-type dopant concentration greater than the p-type dopant concentration of the concentration keeping layer 18. The peak level of the n-type dopant concentration in the first inner N layer 36 may range from equal to or more than $1\times10^{18}$ cm$^{-3}$ to equal to or less than $1\times10^{21}$ cm$^{-3}$. Preferably, the peak level of the n-type dopant concentration in the first inner N layer 36 ranges from equal to or more than $5\times10^{18}$ cm$^{-3}$ to equal to or less than $1\times10^{20}$ cm$^{-3}$.

The first pn junction portion 35 forms the first Zener diode DZ1, with the first inner N layer 36 functioning as the cathode, and the first semiconductor layer 14 (i.e., the concentration keeping layer 18) as the anode. The anode of the first Zener diode DZ1 is connected in reverse biased to the anode of the first pin diode D1 through the semiconductor chip 10 (first semiconductor layer 14).

In the situation where the first semiconductor layer 14 dispenses with the concentration keeping layer 18, a pn junction is formed between the first inner N layer 36 and the concentration decreasing layer 17. Under this condition, the variation of the pn concentration in the first pn junction portion 35 is abrupt, and thus actual withstand voltage (i.e., breakdown voltage VB) is likely to vary from target withstand voltage, starting from the first pn junction portion 35. The foregoing issue becomes noteworthy as a result of the deviation (for example, around ±5%) of thickness of the concentration decreasing layer 17.

Therefore, in the diode chip 1, the concentration keeping layer 18 is formed on the concentration decreasing layer 17 to slow down the variation of the pn concentration in the first pn junction portion 35. Therefore, variation of withstand voltage (i.e., breakdown voltage VB) from the first pn junction portion 35 as the origin is suppressed.

Although withstand voltage varies because of the deviation of thickness of the concentration decreasing layer 17, the variation of withstand voltage is suppressed by the concentration keeping layer 18 of a specified thickness appropriately. Furthermore, even if the deviation of thickness of the concentration keeping layer 18 happens, the slow variation of the pn concentration will be conducive to the appropriate suppression of the withstand voltage variation otherwise caused by the deviation of thickness of the concentration keeping layer 18.

Referring to FIG. 2 to FIG. 6, the diode chip 1 includes a first reversed pin junction portion 38 (reverse p-intrinsic-n junction portion). The first reversed pin junction portion 38 is formed on the surface of the first device region 21 with the second polarity direction and is connected in reverse biased to the first pn junction portion 35.

The second polarity direction is a direction in which a forward current flows oppositely to the first polarity direction in the thickness direction of the semiconductor chip 10. In this embodiment, the second polarity direction is the direction in which the forward current flows from the first main surface 11 to the second main surface 12.

The first reversed pin junction portion 38 forms a first reversed pin diode DR1 on the surface of the first device region 21. The first diode pair 37 (first rectifier pair) is formed between the first reversed pin junction portion 38 and the first pn junction portion 35.

When viewed from above, the first reversed pin junction portion 38 is separated from the first pin junction portion 31 and formed on the other side of the surface of the first device region 21 (i.e., on the side of the second lateral surface 13B). When the first reversed pin junction portion 38 is configured with a line which extends in second direction Y and traverses the first pin junction portion 31, the first reversed pin junction portion 38 is disposed on the line. Consequently, the first reversed pin junction portion 38 is formed at the central portion of the first device region 21 in first direction X. The first reversed pin junction portion 38 is opposite the first pin junction portion 31 in second direction Y.

The first reversed pin junction portion 38 includes a p+-type first reversed P layer 39 (first upper reversed semiconductor layer), an n-type first reversed I layer 40 (first reversed resistance layer), and an n+-type first reversed N layer 41 (first lower reversed semiconductor layer) which are formed sequentially in the thickness direction, starting from the surface of the first device region 21.

The first reversed P layer 39 is formed on the second semiconductor layer 15. The first reversed P layer 39 has a p-type dopant concentration greater than the n-type dopant concentration in the second semiconductor layer 15. The peak level of the p-type dopant concentration in the first reversed P layer 39 may range from equal to or more than $1\times10^{18}$ cm$^{-3}$ to equal to or less than $1\times10^{21}$ cm$^{-3}$. The peak level of the p-type dopant concentration in the first reversed P layer 39 preferably ranges from equal to or more than $5\times10^{18}$ cm$^{-3}$ to equal to or less than $1\times10^{20}$ cm$^{-3}$.

When viewed from above, the first reversed P layer 39 is in round (or elliptical) shape. The first reversed P layer 39 is of any planar shape. Alternatively, the first reversed P layer 39 may also be in the shape of a polygon (for example, a quadrilateral).

The first reversed P layer 39 has a first planar area S1. The first planar area S1 may range from 1000 µm$^2$ to equal to or less than 10000 µm$^2$. Alternatively, the first planar area S1 may also range from 1000 µm to equal to or less than 2000 µm, from 2000 µm$^2$ to equal to or less than 4000 µm, from 4000 µm to equal to or less than 6000 µm$^2$, from 6000 µm to equal to or less than 8000 µm$^2$, or from 8000 µm$^2$ to equal to or less than 10000 µm.

The first reversed I layer 40 is formed from the second semiconductor layer 15. The first reversed I layer 40 has an n-type dopant concentration equal to the n-type dopant concentration in the second semiconductor layer 15. The peak level of the n-type dopant concentration in the first reversed I layer 40 may range from equal to or more than $1\times10^{13}$ cm$^{-3}$ to equal to or less than $1\times10^{15}$ cm$^{-3}$. The peak level of the n-type dopant concentration in the first reversed I layer 40 preferably ranges from equal to or more than $5\times10^{1}$ cm$^{-3}$ to equal to or less than $5\times10^{14}$ cm$^{-3}$.

The first reversed N layer 41 is formed at the junctional portion between the first semiconductor layer 14 (i.e., the concentration keeping layer 18) and the second semiconductor layer 15. The first reversed N layer 41 is formed from the first inner N layer 36 which functions as a portion of the first pn junction portion 35. Therefore, the first reversed N layer 41 (first inner N layer 36) is opposite the first reversed N layer 41 in its entirety in such a manner as to be spaced apart from the first reversed I layer 40.

Pin junctions are formed on the first reversed P layer 39, first reversed I layer 40 and first reversed N layer 41 and arranged in the thickness direction (i.e., normal direction Z) of the semiconductor chip 10. Therefore, the first reversed pin diode DR1 is formed, with the first reversed P layer 39 functioning as the anode, and the first reversed N layer 41 as the cathode. The cathode of the first reversed pin diode DR1 is connected to the cathode of the first Zener diode DZ1.

Therefore, the first diode pair 37 which includes the first Zener diode DZ1 and the first reversed pin diode DR1 series-connected in reverse biased to the first Zener diode DZ1 is formed. The first diode pair 37 is parallel-connected to the first pin diode D1 through the semiconductor chip 10 (first semiconductor layer 14), thereby forming a first parallel-connected circuit 42 which includes the first pin diode D1 and the first diode pair 37.

Referring to FIG. 2 to FIG. 6, the diode chip 1 includes a first junction separation structure 45. The first junction separation structure 45 is formed in the first device region 21 and adapted to separate the first pin junction portion 31 from the first pn junction portion 35 and the first reversed pin junction portion 38.

The first junction separation structure 45 includes a first junction separation trench 46, a first junction separation insulation layer 47 and a polysilicon 48. In this embodiment, the first junction separation trench 46 has a dual-groove structure. The dual-groove structure flanks the juncture between the first pin junction portion 31 (first P layer 34) and the first pn junction portion 35 (first inner N layer 36) and surrounds the first pin junction portion 31. The first junction separation trench 46 includes a first inner groove 46A and a first outer groove 46B.

When viewed from above, the first inner groove 46A is in annular shape (circular enclosing shape in the embodiment) to surround the first pin junction portion 31. The first inner groove 46A is of any planar shape. Alternatively, the first inner groove 46A may also be in polygonal enclosing shape (for example, square enclosing shape) or in circular enclosing shape (or elliptical enclosing shape).

The first inner groove 46A is formed by etching the first main surface 11 down toward the second main surface 12. The first inner groove 46A penetrates the first P layer 34 of the first pin junction portion 31 and reaches the first semiconductor layer 14 (i.e., the concentration decreasing layer 17).

The first inner groove 46A includes an inner peripheral wall, an outer peripheral wall and a bottom wall. Owing to the inner peripheral wall of the first inner groove 46A, an inner portion of the first P layer 34 is exposed. Owing to the outer peripheral wall of the first inner groove 46A, an edge portion of the first P layer 34 is exposed. Therefore, owing to the first inner groove 46A, the edge portion of the first P layer 34 and the first pin junction portion 31 are electrically separated.

The inner peripheral wall and the outer peripheral wall of the first inner groove 46A may be perpendicular to the first main surface 11. Alternatively, the inner peripheral wall and the outer peripheral wall of the first inner groove 46A may also be oblique with respect to the first main surface 11. Under this condition, the first inner groove 46A may taper, that is, with its bottom side area being less than its opening area.

The bottom wall of the first inner groove 46A is positioned proximate to the concentration decreasing layer 17 relative to the high concentration layer 16. The bottom wall of the first inner groove 46A allows the concentration decreasing layer 17 to be exposed. The first inner groove 46A and the region separation trench 24 may be simultaneously formed. Under this condition, the first inner groove 46A is of the same width and depth as the region separation trench 24.

When viewed from above, the first outer groove 46B is separated from the first inner groove 46A and is in annular shape (circular enclosing shape in the embodiment) to surround the first inner groove 46A. The first outer groove 46B is of any planar shape and thus does not necessarily need to correspond in shape to the planar shape of the first inner groove 46A. Alternatively, the first outer groove 46B may also be in polygonal enclosing shape (for example, square enclosing shape) or in circular enclosing shape (or elliptical enclosing shape).

The first outer groove 46B is formed by etching the first main surface 11 down toward the second main surface 12. The first outer groove 46B penetrates the first inner N layer 36 (first reversed N layer 41) of the first pn junction portion 35 and reaches the first semiconductor layer 14 (i.e., the concentration decreasing layer 17).

The first outer groove 46B includes an inner peripheral wall, an outer peripheral wall and a bottom wall. Owing to the inner peripheral wall of the first outer groove 46B, the inner peripheral portion of the first inner N layer 36 (first reversed N layer 41) is exposed. Owing to the outer peripheral wall of the first outer groove 46B, the inner portion of the first inner N layer 36 (first reversed N layer 41) is exposed. Therefore, owing to the first outer groove 46B, the inner peripheral portion of the first inner N layer 36 (first reversed N layer 41) is electrically separated from the first pn junction portion 35 and the first reversed pin junction portion 38.

The inner peripheral wall and the outer peripheral wall of the first outer groove 46B may be perpendicular to the first main surface 11. Alternatively, the inner peripheral wall and the outer peripheral wall of the first outer groove 46B may also be oblique with respect to the first main surface 11. Under this condition, the first outer groove 46B may taper, that is, with its bottom side area being less than its opening area.

The bottom wall of the first outer groove 46B is positioned proximate to the concentration decreasing layer 17 relative to the high concentration layer 16. The bottom wall of the first outer groove 46B allows the concentration decreasing layer 17 to be exposed. The first outer groove 46B and the region separation trench 24 may be simultaneously formed. Under this condition, the first outer groove 46B is of the same width and depth as the region separation trench 24.

The groove pitch between the first inner groove 46A and the first outer groove 46B may range from equal to or more than 1 µm to equal to or less than 10 µm. Alternatively, the groove pitch may also range from equal to or more than 1 µm to equal to or less than 2 µm, from equal to or more than 2 µm to equal to or less than 4 µm, from equal to or more than 4 µm to equal to or less than 6 µm, from equal to or more than 6 µm to equal to or less than 8 µm, or from equal to or more than 8 µm to equal to or less than 10 µm. The groove pitch preferably ranges from equal to or more than 3 µm to equal to or less than 8 µm.

In this embodiment, the first inner groove 46A and the first outer groove 46B are each provided in the form of a deep groove of an aspect ratio greater than 1. The aspect ratio is the ratio of the depth of the first inner groove 46A (first outer groove 46B) to the width of the first inner groove 46A (first outer groove 46B). The aspect ratio preferably ranges from 5 to 20.

The first inner groove 46A (first outer groove 46B) may be of a width of equal to or more than 0.1 µm to equal to or less than 3 µm. Alternatively, the first inner groove 46A (first outer groove 46B) may also be of a width of equal to or more than 0.1 m to equal to or less than 0.5 µm, equal to or more than 0.5 µm to equal to or less than 1 µm, 1 µm to equal to or less than 1.5 µm, equal to or more than 1.5 µm to equal to or less than 2 µm, equal to or more than 2 µm to equal to or less than 2.5 µm, or equal to or more than 2.5 µm to equal to or less than 3 µm. The width of the first inner groove 46A (first outer groove 46B) preferably ranges from equal to or more than 1.5 m to equal to or less than 2.5 µm.

The first inner groove 46A (first outer groove 46B) may also be of a depth of equal to or more than 1 µm to equal to or less than 50 µm. Alternatively, the first inner groove 46A (first outer groove 46B) may also be of a depth of equal to or more than 1 m to equal to or less than 5 µm, equal to or more than 5 µm to equal to or less than m, equal to or more than 10 µm to equal to or less than 15 µm, equal to or more than 15 µm to equal to or less than 20 µm, equal to or more than 20 µm to equal to or less than 25 µm, equal to or more than 25 µm to equal to or less than 30 µm, equal to or more than 30 µm to equal to or less than 40 µm, or equal to or more than 40 µm to equal to or less than 50 µm. The depth of the first inner groove 46A (first outer groove 46B) preferably ranges from equal to or more than 15 µm to equal to or less than 35 m.

Therefore, the first outer groove 46B and the first inner groove 46A together constitute a dual-groove structure which flanks the juncture between the first pin junction portion 31 (first P layer 34) and the first pn junction portion 35 (first inner N layer 36).

The first junction separation insulation layer 47 is formed in the first junction separation trench 46. The first junction separation insulation layer 47 extends across the inner wall of the first inner groove 46A and thus is film-like. Therefore, the first junction separation insulation layer 47 divides the inside of the first inner groove 46A into recess spaces. The first junction separation insulation layer 47 extends across the inner wall of the first outer groove 46B and thus is film-like. Therefore, the first junction separation insulation layer 47 divides the inside of the first outer groove 46B into recess spaces.

The first junction separation insulation layer 47 may include at least one of a silicon oxide layer and a silicon nitride layer. The first junction separation insulation layer 47 may have a laminate structure formed by laminating together the silicon oxide layer and the silicon nitride layer in any order. The first junction separation insulation layer 47 may also have a monolayer structure composed of the silicon oxide layer or the silicon nitride layer. The first junction separation insulation layer 47 is preferably made of the same insulating material as the region separation insulation layer 25. In this embodiment, the first junction separation insulation layer 47 has a monolayer structure composed of the silicon oxide layer.

The polysilicon 48 is spaced apart from the first junction separation insulation layer 47 and disposed in the first junction separation trench 46. The polysilicon 48 is spaced apart from the first junction separation insulation layer 47 and disposed in the first inner groove 46A. The polysilicon 48 is spaced apart from the first junction separation insulation layer 47 and disposed in the first outer groove 46B.

The polysilicon 48 is formed to be electrically floating. Alternatively, the first junction separation structure 45 may also dispense with the polysilicon 48 but includes the first junction separation insulation layer 47 integrally embedded in the first inner groove 46A. Alternatively, the first junction separation structure 45 may dispense with the polysilicon 48 but includes the first junction separation insulation layer 47 integrally embedded in the first outer groove 46B.

In this embodiment, the first junction separation trench 46 has a dual-groove structure which flanks the juncture between the first pin junction portion 31 and the first pn junction portion 35. However, the first junction separation trench 46 may also have a single groove structure which traverses the juncture between the first pin junction portion 31 and the first pn junction portion 35. Under this condition, the first junction separation trench 46 includes the first inner groove 46A and the first outer groove 46B which are integrally formed structures.

Referring to FIG. 2 to FIG. 6, the diode chip 1 includes a second pin junction portion 51. The second pin junction portion 51 is formed on the surface of the second device region 22 with the first polarity direction. The second pin junction portion 51 forms a second pin diode D2 on the surface of the second device region 22.

When viewed from above, the second pin junction portion 51 is formed on the other side of the surface of the second device region 22 (i.e., on the side of the second lateral surface 13B). The second pin junction portion 51 is formed at a central portion of the second device region 22 in first direction X. When the second pin junction portion 51 is configured with a central line which traverses the central portion of the first main surface 11 in first direction X, the second pin junction portion 51 is preferably formed in such a manner as to be linearly symmetrical to the first pin junction portion 31 with respect to the central line. The second pin junction portion 51 is preferably point-symmetrical to the first pin junction portion 31 with respect to the central portion of the first main surface 11.

The second pin junction portion 51 includes an n+-type second N layer 52 (second upper semiconductor layer), an n-type second I layer 53 (second resistance layer), and a p+-type second P layer 54 (second lower semiconductor layer) which are formed sequentially in the thickness direction, starting from the surface of the second device region 22.

The second N layer 52 is formed on the surface of the second semiconductor layer 15. The second N layer 52 is in round (or elliptical) shape when viewed from above. The second N layer 52 is of any planar shape. Alternatively, the second N layer 52 may also be polygonal (for example, quadrilateral) in shape.

The second N layer 52 has an n-type dopant concentration greater than the n-type dopant concentration in the second semiconductor layer 15. The peak level of the n-type dopant concentration in the second N layer 52 may range from equal to or more than $1\times10^{18}$ cm$^{-3}$ to equal to or less than $1\times10^{21}$ cm$^{-3}$. The peak level of the n-type dopant concentration in the second N layer 52 preferably ranges from equal to or more than $5\times10^{18}$ cm$^{-3}$ to equal to or less than $1\times10^{20}$ cm$^{-3}$. Preferably, the n-type dopant concentration in the second N layer 52 is equal to the n-type dopant concentration in the first N layer 32 of the first pin junction portion 31.

The second I layer 53 is formed from the second semiconductor layer 15. The second I layer 53 has an n-type dopant concentration equal to the n-type dopant concentration in the second semiconductor layer 15. The peak level of the n-type dopant concentration in the second I layer 53 may range from equal to or more than $1\times10^{13}$ cm$^{-3}$ to equal to or less than $1\times10^{15}$ cm$^{-3}$. The peak level of the n-type dopant concentration in the second I layer 53 preferably ranges from equal to or more than $5\times10^{13}$ cm$^{-3}$ to equal to or less than $5\times10^{14}$ cm$^{-3}$. Preferably, the n-type dopant concentration in the second I layer 53 is equal to the n-type dopant concentration in the first I layer 33 of the first pin junction portion 31.

The second P layer 54 is formed at the junctional portion between the first semiconductor layer 14 (i.e., the concentration keeping layer 18) and the second semiconductor layer 15. The second P layer 54 is opposite the second N layer 52 in its entirety in such a manner as to be spaced apart from the second I layer 53. The second P layer 54 is opposite the concentration decreasing layer 17 in such a manner as to be spaced apart from a portion of the concentration keeping layer 18.

The second P layer 54 is of a greater width than the second N layer 52 when viewed from above. Therefore, when viewed from above, the edge of the second P layer 54 surrounds second N layer 52. The second P layer 54 is in round (or elliptical) shape when viewed from above. The second P layer 54 is of any planar shape. Alternatively, the second P layer 54 may also be polygonal (for example, quadrilateral) in shape.

The second P layer 54 has a p-type dopant concentration greater than the n-type dopant concentration in the second I layer 53. Furthermore, the second P layer 54 has a p-type dopant concentration at least greater than the p-type dopant concentration in the concentration keeping layer 18. The second P layer 54 may also have a p-type dopant concentration greater than the p-type dopant concentration in the high concentration layer 16.

The peak level of the p-type dopant concentration in the second P layer 54 may range from equal to or more than $1 \times 10^{18}$ cm$^{-3}$ to equal to or less than $1 \times 10^{21}$ cm$^{-3}$. The peak level of the p-type dopant concentration in the second P layer 54 preferably ranges from equal to or more than $5 \times 10^{18}$ cm$^{-3}$ to equal to or less than $1 \times 10^{20}$ cm$^{-3}$. The p-type dopant concentration in the second P layer 54 is preferably equal to the p-type dopant concentration in the first P layer 34 of the first pin junction portion 31.

Pin junctions are formed on the second N layer 52, second I layer 53 and second P layer 54 in the thickness direction (i.e., normal direction Z) of the semiconductor chip 10. Therefore, the second pin diode D2 is formed on the surface of the second device region 22, with the second N layer 52 functioning as the cathode, and the second P layer 54 as the anode. The anode of the second pin diode D2 is electrically connected to the first semiconductor layer 14. The anode of the second pin diode D2 is connected in reverse biased to the anode of the first pin diode D1 through the semiconductor chip 10 (first semiconductor layer 14).

Referring to FIG. 2 to FIG. 6, the diode chip 1 includes a second pn junction portion 55. The second pn junction portion 55 is separated from the second pin junction portion 51 and formed in the second device region 22 with the first polarity direction. The second pn junction portion 55 forms a second Zener diode DZ2 within the second device region 22.

The second pn junction portion 55 includes an n+-type second inner N layer 56 (second inner semiconductor layer). A pn junction is formed between the second inner N layer 56 within the second device region 22 and the first semiconductor layer 14 (i.e., the concentration keeping layer 18). The second inner N layer 56 is formed at the junctional portion between the first semiconductor layer 14 (i.e., the concentration keeping layer 18) and the second semiconductor layer 15. The second inner N layer 56 is formed within the second device region 22 but confined to a region other than the second pin junction portion 51 (i.e., second P layer 54). Alternatively, the second inner N layer 56 may also be formed within the second device region 22 but confined to substantially the entire region other than the second pin junction portion 51 (second P layer 54).

The second inner N layer 56 has an inner peripheral portion which surrounds the second pin junction portion 51 (second P layer 54). The inner peripheral portion of the second inner N layer 56 may be connected to the second P layer 54 and may also be separated from the second P layer 54. Alternatively, an outer peripheral portion of the second inner N layer 56 may also be disposed outside the second device region 22. In other words, the outer peripheral portion of the second inner N layer 56 may also be separated from an inner portion of the second inner N layer 56 by the second region separation structure 23B. Alternatively, the outer peripheral portion of the second inner N layer 56 may be integrally formed, at the juncture between the first device region 21 and the second device region 22, with the outer peripheral portion of the first inner N layer 36.

Referring to FIG. 8, the second inner N layer 56 has an n-type dopant concentration greater than the n-type dopant concentration in the second semiconductor layer 15. Referring to FIG. 8, a concentration gradient of the n-type dopant of the second inner N layer 56 and a concentration gradient of the n-type dopant of the first inner N layer 36 are each represented by a dashed line. Furthermore, the second inner N layer 56 has an n-type dopant concentration greater than the p-type dopant concentration of the concentration keeping layer 18.

The peak level of the n-type dopant concentration in the second inner N layer 56 may range from equal to or more than $1 \times 10^{18}$ cm$^{-3}$ to equal to or less than $1 \times 10^{21}$ cm$^{-3}$. The peak level of the n-type dopant concentration in the second inner N layer 56 preferably ranges from equal to or more than $5 \times 10^{18}$ cm to equal to or less than $1 \times 10^{20}$ cm$^{-3}$. Preferably, the n-type dopant concentration in the second inner N layer 56 is equal to the n-type dopant concentration in the first inner N layer 36 of the first pn junction portion 35.

The second pn junction portion 55 forms the second Zener diode DZ2, with the second inner N layer 56 functioning as the cathode, and the first semiconductor layer 14 (i.e., the concentration keeping layer 18) as the anode. The anode of the second Zener diode DZ2 is connected in reverse biased to the anode of the first pin diode D1 and the anode of the second pin diode D2 through the semiconductor chip 10 (first semiconductor layer 14).

In the situation where the first semiconductor layer 14 dispenses with the concentration keeping layer 18, a pn junction is formed between the second inner N layer 56 and the concentration decreasing layer 17. Under this condition, variation of the pn concentration in the second pn junction portion 55 becomes abrupt, and thus actual withstand voltage (i.e., breakdown voltage VB) is likely to vary from target withstand voltage, starting from the second pn junction portion 55. The foregoing issue becomes noteworthy as a result of the deviation (for example, around ±5%) of thickness of the concentration decreasing layer 17.

Therefore, in the diode chip 1, the concentration keeping layer 18 is formed on the concentration decreasing layer 17 to slow down the variation of the pn concentration in the second pn junction portion 55. Therefore, variation of withstand voltage (i.e., breakdown voltage VB) from the second pn junction portion 55 as the origin is suppressed.

Furthermore, even if the deviation of thickness of the concentration decreasing layer 17 happens, the concentration keeping layer 18 of a specified thickness appropriately suppresses the withstand voltage variation otherwise caused by the deviation of thickness of the concentration decreasing layer 17. Furthermore, even if the deviation of thickness of the concentration keeping layer 18 happens, the slow variation of the pn concentration will be conducive to the appropriate suppression of the withstand voltage variation otherwise caused by the deviation of thickness of the concentration keeping layer 18.

Referring to FIG. 2 to FIG. 6, the diode chip 1 includes a second reversed pin junction portion 58. The second reversed pin junction portion 58 is formed on the surface of the second device region 22 with the second polarity direction and is connected in reverse biased to the second pn junction portion 55. The second reversed pin junction portion 58 forms a second reversed pin diode DR2 on the surface of the second device region 22. A second diode pair 57 (second rectifier pair) is formed between the second reversed pin junction portion 58 and the second pn junction portion 55.

When viewed from above, the second reversed pin junction portion 58 is separated from the second pin junction portion 51 and formed on one side of the surface of the second device region 22 (i.e., on the side of the first lateral surface 13A). When the second reversed pin junction portion 58 is configured with a line which extends in second direction Y and traverses the second pin junction portion 51, the second reversed pin junction portion 58 is disposed on the line.

In other words, the second reversed pin junction portion 58 is formed at the central portion of the second device region 22 in first direction X. The second reversed pin junction portion 58 is opposite the second pin junction portion 51 in second direction Y. In this embodiment, the first pin junction portion 31, the first reversed pin junction portion 38, the second pin junction portion 51 and the second reversed pin junction portion 58 are arranged in a row in second direction Y.

When the second reversed pin junction portion 58 is configured with a central line which traverses the central portion of the first main surface 11 in first direction X, the second reversed pin junction portion 58 is preferably formed in such a manner as to be linearly symmetrical to the first reversed pin junction portion 38 with respect to the central line. Preferably, the second reversed pin junction portion 58 is point-symmetrical to the first reversed pin junction portion 38 with respect to the central portion of the first main surface 11.

The second reversed pin junction portion 58 includes a p+-type second reversed P layer 59 (second upper reversed semiconductor layer), an n-type second reversed I layer 60 (second reversed resistance layer), and an n+-type second reversed N layer 61 (second lower reversed semiconductor layer) which are formed sequentially in the thickness direction, starting from the surface of the second device region 22.

The second reversed P layer 59 is formed on the surface of the second semiconductor layer 15. The second reversed P layer 59 has a p-type dopant concentration greater than the n-type dopant concentration of the second semiconductor layer 15. The peak level of the p-type dopant concentration in the second reversed P layer 59 may range from equal to or more than $1\times10^{18}$ cm$^{-3}$ to equal to or less than $1\times10^{21}$ cm$^{-3}$. The peak level of the p-type dopant concentration in the second reversed P layer 59 preferably ranges from equal to or more than $5\times10^{18}$ cm to equal to or less than $1\times10^{20}$ cm$^{-3}$. The p-type dopant concentration in the second reversed P layer 59 is preferably equal to the p-type dopant concentration in the first reversed P layer 39 of the first reversed pin junction portion 38.

The second reversed P layer 59 is in round (or elliptical) shape when viewed from above. The second reversed P layer 59 is of any planar shape. Alternatively, the second reversed P layer 59 may be polygonal (for example, quadrilateral) in shape.

The second reversed P layer 59 has a second planar area S2. The second planar area S2 may range from equal to or more than 1000 μm$^2$ to equal to or less than 10000 μm$^2$. Alternatively, the second planar area S2 may range from equal to or more than 1000 m to equal to or less than 2000 μm$^2$, from equal to or more than 2000 μm$^2$ to equal to or less than 4000 μm$^2$, from equal to or more than 4000 μm$^2$ to equal to or less than 6000 μm$^2$, from equal to or more than 6000 μm$^2$ to equal to or less than 8000 μm$^2$, or from equal to or more than 8000 μm$^2$ to equal to or less than 10000 μm$^2$. Preferably, the second planar area S2 is equal to the first planar area S1 of the first reversed P layer 39.

The second reversed I layer 60 is formed from the second semiconductor layer 15. The second reversed I layer 60 has an n-type dopant concentration equal to the n-type dopant concentration in the second semiconductor layer 15. The peak level of the n-type dopant concentration in the second reversed I layer 60 may range from equal to or more than $1\times10^{13}$ cm$^{-3}$ to equal to or less than $1\times10^{15}$ cm$^{-3}$. The peak level of the n-type dopant concentration in the second reversed I layer 60 preferably ranges from equal to or more than $5\times10^{13}$ cm$^{-3}$ to equal to or less than $5\times10^{14}$ cm$^{-3}$.

The second reversed N layer 61 is formed at the junctional portion between the first semiconductor layer 14 (i.e., the concentration keeping layer 18) and the second semiconductor layer 15. The second reversed N layer 61 is formed from the second inner N layer 56 which functions as a portion of the second pn junction portion 55. Therefore, the second reversed N layer 61 (second inner N layer 56) is opposite the second reversed N layer 61 in its entirety in such a manner as to be spaced apart from the second reversed I layer 60.

Pin junctions are formed on the second reversed P layer 59, second reversed I layer 60 and second reversed N layer 61 in the thickness direction (i.e., normal direction Z) of the semiconductor chip 10. Therefore, the second reversed pin diode DR2 is formed, with the second reversed P layer 59 functioning as the anode, and the second reversed N layer 61 as the cathode. The cathode of the second reversed pin diode DR2 is connected to the cathode of the second Zener diode DZ2.

Therefore, the second diode pair 57 is formed. The second diode pair 57 includes the second Zener diode DZ2 and the second reversed pin diode DR2 series-connected in reverse biased to the second Zener diode DZ2. The second diode pair 57 is parallel-connected to the second pin diode D2 through the semiconductor chip 10 (first semiconductor layer 14). Therefore, a second parallel-connected circuit 62 including the second pin diode D2 and the second diode pair 57 is formed. A TVS circuit 63 (transient voltage suppressor circuit) is formed between the second parallel-connected circuit 62 and the first parallel-connected circuit 42.

Referring to FIG. 2 to FIG. 6, the diode chip 1 includes a second junction separation structure 65. The second junction separation structure 65 is formed in the second device region 22 and adapted to separate the second pin junction portion 51 from the second pn junction portion 55 and the second reversed pin junction portion 58.

The second junction separation structure 65 includes a second junction separation trench 66, a second junction separation insulation layer 67 and a polysilicon 68. In this embodiment, the second junction separation trench 66 has a dual-groove structure which flanks the juncture between the second pin junction portion 51 (second P layer 54) and the second pn junction portion 55 (second inner N layer 56) and surrounds the second pin junction portion 51. The second junction separation trench 66 includes a second inner groove 66A and a second outer groove 66B.

When viewed from above, the second inner groove 66A is in annular shape (circular enclosing shape in the embodiment) to surround the second pin junction portion 51. The second inner groove 66A is of any planar shape. Alternatively, the second inner groove 66A may be in polygonal enclosing shape (for example, square enclosing shape) or in circular enclosing shape (or elliptical enclosing shape).

The second inner groove 66A is formed by etching the first main surface 11 down toward the second main surface 12. The second inner groove 66A penetrates the second P layer 54 of the second pin junction portion 51 and reaches the first semiconductor layer 14 (i.e., the concentration decreasing layer 17).

The second inner groove 66A includes an inner peripheral wall, an outer peripheral wall and a bottom wall. Owing to the inner peripheral wall of the second inner groove 66A, an inner portion of the second P layer 54 is exposed. Owing to the outer peripheral wall of the second inner groove 66A, an edge portion of the second P layer 54 is exposed. Therefore, owing to the second inner groove 66A, the peripheral portions of the second P layer 54 and the second pin junction portion 51 are electrically separated.

The inner peripheral wall and outer peripheral wall of the second inner groove 66A may be perpendicular to the first main surface 11. Alternatively, the inner peripheral wall and outer peripheral wall of the second inner groove 66A may be oblique with respect to the first main surface 11. Under this condition, the second inner groove 66A may taper, that is, with its bottom side area being less than its opening area.

The bottom wall of the second inner groove 66A is positioned proximate to the concentration decreasing layer 17 relative to the high concentration layer 16. The bottom wall of the second inner groove 66A allows the concentration decreasing layer 17 to be exposed. The second inner groove 66A and the region separation trench 24 may be simultaneously formed. Under this condition, the second inner groove 66A is of the same width and depth as the region separation trench 24.

When viewed from above, the second outer groove 66B is separated from the second inner groove 66A and is in annular shape (circular enclosing shape in the embodiment) to surround the second inner groove 66A. The second outer groove 66B is of any planar shape and thus does not necessarily need to correspond in shape to the planar shape of the second inner groove 66A. Alternatively, the second outer groove 66B may be in polygonal enclosing shape (for example, square enclosing shape) or in circular enclosing shape (or elliptical enclosing shape).

The second outer groove 66B is formed by etching the first main surface 11 down toward the second main surface 12. The second outer groove 66B penetrates the second inner N layer 56 (second reversed N layer 61) of the second pn junction portion 55 and reaches the first semiconductor layer 14 (i.e., the concentration decreasing layer 17).

The second outer groove 66B includes an inner peripheral wall, an outer peripheral wall and a bottom wall. Owing to the inner peripheral wall of the second outer groove 66B, the inner peripheral portion of the second inner N layer 56 (second reversed N layer 61) is exposed. Owing to the outer peripheral wall of the second outer groove 66B, the inner portion of the second inner N layer 56 (second reversed N layer 61) is exposed. Therefore, owing to the second outer groove 66B, the inner peripheral portion of the second inner N layer 56 (second reversed N layer 61) is electrically separated from the second pn junction portion 55 and the second reversed pin junction portion 58.

The inner peripheral wall and outer peripheral wall of the second outer groove 66B may be perpendicular to the first main surface 11. Alternatively, the inner peripheral wall and outer peripheral wall of the second outer groove 66B may be oblique with respect to the first main surface 11. Under this condition, the second outer groove 66B may also taper, that is, with its bottom side area being less than its opening area.

The bottom wall of the second outer groove 66B is positioned proximate to the concentration decreasing layer 17 relative to the high concentration layer 16. The bottom wall of the second outer groove 66B allows the concentration decreasing layer 17 to be exposed. The second outer groove 66B and the region separation trench 24 are formed simultaneously. Under this condition, the second outer groove 66B is of the same width and depth as the region separation trench 24.

The groove pitch between the second inner groove 66A and the second outer groove 66B may range from equal to or more than 1 μm to equal to or less than 10 μm. Alternatively, the concentration keeping layer 18 may also be of a thickness of equal to or more than 1 μm to equal to or less than 2 μm, equal to or more than 2 μm to equal to or less than 4 μm, equal to or more than 4 μm to equal to or less than 6 μm, equal to or more than 6 μm to equal to or less than 8 μm, or equal to or more than 8 μm to equal to or less than 10 μm. The groove pitch preferably ranges from equal to or more than 3 m to equal to or less than 8 μm.

In this embodiment, the second inner groove 66A and the second outer groove 66B are each provided in the form of a deep groove of an aspect ratio greater than 1. The aspect ratio is the ratio of the depth of the second inner groove 66A (second outer groove 66B) to the width of the second inner groove 66A (second outer groove 66B). The aspect ratio preferably ranges from 5 to 20.

The second inner groove 66A (second outer groove 66B) may be of a width of equal to or more than 0.1 μm to equal to or less than 3 μm. Alternatively, the second inner groove 66A (second outer groove 66B) may be of a width of equal to or more than 0.1 m to equal to or less than 0.5 μm, equal to or more than 0.5 μm to equal to or less than 1 μm, equal to or more than 1 μm to equal to or less than 1.5 μm, equal to or more than 1.5 μm to equal to or less than 2 μm, equal to or more than 2 μm to equal to or less than 2.5 μm, or equal to or more than 2.5 μm to equal to or less than 3 μm. The width of the second inner groove 66A (second outer groove 66B) preferably ranges from equal to or more than 1.5 μm to equal to or less than 2.5 μm.

The second inner groove 66A (second outer groove 66B) may be of a depth of equal to or more than 1 μm to equal to or less than 50 μm. Alternatively, the second inner groove 66A (second outer groove 66B) may be of a depth of equal to or more than 1 μm to equal to or less than 5 μm, equal to or more than 5 μm to equal to or less than 10 μm, equal to or more than 10 μm to equal to or less than 15 μm, equal to or more than 15 μm to equal to or less than 20 μm, equal to or more than 20 μm to equal to or less than 25 μm, equal to or more than 25 μm to equal to or less than 30 μm, or more than 30 μm to equal to or less than 40 μm, or equal to or more than 40 μm to equal to or less than 50 m. The depth of the second inner groove 66A (second outer groove 66B) preferably ranges from equal to or more than 15 μm to equal to or less than 35 μm.

Therefore, the second outer groove 66B and the second inner groove 66A together constitute a dual-groove structure which flanks the juncture between the second pin junction portion 51 (second P layer 54) and the second pn junction portion 55 (second inner N layer 56).

The second junction separation insulation layer 67 is formed in the second junction separation trench 66. The second junction separation insulation layer 67 extends across the inner wall of the second inner groove 66A and thus is film-like. Therefore, the second junction separation insulation layer 67 divides the inside of the second inner groove 66A into recess spaces. The second junction separation insulation layer 67 extends across the inner wall of the second outer groove 66B and thus is film-like. Therefore, the second junction separation insulation layer 67 divides the inside of the second outer groove 66B into recess spaces.

The second junction separation insulation layer 67 may include at least one of a silicon oxide layer and a silicon nitride layer. The second junction separation insulation layer 67 may have a laminate structure formed by laminating together the silicon oxide layer and the silicon nitride layer in any order. The second junction separation insulation layer 67 may also have a monolayer structure composed of the silicon oxide layer or the silicon nitride layer. The second junction separation insulation layer 67 is preferably made of the same insulating material as the region separation insulation layer 25. In this embodiment, the second junction separation insulation layer 67 has a monolayer structure composed of the silicon oxide layer.

The polysilicon 68 is spaced apart from the second junction separation insulation layer 67 and disposed in the second junction separation trench 66. The polysilicon 68 is spaced apart from the second junction separation insulation layer 67 and disposed in the second inner groove 66A. The polysilicon 68 is spaced apart from the second junction separation insulation layer 67 and disposed in the second outer groove 66B.

The polysilicon 68 is formed to be electrically floating. Alternatively, the second junction separation structure 65 may not have the polysilicon 68 but includes the second junction separation insulation layer 67 integrally embedded in the second inner groove 66A. Alternatively, the second junction separation structure 65 may not have the polysilicon 68 but includes the second junction separation insulation layer 67 integrally embedded in the second outer groove 66B.

In this embodiment, the second junction separation trench 66 has a dual-groove structure which flanks the juncture between the second pin junction portion 51 and the second pn junction portion 55. However, the second junction separation trench 66 may also have a single groove structure which traverses the juncture between the second pin junction portion 51 and the second pn junction portion 55. Under this condition, the second inner groove 66A and the second outer groove 66B are integrally formed and thus together constitute the second junction separation trench 66.

Referring to FIG. 2 to FIG. 7, the diode chip 1 includes a shielding structure 71 formed at an edge portion of the semiconductor chip 10. The shielding structure 71 is separated from the lateral surfaces 13A to 13D in an inward direction and formed on the first main surface 11. When viewed from above, the shielding structure 71 extends in a band-shaped manner along the lateral surfaces 13A to 13D to demarcate the first device region 21 and the second device region 22 from multiple directions. The shielding structure 71 is in annular shape (square enclosing shape in the embodiment) to surround the first device region 21 and the second device region 22.

Therefore, the shielding structure 71 divides the semiconductor chip 10 into an inner region 72 and an outer region 73 serving as a complement to the inner region 72. The inner region 72 includes the first device region 21, the second device region 22 and the region separation structure 23. The shielding structure 71 protects the inner region 72 against the effect of an applied force exerted by the outer region 73 or a crack developed in the outer region 73.

The shielding structure 71 is made of a material different from that of the semiconductor chip 10 and extends, in a wall-like manner, from the first main surface 11 toward the second main surface 12. The shielding structure 71 has a groove insulating structure which includes a shielding groove 74, a shielding insulation layer 75 and a polysilicon 76.

The shielding groove 74 is formed by etching the first main surface 11 down toward the second main surface 12. The shielding groove 74 penetrates the second semiconductor layer 15 and reaches the first semiconductor layer 14. The shielding groove 74 penetrates the second semiconductor layer 15 and the concentration keeping layer 18 and reaches the concentration decreasing layer 17.

The shielding groove 74 includes a lateral wall and a bottom wall. The lateral wall of the shielding groove 74 may be perpendicular to the first main surface 11. Alternatively, the lateral wall of the shielding groove 74 may be oblique with respect to the first main surface 11. Under this condition, the shielding groove 74 may also taper, that is, with its bottom side area being less than its opening area.

The bottom wall of the shielding groove 74 is positioned proximate to the concentration decreasing layer 17 relative to the high concentration layer 16. Therefore, the lateral wall of the shielding groove 74 allows the second semiconductor layer 15, the concentration keeping layer 18 and the concentration decreasing layer 17 to be exposed. Furthermore, the bottom wall of the shielding groove 74 allows the concentration decreasing layer 17 to be exposed. The shielding groove 74 and the region separation trench 24 may be simultaneously formed. Under this condition, the shielding groove 74 is of the same width and depth as the region separation trench 24.

In this embodiment, the shielding groove 74 is provided in the form of a deep groove of an aspect ratio greater than 1. The aspect ratio is the ratio of the depth of the shielding groove 74 to the width of the shielding groove 74. The aspect ratio preferably ranges from 5 to 20.

The shielding groove 74 may be of a width of equal to or more than 0.1 μm to equal to or less than 3 μm. Alternatively, the shielding groove 74 may be of a width of equal to or more than 0.1 μm to equal to or less than 0.5 μm, equal to or more than 0.5 m to equal to or less than 1 μm, equal to or more than 1 μm to equal to or less than 1.5 m, equal to or more than 1.5 μm to equal to or less than 2 μm, equal to or more than 2 m to equal to or less than 2.5 μm, or equal to or more than 2.5 μm to equal to or less than 3 μm. The width of the shielding groove 74 preferably ranges from equal to or more than 1.5 μm to equal to or less than 2.5 μm.

The shielding groove 74 may be of a depth of equal to or more than 1 μm to equal to or less than 50 μm. Alternatively, the shielding groove 74 may be of a depth of equal to or more than 1 μm to equal to or less than 5 μm, equal to or more than 5 μm to equal to or less than 10 μm, equal to or more than 10 μm to equal to or less than 15 μm, equal to or more than 15 μm to equal to or less than 20 μm, equal to or more than 20 μm to equal to or less than 25 μm, equal to or more than 25 μm to equal to or less than 30 μm, equal to or more than 30 μm to equal to or less than 40 μm, or equal to or more than 40 m to equal to or less than 50 µm. The depth of the shielding groove 74 preferably ranges from equal to or more than 15 µm to equal to or less than 5035 µm.

The shielding insulation layer 75 is formed in the shielding groove 74. The shielding insulation layer 75 extends across the inner wall of the shielding groove 74 and thus is film-like. Therefore, the shielding insulation layer 75 divides the inside of the shielding groove 74 into recess spaces.

The shielding insulation layer 75 may include at least one of a silicon oxide layer and a silicon nitride layer. The shielding insulation layer 75 may have a laminate structure formed by laminating the silicon oxide layer and the silicon nitride layer sequentially in any order. The shielding insulation layer 75 may also have a monolayer structure composed of the silicon oxide layer or the silicon nitride layer. The shielding insulation layer 75 is preferably made of the same insulating material as the region separation insulation layer 25. In this embodiment, the shielding insulation layer 75 has a monolayer structure composed of the silicon oxide layer.

The polysilicon 76 is spaced apart from the shielding insulation layer 75 and disposed in the shielding groove 74. The polysilicon 76 is formed to be electrically floating. Alternatively, the shielding structure 71 may not have the polysilicon 76 but includes the shielding insulation layer 75 integrally embedded in the shielding groove 74.

Referring to FIG. 2 to FIG. 5, the edge of the first main surface 11 includes a p+-type outer dopant layer 80 formed on the first main surface 11. The outer dopant layer 80 suppresses a leakage current between the first semiconductor layer 14 and the second semiconductor layer 15 at the edge of the semiconductor chip 10.

The outer dopant layer 80 is formed at the region (i.e., the outer region 73) between the shielding structure 71 and the lateral surfaces 13A to 13D. The outer dopant layer 80 is separated from the shielding structure 71 in the direction of the lateral surfaces 13A to 13D. The outer dopant layer 80 is exposed from the lateral surfaces 13A to 13D. Alternatively, the outer dopant layer 80 may cover the shielding structure 71.

When viewed from above, the outer dopant layer 80 extends, in a band-shaped manner, along the lateral surfaces 13A to 13D. The outer dopant layer 80 extends along the lateral surfaces 13A to 13D in such a manner as to be in annular shape (square enclosing shape in this embodiment).

The outer dopant layer 80 has a p-type dopant concentration greater than the p-type dopant concentration of the second semiconductor layer 15. The peak level of the p-type dopant concentration in the outer dopant layer 80 may range from equal to or more than $1\times10^{18}$ cm$^{-3}$ to equal to or less than $1\times10^{21}$ cm$^{-3}$. The peak level of the p-type dopant concentration in the outer dopant layer 80 preferably ranges from equal to or more than $5\times10^{18}$ cm$^{-3}$ to equal to or less than $1\times10^{20}$ cm$^{-3}$.

The outer dopant layer 80 is formed on the first main surface 11 in such a manner as to traverse the juncture of the first semiconductor layer 14 and the second semiconductor layer 15. The outer dopant layer 80 includes an upper region 81 and a lower region 82 which are formed sequentially in the thickness direction, starting from the first main surface 11. The upper region 81 is formed on the surface of the second semiconductor layer 15. The p-type dopant concentration in the upper region 81 is greater than the n-type dopant concentration in the second semiconductor layer 15. The upper region 81 has a concentration gradient which defines a decrease in the p-type dopant concentration from the first main surface 11 to the second main surface 12.

The lower region 82 is formed at the junctional portion between the first semiconductor layer 14 (i.e., the concentration keeping layer 18) and the second semiconductor layer 15 in such a manner as to be connected to the upper region 81. The lower region 82 has a p-type dopant concentration (a concentration gradient) different from that of the upper region 81. The lower region 82 has a concentration gradient which defines a p-type dopant concentration increasing from the second main surface 12 to the first main surface 11 and then decreasing. The p-type dopant concentration in the lower region 82 is preferably equal to the p-type dopant concentration in the first P layer 34 of the first pin junction portion 31 (the second P layer 54 of the second pin junction portion 51).

Referring to FIG. 1 to FIG. 7, the diode chip 1 (chip body 2) includes an inter-insulation layer 91 which covers the first main surface 11. The inter-insulation layer 91 has an edge portion which is exposed from the lateral surfaces 13A to 13D of the semiconductor chip 10. The edge portion of the inter-insulation layer 91 is connected to the lateral surfaces 13A to 13D. The edge portion of the inter-insulation layer 91 constitutes the same surface relative to the lateral surfaces 13A to 13D.

The inter-insulation layer 91 may have a laminate structure formed by laminating multiple insulation layers together and may also have a monolayer structure composed of a single insulation layer. The inter-insulation layer 91 may include at least one of the silicon oxide layer and the silicon nitride layer. The inter-insulation layer 91 may have a laminate structure formed by laminating together the silicon oxide layer and the silicon nitride layer in any order. The inter-insulation layer 91 may also have a monolayer structure composed of the silicon oxide layer or the silicon nitride layer.

In this embodiment, the inter-insulation layer 91 has a laminate structure which includes an ONO (oxide-nitride-oxide) formed by laminating the first silicon oxide layer, silicon nitride layer and second silicon oxide layer sequentially from the first main surface 11. The inter-insulation layer 91 need not have the ONO laminate structure in its entirety. Alternatively, the inter-insulation layer 91 is defined with a region A which covers one side of the first main surface 11 (i.e., the side of the first lateral surface 13A) and a region B which covers the other side of the first main surface 11 (i.e., the side of the second lateral surface 13B), and the regions A, B may, for example, have the ONO laminate structure each, whereas an insulation layer distinguished from the ONO laminate structure is disposed on the remaining region (i.e., region other than the regions A, B) of the inter-insulation layer 91.

The first silicon oxide layer may have a laminate structure formed by laminating multiple silicon oxide layers together and may also have a monolayer structure including a single silicon oxide layer. The first silicon oxide layer may also include at least one of USG (undoped silica glass) layer, PSG (phosphor silicate glass) layer and BPSG (boron phosphor silicate glass) layer which function as the silicon oxide layer in an embodiment of the present disclosure. In this embodiment, the first silicon oxide layer has a monolayer structure including a single silicon oxide layer.

The second silicon oxide layer may have a laminate structure formed by laminating multiple silicon oxide layers together and may also have a monolayer structure composed of a single silicon oxide layer. The second silicon oxide layer may also include at least one of USG layer, PSG layer and BPSG layer, which serves as an example of the silicon oxide layer. In this embodiment, the second silicon oxide layer has a laminate structure formed by laminating together the USG layer and the BPSG layer sequentially from the silicon nitride layer.

The inter-insulation layer 91 may be of a thickness (total thickness) of equal to or more than 1 µm to equal to or less than 10 µm. Alternatively, the inter-insulation layer 91 may be of a thickness (total thickness) of equal to or more than 1 µm to equal to or less than 2 µm, equal to or more than 2 µm to equal to or less than 4 µm, equal to or more than 4 µm to equal to or less than 6 µm, equal to or more than 6 µm to equal to or less than 8 µm, or equal to or more than 8 µm to equal to or less than 10 µm. The thickness (total thickness) of the inter-insulation layer 91 preferably ranges from equal to or more than 4 µm to equal to or less than 5 µm.

The inter-insulation layer 91 includes a first pin opening 92, first reversed pin opening 93, second pin opening 94 and second reversed pin opening 95. The first pin junction portion 31 is exposed from the first pin opening 92 within the first device region 21. The first reversed pin junction portion 38 is exposed from the first reversed pin opening 93 within the first device region 21. The second pin junction portion 51 is exposed from the second pin opening 94 within the second device region 22. The second reversed pin junction portion 58 is exposed from the second reversed pin opening 95 within the second device region 22.

When viewed from above, the first pin opening 92, first reversed pin opening 93, second pin opening 94 and second reversed pin opening 95 are in round (or elliptical) shape. The first pin opening 92, first reversed pin opening 93, second pin opening 94 and second reversed pin opening 95 are of any planar shape. Alternatively, when viewed from above, the first pin opening 92, first reversed pin opening 93, second pin opening 94 and second reversed pin opening 95 may be polygonal (for example, quadrilateral) in shape.

Referring to FIG. 2 to FIG. 7 (especially FIG. 7), the diode chip 1 includes the first electrode layer 101 (first electrode). Within the first device region 21, the first electrode layer 101 penetrates the inter-insulation layer 91 and electrically connects to the first pin junction portion 31 and the first diode pair 37. Owing to the first electrode layer 101, the first pin junction portion 31 is parallel-connected to the first diode pair 37. The first electrode layer 101 is formed, in the form of a film, on the inter-insulation layer 91. The first electrode layer 101 includes a first bonding pad portion 101A and a first wiring portion 101B.

When viewed from above, the first bonding pad portion 101A is formed on one side (i.e., the side of the first lateral surface 13A) of the semiconductor chip 10. The first bonding pad portion 101A is opposite the first device region 21 in such a manner as to be spaced apart from the inter-insulation layer 91. When viewed from above, the first bonding pad portion 101A is cuboid and extends in first direction X. The first bonding pad portion 101A is of any planar shape. In this embodiment, when viewed from above, the first bonding pad portion 101A is formed in such a manner as to overlap the first pin junction portion 31 but not to overlap the first reversed pin junction portion 38.

The first bonding pad portion 101A enters the first pin opening 92 from above the inter-insulation layer 91. The first bonding pad portion 101A is, in the first pin opening 92, electrically connected to the first pin junction portion 31. An ohmic contact is formed between the first bonding pad portion 101A and the first pin junction portion 31 (first N layer 32).

The first wiring portion 101B is extended outward, in a band-shaped manner, from the first bonding pad portion 101A toward the first reversed pin junction portion 38. In this embodiment, the width (in first direction X) of the first wiring portion 101B is less than the width (in first direction X) of the first bonding pad portion 101A. The first wiring portion 101B is of any width in first direction X. Alternatively, the width (in first direction X) of the first wiring portion 101B may be equal to the width (in first direction X) of the first bonding pad portion 101A. From the perspective of suppression of parasitic capacitance, the width (in first direction X) of the first wiring portion 101B is preferably less than the width (in first direction X) of the first bonding pad portion 101A.

The first wiring portion 101B enters the first reversed pin opening 93 from above the inter-insulation layer 91. The first wiring portion 101B is, in the first reversed pin opening 93, electrically connected to the first reversed pin junction portion 38. An ohmic contact is formed between the first wiring portion 101B and the first reversed pin junction portion 38 (first reversed P layer 39).

The first electrode layer 101 may include at least one of a pure Cu layer (Cu layer of purity greater than 99%), pure Al layer (Al layer of purity greater than 99%), AlSi alloy layer, AlCu alloy layer and AlSiCu alloy layer.

Referring to FIG. 2 to FIG. 7 (especially FIG. 7), the diode chip 1 includes the second electrode layer 102 (second electrode). Within the second device region 22, the second electrode layer 102 penetrates the inter-insulation layer 91 and electrically connects to the second pin junction portion 51 and the second diode pair 57. Owing to the second electrode layer 102, the second pin junction portion 51 is parallel-connected to the second diode pair 57. The second electrode layer 102 is separated from the first electrode layer 101 and formed, in the form of a film, on the inter-insulation layer 91. The second electrode layer 102 includes a second bonding pad portion 102A and a second wiring portion 102B.

When viewed from above, the second bonding pad portion 102A is formed on the other side (i.e., the side of the second lateral surface 13B) of the semiconductor chip 10. The second bonding pad portion 102A is opposite the second device region 22 in such a manner as to be spaced apart from the inter-insulation layer 91. When viewed from above, the second bonding pad portion 102A is cuboid and extends in first direction X. The second bonding pad portion 102A is of any planar shape. In this embodiment, when viewed from above, the second bonding pad portion 102A is formed in such a manner as to overlap the second pin junction portion 51 but not to overlap the second reversed pin junction portion 58.

The second bonding pad portion 102A enters the second pin opening 94 from above the inter-insulation layer 91. The second bonding pad portion 102A is, in the second pin opening 94, electrically connected to the second pin junction portion 51. An ohmic contact is formed between the second bonding pad portion 102A and the second pin junction portion 51 (second N layer 52).

The second wiring portion 102B is extended outward, in a band-shaped manner, from the second bonding pad portion 102A toward the second reversed pin junction portion 58. The second wiring portion 102B is opposite the first wiring portion 101B in second direction Y. In this embodiment, the width (in first direction X) of the second wiring portion 102B is less than the width (in first direction X) of the second bonding pad portion 102A.

The second wiring portion 102B is of any width in first direction X. Alternatively, the width (in first direction X) of the second wiring portion 102B may be equal to the width (in first direction X) of the second bonding pad portion 102A. From the perspective of suppression of parasitic capacitance, the width (in first direction X) of the second wiring portion 102B is preferably less than the width (in first direction X) of the second bonding pad portion 102A. The width (in first direction X) of the second wiring portion 102B is preferably equal to the width (in first direction X) of the first wiring portion 101B.

The second wiring portion 102B enters the second reversed pin opening 95 from above the inter-insulation layer 91. The second wiring portion 102B is, in the second reversed pin opening 95, electrically connected to the second reversed pin junction portion 58. An ohmic contact is formed between the second wiring portion 102B and the second reversed pin junction portion 58 (second reversed P layer 59).

The second electrode layer 102 may include at least one of a pure Cu layer (Cu layer of purity greater than 99%), pure Al layer (Al layer of purity greater than 99%), AlSi alloy layer, AlCu alloy layer and AlSiCu alloy layer. Preferably, the second electrode layer 102 includes the same conductive material as that of the first electrode layer 101.

Referring to FIG. 1 to FIG. 5, the diode chip 1 (chip body 2) includes an uppermost insulation layer 111 which covers the inter-insulation layer 91. The uppermost insulation layer 111 covers the first electrode layer 101 and the second electrode layer 102 above the inter-insulation layer 91. The uppermost insulation layer 111 has edge portions exposed from the lateral surfaces 13A to 13D of the semiconductor chip 10. The edge portions of the uppermost insulation layer 111 are connected to the lateral surfaces 13A to 13D. The edge portions of the uppermost insulation layer 111 constitute the same surface relative to the lateral surfaces 13A to 13D. The uppermost insulation layer 111 constitutes a portion of the chip lateral surfaces 5A to 5D of the chip body 2.

In this embodiment, the uppermost insulation layer 111 has a laminate structure which includes a passivation layer 112 and a resin layer 113. The passivation layer 112 may have a monolayer structure which includes a silicon oxide layer or a silicon nitride layer. The passivation layer 112 may also have a laminate structure formed by laminating together the silicon oxide layer and the silicon nitride layer in any order. The passivation layer 112 is preferably made of an insulating material different from the one which the main surface of the inter-insulation layer 91 is made of. In this embodiment, the passivation layer 112 has a monolayer structure composed of the silicon nitride layer.

The resin layer 113 may include a photosensitive resin. The photosensitive resin may be negative type or positive type. The photosensitive resin of the resin layer 113 includes, for example, at least one of polyimide, polyamide and polybenzimidazole. In this embodiment, the resin layer 113 includes polyimide.

The uppermost insulation layer 111 includes a first bonding pad opening 114 whereby the first electrode layer 101 is exposed and a second bonding pad opening 115 whereby the second electrode layer 102 is exposed.

The first bonding pad portion 101A of the first electrode layer 101 is exposed from the first bonding pad opening 114. An inner portion of the first bonding pad portion 101A is exposed from the first bonding pad opening 114, but the edge portion of the first bonding pad portion 101A is not exposed. When viewed from above, the first bonding pad opening 114 is quadrilateral (i.e., cuboid) in shape and thus matches the first bonding pad portion 101A. The first bonding pad opening 114 is of any planar shape.

The second bonding pad portion 102A of the second electrode layer 102 is exposed from the second bonding pad opening 115. An inner portion of the second bonding pad portion 102A is exposed from the second bonding pad opening 115, but the edge portion of the second bonding pad portion 102A is not exposed. When viewed from above, the second bonding pad opening 115 is quadrilateral (i.e., cuboid) in shape and thus matches the second bonding pad portion 102A. The second bonding pad opening 115 is of any planar shape.

Referring to FIG. 1 to FIG. 7, the diode chip 1 (chip body 2) includes a first terminal electrode 121 electrically connected to the first electrode layer 101. The first terminal electrode 121 penetrates the uppermost insulation layer 111 and connects to the first electrode layer 101. The first terminal electrode 121 is not only embedded in the first bonding pad opening 114 but is, in the first bonding pad opening 114, also electrically connected to the first bonding pad portion 101A.

When viewed from above, the first terminal electrode 121 overlaps the first pin junction portion 31 and is separated from the first reversed pin junction portion 38. The first terminal electrode 121 is cuboid in shape and extends in first direction X. The first terminal electrode 121 is of any planar shape.

The first terminal electrode 121 has a first electrode surface 121A exposed from the main surface (first chip main surface 3) of the resin layer 113. The first electrode surface 121A protrudes from the main surface (first chip main surface 3) of the resin layer 113. The first electrode surface 121A has an overlap portion which covers the main surface (first chip main surface 3) of the resin layer 113. The first terminal electrode 121 may also have a laminate structure formed by laminating together a Ni layer, a Pd layer and an Au layer sequentially from the first electrode layer 101.

Referring to FIG. 1 to FIG. 7, the diode chip 1 (chip body 2) includes a second terminal electrode 122 electrically connected to the second electrode layer 102. The second terminal electrode 122 penetrates the uppermost insulation layer 111 and connects to the second electrode layer 102. The second terminal electrode 122 is not only embedded in the second bonding pad opening 115 but is, in the second bonding pad opening 115, also electrically connected to the second bonding pad portion 102A.

When viewed from above, the second terminal electrode 122 overlaps the second pin junction portion 51 and is separated from the second reversed pin junction portion 58. The second terminal electrode 122 is cuboid in shape and extends in first direction X. The second terminal electrode 122 is of any planar shape.

The second terminal electrode 122 has a second electrode surface 122A exposed from the main surface (first chip main surface 3) of the resin layer 113. The second electrode surface 122A protrudes from the main surface (first chip main surface 3) of the resin layer 113. The second electrode surface 122A has an overlap portion which covers a main surface (first chip main surface 3) of the resin layer 113. The second terminal electrode 122 may also have a laminate structure formed by laminating together a Ni layer, a Pd layer and an Au layer sequentially from the second electrode layer 102.

Referring to FIG. 1 to FIG. 7, the diode chip 1 (chip body 2) includes lateral surface insulation layers 131 which cover the lateral surfaces 13A to 13D of the semiconductor chip 10. The lateral surface insulation layers 131 together cover the lateral surfaces 13A to 13D. The lateral surface insulation layers 131 constitute the chip lateral surfaces 5A to 5D of the chip body 2. The lateral surface insulation layers 131 enhance the insulation capability of the semiconductor chip 10 and protect the semiconductor chip 10.

The lateral surface insulation layers 131 are formed, in the form of a film, on the lateral surfaces 13A to 13D. The lateral surface insulation layers 131 have flat outer surfaces. The outer surfaces of the lateral surface insulation layers 131 extend parallelly relative to the lateral surfaces 13A to 13D. The lateral surface insulation layers 131 may cover a portion of the inter-insulation layer 91. Alternatively, the lateral surface insulation layers 131 may further traverse the inter-insulation layer 91 and thus cover a portion of the uppermost insulation layer 111. Under this condition, the lateral surface insulation layers 131 may cover a portion of the passivation layer 112 or a portion of the resin layer 113.

Owing to the lateral surface insulation layers 131, the second main surface 12 of the semiconductor chip 10 is exposed. The lateral surface insulation layers 131 are connected to the second main surface 12. The lateral surface insulation layers 131 constitute the same surface relative to the second main surface 12. A ground surface or mirror surface is formed between each lateral surface insulation layer 131 and the second main surface 12.

Each lateral surface insulation layer 131 may have a monolayer structure which includes a silicon oxide layer or a silicon nitride layer. The lateral surface insulation layer 131 may also have a laminate structure formed by laminating together the silicon oxide layer and the silicon nitride layer in any order. In this embodiment, the lateral surface insulation layer 131 has a monolayer structure composed of the silicon oxide layer.

Figure 9:
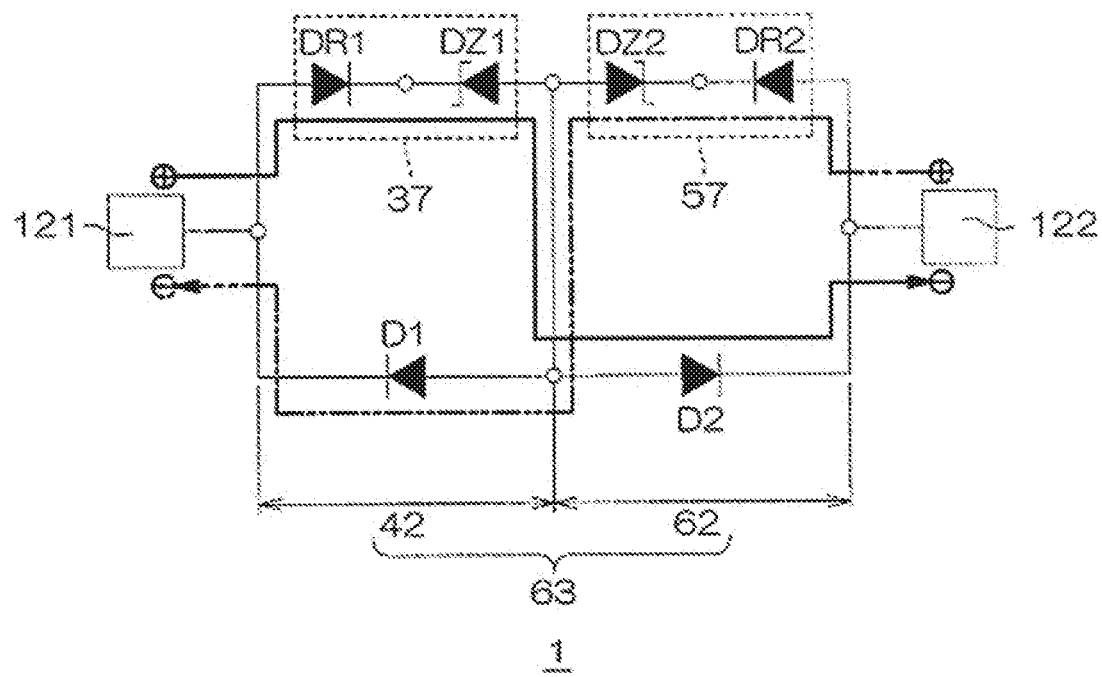
FIG. 9 is a circuit diagram of the diode chip shown in FIG. 1.

FIG. 9 is a circuit diagram of the diode chip 1 shown in FIG. 1. Referring to FIG. 9, the diode chip 1 includes the first terminal electrode 121, the second terminal electrode 122 and a TVS circuit 63. The TVS circuit 63 includes a series-connection circuit series-connecting the first parallel-connected circuit 42 and the second parallel-connected circuit 62 and electrically connected to the first terminal electrode 121 and the second terminal electrode 122.

The first parallel-connected circuit 42 includes the first pin diode D1 and the first diode pair 37. The first diode pair 37 includes the first reversed pin diode DR1 and the first Zener diode DZ1. The cathode of the first pin diode D1 is electrically connected to the first terminal electrode 121.

The first diode pair 37 includes a reversed series-connection circuit in which the cathode of the first reversed pin diode DR1 is connected in reverse biased to the cathode of the first Zener diode DZ1. The anode of the first reversed pin diode DR1 is electrically connected to the first terminal electrode 121. The anode of the first Zener diode DZ1 is connected in reverse biased to the anode of the first pin diode D1.

The second parallel-connected circuit 62 includes the second pin diode D2 and the second diode pair 57. The second diode pair 57 includes the second reversed pin diode DR2 and the second Zener diode DZ2. The cathode of the second pin diode D2 is electrically connected to the second terminal electrode 122. The anode of the second pin diode D2 is connected in reverse biased to the anode of the first pin diode D1 and the anode of the first Zener diode DZ1.

The second diode pair 57 includes a reversed series-connection circuit in which the cathode of the second reversed pin diode DR2 is connected in reverse biased to the cathode of the second Zener diode DZ2. The anode of the second reversed pin diode DR2 is electrically connected to the second terminal electrode 122. The anode of the second Zener diode DZ2 is connected in reverse biased to the anode of the first pin diode D1, the anode of the first Zener diode DZ1, and the anode of the second pin diode D2.

The diode chip 1 is a bidirectional device whereby a current flows in the direction of the first terminal electrode 121 and in the direction of the second terminal electrode 122. Thus, if a voltage greater than a specified threshold voltage (with the first terminal electrode 121 being the positive terminal) is applied to between the first terminal electrode 121 and the second terminal electrode 122, the current will flow from the first terminal electrode 121 to the second terminal electrode 122 through the first diode pair 37 and the second pin diode D2.

If a voltage greater than a specified threshold voltage (with the second terminal electrode 122 being the positive terminal) is applied to between the first terminal electrode 121 and the second terminal electrode 122, the current will flow from the second terminal electrode 122 to the first terminal electrode 121 through the second diode pair 57 and the first pin diode D1.

The electrical characteristics of the diode chip 1 functioning as a bidirectional device are enhanced, by augmenting the symmetry of the layout of the second pin junction portion 51, the second pn junction portion 55 and the second reversed pin junction portion 58 relative to the layout of the first pin junction portion 31, the first pn junction portion 35 and the first reversed pin junction portion 38. In other words, the electrical characteristics of the current flowing from the first terminal electrode 121 to the second terminal electrode 122 are identical to the electrical characteristics of the current flowing from the second terminal electrode 122 to the first terminal electrode 121.

Figure 10:
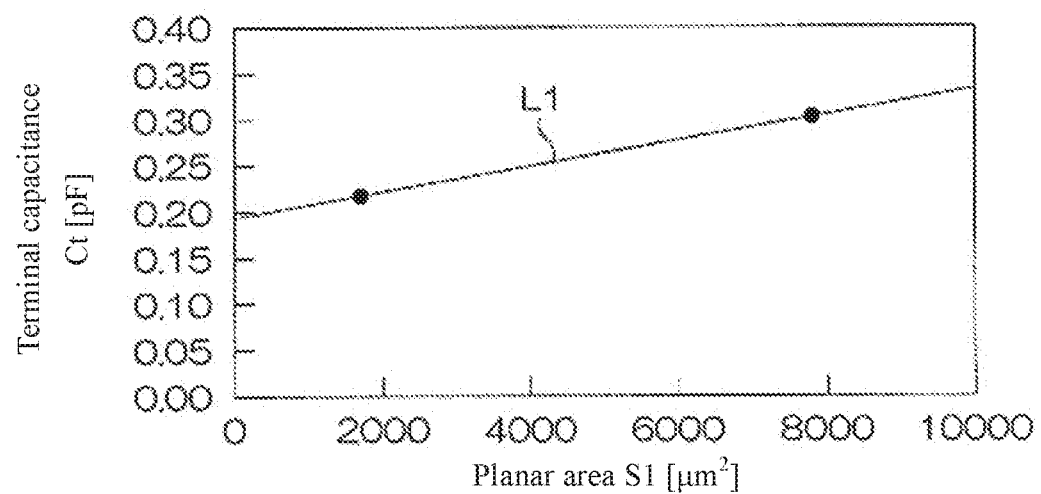
FIG. 10 is a graph of terminal capacitance of the diode chip shown in FIG. 1.

FIG. 10 is a graph of terminal capacitance CT of the diode chip 1 shown in FIG. 1. The vertical axis represents terminal capacitance CT [pF], and the horizontal axis represents first planar area S1 [μm$^2$] of the first reversed P layer 39. With the diode chip 1 being a bidirectional device, the horizontal axis may also represent second planar area S2 [μm$^2$] of the second reversed P layer 59.

FIG. 10 is a graph of capacitance characteristic L1 of terminal capacitance CT of the diode chip 1 shown in FIG. 1. The capacitance characteristic L1 and terminal capacitance CT increase proportionally with first planar area S1 and decrease proportionally with first planar area S. When first planar area S1 ranges from equal to or more than 1000 μm$^2$ to equal to or less than 10000 μm$^2$, terminal capacitance CT ranges from 0.15 pF to 0.35 pF.

Figure 11:
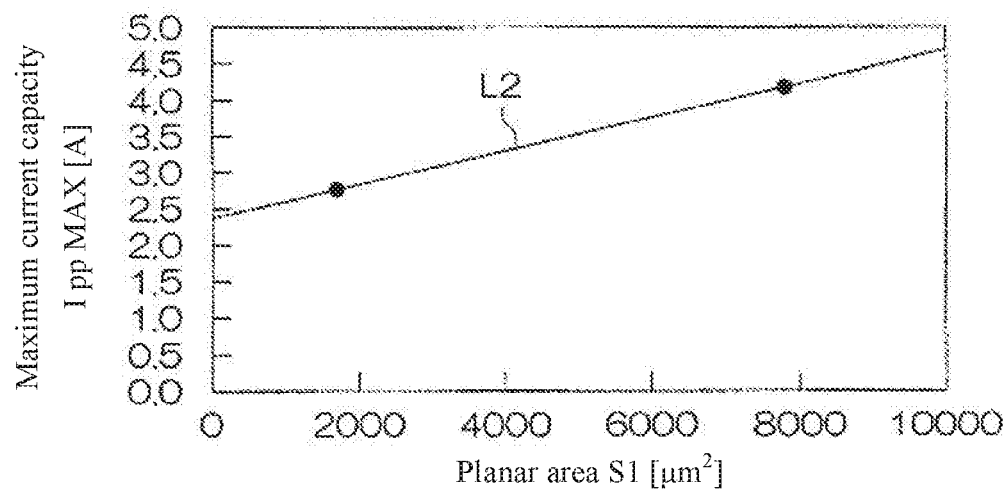
FIG. 11 is a graph of maximum current capacity of the diode chip shown in FIG. 1.

FIG. 11 is a graph of maximum current capacity IPP of the diode chip 1 shown in FIG. 1. The vertical axis represents maximum current capacity IPP [A], and the horizontal axis represents first planar area S1 [μm$^2$] of the first reversed P layer 39. With the diode chip 1 being a bidirectional device, the horizontal axis may also represent second planar area S2 [μm$^2$] of the second reversed P layer 59.

FIG. 11 is a graph of current characteristic L2 of maximum current capacity IPP of the diode chip 1 shown in FIG. 1. Current characteristic L2 and maximum current capacity IPP increase proportionally with first planar area S1 and decrease proportionally with first planar area S1. When first planar area S1 ranges from equal to or more than 1000 μm$^2$ to equal to or less than 10000 μm$^2$, maximum current capacity IPP ranges from 2 A to 5 A.

Figure 12:
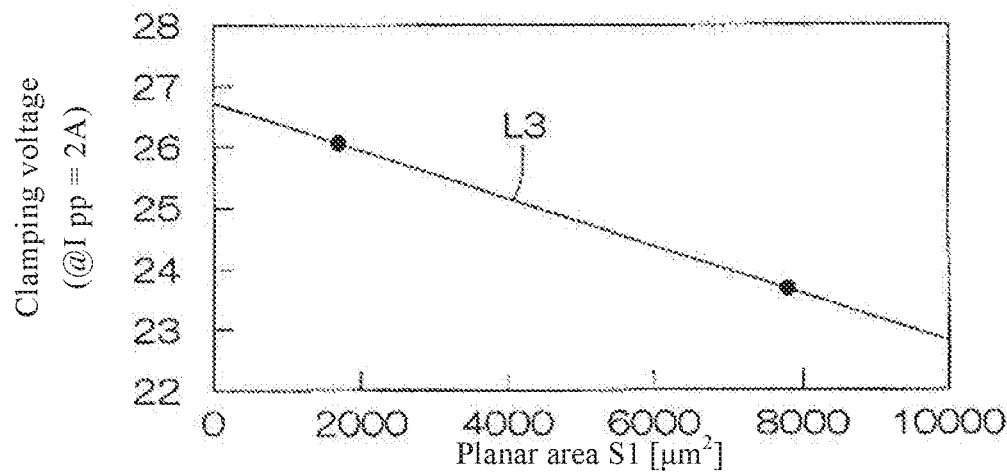
FIG. 12 is a graph of clamping voltage of the diode chip shown in FIG. 1.

FIG. 12 is a graph of clamping voltage VCL of the diode chip 1 shown in FIG. 1. The vertical axis represents clamping voltage VCL [V], and the horizontal axis represents first planar area S1 [μm$^2$] of the first reversed P layer 39. With the diode chip 1 being a bidirectional device, the horizontal axis may also represent second planar area S2 [µm²] of second reversed P layer 59.

FIG. 12 depicts voltage characteristic L3 of clamping voltage VCL of the diode chip 1. Voltage characteristic L3 and clamping voltage VCL are inversely proportional to first planar area S1. When first planar area S1 ranges from equal to or more than 1000 µm² to equal to or less than 10000 µm², clamping voltage VCL ranges from 23 V to 27 V.

Referring to FIG. 10 to FIG. 12, there is a known trade-off between terminal capacitance CT, maximum current capacity IPP and clamping voltage VCL. Therefore, regarding the diode chip 1, it is feasible to figure out low terminal capacitance CT, high maximum current capacity IPP and low clamping voltage VCL.

Decreasing the first planar area S1 of the first reversed pin junction portion 38 (first reversed P layer 39) can attain low terminal capacitance CT but not high maximum current capacity IPP and low clamping voltage VCL. By contrast, increasing the first planar area S1 of the first reversed pin junction portion 38 (first reversed P layer 39) can attain high maximum current capacity IPP and low clamping voltage VCL but not low terminal capacitance CT.

Therefore, the first planar area S1 of the first reversed pin junction portion 38 (first reversed P layer 39) must be adjusted according to the intended terminal capacitance CT, maximum current capacity IPP and clamping voltage VCL. In another aspect of this embodiment, the terminal capacitance CT, maximum current capacity IPP and clamping voltage VCL can be adjusted by adjusting the first planar area S1 of the first reversed pin junction portion 38 (first reversed P layer 39), and thus the diode chip 1 with various electrical characteristics can be easily attained.

The first device region 21 and the second device region 22 of the semiconductor chip 10 of the diode chip 1 are separated by the region separation structure 23. Thus, not only can the first pin junction portion 31, the first pn junction portion 35 and the first reversed pin junction portion 38 be delicately formed on and in the first device region 21 appropriately, but the second pin junction portion 51, the second pn junction portion 55 and the second reversed pin junction portion 58 can also be delicately formed on and in the second device region 22 appropriately. Therefore, the diode chip of the present disclosure is capable of attaining excellent electrical characteristics.

Regarding the diode chip 1, the region separation structure 23 has a groove structure which includes the region separation trench 24. Therefore, in the first device region 21, the region separation structure 23 appropriately suppresses undesirable diffusion of dopants between the first pin junction portion 31, the first pn junction portion 35 and the first reversed pin junction portion 38. In the second device region 22, the region separation structure 23 appropriately suppresses undesirable diffusion of dopants between the second pin junction portion 51, the second pn junction portion 55 and the second reversed pin junction portion 58. Therefore, the diode chip 1 is capable of attaining enhanced electrical characteristics appropriately.

The diode chip 1 includes the first junction separation structure 45. The first junction separation structure 45 separates the first pin junction portion 31 from the first pn junction portion 35 and the first reversed pin junction portion 38 in the first device region 21. Therefore, the first pin junction portion 31 is delicately formed on the surface of the first device region 21 appropriately.

The first junction separation structure 45 has a groove structure which includes the first junction separation trench 46. Therefore, within the first device region 21, the first junction separation structure 45 appropriately suppresses undesirable diffusion at the first pin junction portion 31.

Therefore, the first junction separation trench 46 has a dual-groove structure disposed in the first device region 21 and flanking the juncture between the first pin junction portion 31 (first P layer 34) and the first pn junction portion 35 (first inner N layer 36). The first junction separation trench 46 includes the first inner groove 46A and the first outer groove 46B which flank the juncture between the first pin junction portion 31 and the first pn junction portion 35.

The foregoing structure appropriately suppresses undesirable diffusion of a dopant between the first pin junction portion 31 and the first pn junction portion 35 (first reversed pin junction portion 38). Therefore, the first pin junction portion 31, the first pn junction portion 35 and the first reversed pin junction portion 38 can be appropriately formed within the first device region 21.

The diode chip 1 includes the second junction separation structure 65. Within the second device region 22, the second junction separation structure 65 separates the second pin junction portion 51 from the second pn junction portion 55 and the second reversed pin junction portion 58. Therefore, the second pin junction portion 51 is delicately formed on the surface of the second device region 22 appropriately.

The second junction separation structure 65 has a groove structure which includes the second junction separation trench 66. Therefore, within the second device region 22, the second junction separation structure 65 appropriately suppresses undesirable diffusion at the second pin junction portion 51.

The second junction separation trench 66 has a dual-groove structure disposed within the second device region 22 and flanking the juncture between the second pin junction portion 51 (second P layer 54) and the second pn junction portion 55 (second inner N layer 56). The second junction separation trench 66 includes a second inner groove 66A and a second outer groove 66B which flank the juncture between the second pin junction portion 51 and the second pn junction portion 55.

The foregoing structure appropriately suppresses undesirable diffusion of a dopant between the second pin junction portion 51 and the second pn junction portion 55 (second reversed pin junction portion 58). Therefore, the second pin junction portion 51, the second pn junction portion 55 and the second reversed pin junction portion 58 are appropriately formed within the second device region 22.

Figure 13:
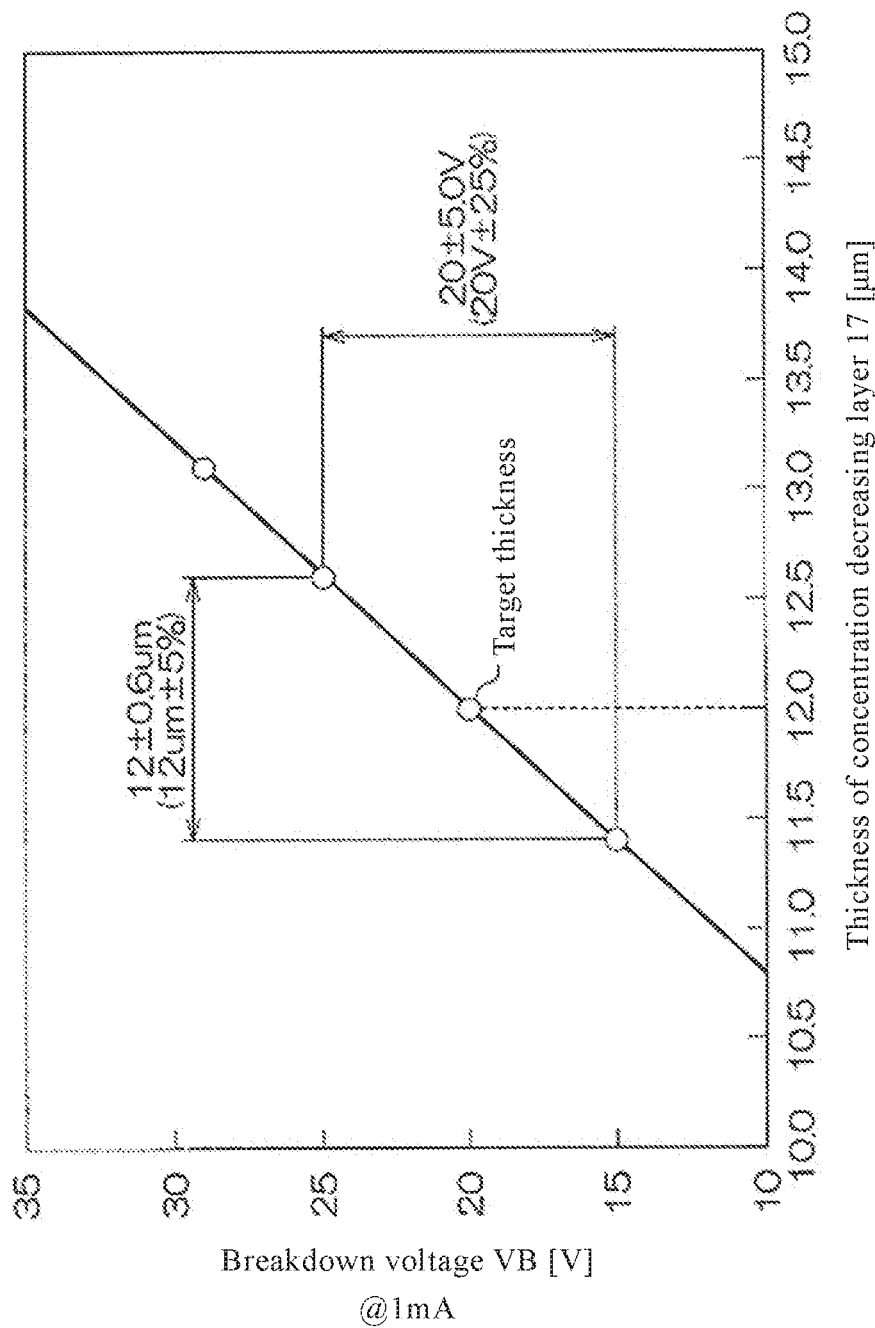
FIG. 13 is a graph of breakdown voltage of a diode chip in a reference embodiment.
Figure 14:
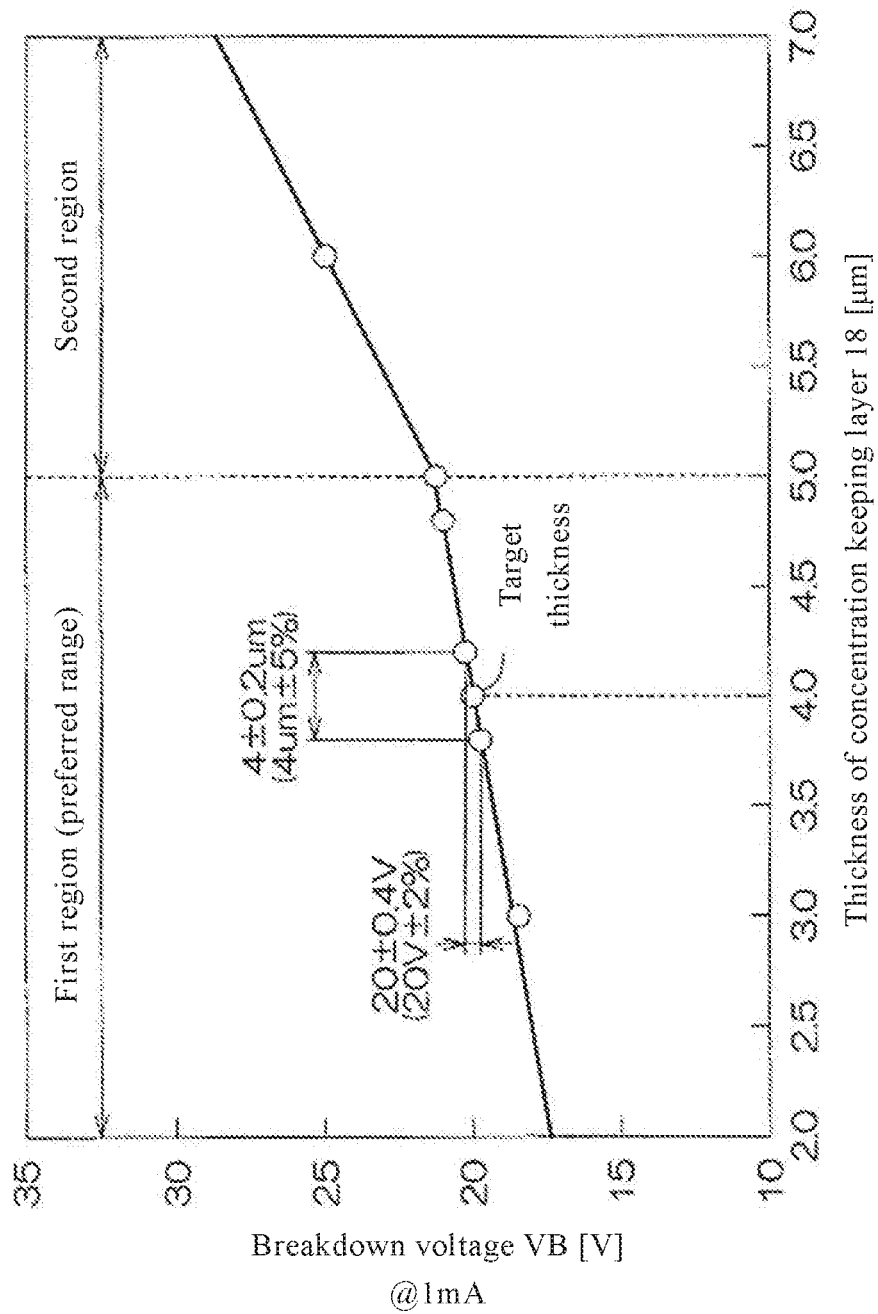
FIG. 14 is a graph of breakdown voltage of the diode chip shown in FIG. 1.

Referring to FIG. 13 and FIG. 14, breakdown voltage VB of a diode chip in a reference embodiment and breakdown voltage VB of the diode chip 1 are described below. The diode chip in the reference embodiment dispenses with the concentration keeping layer 18 but has a pn junction formed between the first inner N layer 36 and the concentration decreasing layer 17 and a pn junction formed between the second inner N layer 56 and the concentration decreasing layer 17. The other structural features of the diode chip in the reference embodiment are the same as those of the diode chip 1.

FIG. 13 is a graph of breakdown voltage VB of a diode chip in the reference embodiment. As shown in FIG. 13, the vertical axis represents breakdown voltage VB [V], and the horizontal axis represents the thickness of the concentration decreasing layer 17. In the reference embodiment, the concentration decreasing layer 17 of the diode chip dispenses with the concentration keeping layer 18 and thus is of a relatively great thickness, i.e., equal to or more than 10 µm to equal to or less than 15 µm.

Referring to FIG. 13, breakdown voltage VB of the diode chip in the reference embodiment increases proportionally with the thickness of the concentration decreasing layer 17 and decreases proportionally with the thickness of the concentration decreasing layer 17. The absolute value of the variation in breakdown voltage VB associated with every 0.1 µm of variation in the thickness of the concentration decreasing layer 17 of a thickness of equal to or more than 10 µm to equal to or less than 15 µm is equal to or more than 0.8V to equal to or less than 1 V.

When the target thickness of the concentration decreasing layer 17 is set to 12 m, target breakdown voltage VB is 20 V. Under this condition, an error of −5% in the actual thickness of the concentration decreasing layer 17 relative to the target thickness thereof brings about a 25% decrease in target breakdown voltage VB, thereby changing actual breakdown voltage VB to 15 V.

By contrast, an error of +5% in the actual thickness of the concentration decreasing layer 17 relative to the target thickness thereof brings about a 25% increase in target breakdown voltage VB, thereby changing actual breakdown voltage VB to 25 V. In other words, an error of ±5% in the actual thickness of the concentration decreasing layer 17 relative to the target thickness thereof brings about a ±25% deviation in target breakdown voltage VB.

Breakdown voltage VB depends on the pn junction concentration in the first pn junction portion 35 (second pn junction portion 55). Any deviation in the thickness of the concentration decreasing layer 17 causes a deviation in the position of the first pn junction portion 35 (second pn junction portion 55), thereby leading to variation in the pn junction concentration. In the situation where the first semiconductor layer 14 dispenses with the concentration keeping layer 18, there is abrupt variation of the difference in the pn concentration between the first inner N layer 36 (second inner N layer 56) and the concentration decreasing layer 17 (see FIG. 8). Therefore, in case of the deviation of thickness of the concentration decreasing layer 17, the deviation of the pn junction concentration will increase, thereby leading to the increased deviation caused by breakdown voltage VB.

FIG. 14 is a graph of breakdown voltage VB of the diode chip 1 shown in FIG. 1. Referring to FIG. 13, the vertical axis represents breakdown voltage VB [V], and the horizontal axis represents the thickness of the concentration keeping layer 18. FIG. 14 shows that breakdown voltage VB varies as the thickness of the concentration keeping layer 18 changes from 2 µm to 7 µm.

Referring to FIG. 14, breakdown voltage VB of the diode chip 1 increases proportionally with the thickness of the concentration keeping layer 18 and decreases proportionally with the thickness of the concentration keeping layer 18. The absolute value of the variation of breakdown voltage VB associated with every 0.1 µm of variation in the thickness of the concentration keeping layer 18 of a thickness of equal to or more than 2 µm to equal to or less than 7 µm is equal to or more than 0.1 V to equal to or less than 0.3 V.

There is a difference in the absolute value of variation in breakdown voltage VB between a first range (equal to or more than 2 µm to equal to or less than 5 µm) of the thickness of the concentration keeping layer 18 and a second range (more than 5 µm to equal to or less than 7 µm) of the thickness of the concentration keeping layer 18. The absolute value of the variation in breakdown voltage VB associated with every 0.1 µm of variation in the thickness of the concentration keeping layer 18 of a thickness within the first range is equal to or more than 0.1 V to equal to or less than 0.2 V. The absolute value of the variation in breakdown voltage VB associated with every 0.1 µm of variation in the thickness of the concentration keeping layer 18 of a thickness within the second range is equal to or more than 0.3 V to equal to or less than 0.4 V.

The concentration keeping layer 18 and the concentration decreasing layer 17 of the diode chip in the reference embodiment share the same effect of thickness errors on the deviation in the pn junction concentration; thus, thickness errors of the concentration keeping layer 18 which is relatively thick cause relatively great deviations in the pn junction concentration, thereby leading to the increased deviation caused by breakdown voltage VB. Therefore, the thickness of the concentration keeping layer 18 is preferably equal to or less than 5 µm.

When the target thickness of the concentration keeping layer 18 is set to 4 µm, target breakdown voltage VB becomes 20 V. Under this condition, an error of −5% in the actual thickness of the concentration keeping layer 18 relative to the target thickness thereof brings about a 2% decrease in target breakdown voltage VB, thereby changing actual breakdown voltage VB to 19.6 V.

By contrast, an error of +5% in the actual thickness of the concentration keeping layer 18 relative to the target thickness thereof brings about a 2% increase in target breakdown voltage VB, thereby changing actual breakdown voltage VB to 20.4 V. In other words, even if an error of ±5% happens to the actual thickness of the concentration keeping layer 18 of a thickness of equal to or less than 5 µm relative to the target thickness thereof, the deviation in target breakdown voltage VB will be less than ±2%.

Therefore, regarding the diode chip 1, the first semiconductor layer 14 includes the concentration decreasing layer 17 and the concentration keeping layer 18. The pn junction is formed between the first inner N layer 36 of the first pn junction portion 35 and the concentration keeping layer 18 of the first semiconductor layer 14.

In the situation where the first semiconductor layer 14 dispenses with the concentration keeping layer 18, the pn junction is formed between the first inner N layer 36 and the concentration decreasing layer 17. Under this condition, the variation of the pn concentration in the first pn junction portion 35 becomes abrupt, and thus actual withstand voltage (i.e., breakdown voltage VB) is likely to vary from target withstand voltage, starting from the first pn junction portion 35. The foregoing issue becomes noteworthy as a result of the deviation (for example, around ±5%) of thickness of the concentration decreasing layer 17.

Therefore, regarding the diode chip 1, the concentration keeping layer 18 is formed on the concentration decreasing layer 17 to slow down the variation of the pn concentration in the first pn junction portion 35 (see FIG. 8). Therefore, variation of withstand voltage (i.e., breakdown voltage VB) from the first pn junction portion 35 as the origin is suppressed.

Furthermore, although withstand voltage varies because of the deviation of thickness of the concentration decreasing layer 17, the variation of withstand voltage is suppressed by the concentration keeping layer 18 of a specified thickness appropriately. Furthermore, even if the deviation of thickness of the concentration keeping layer 18 happens, the slow variation of the pn concentration will be conducive to the appropriate suppression of the withstand voltage variation otherwise caused by the deviation of thickness of the concentration keeping layer 18. Furthermore, even if the deviation of thickness of the concentration keeping layer 18 happens, the slow variation of the pn concentration will be conducive to the appropriate suppression of the withstand voltage variation otherwise caused by the deviation of thickness of the concentration keeping layer 18.

Furthermore, regarding the diode chip 1, the first semiconductor layer 14 includes the concentration decreasing layer 17 and the concentration keeping layer 18. The pn junction is formed between the second inner N layer 56 of the second pn junction portion 55 and the concentration keeping layer 18.

In the situation where the first semiconductor layer 14 dispenses with the concentration keeping layer 18, the pn junction is formed between the second inner N layer 56 and the concentration decreasing layer 17. Under this condition, the variation of the pn concentration in the second pn junction portion 55 becomes abrupt, and thus actual withstand voltage (i.e., breakdown voltage VB) is likely to vary from target withstand voltage, starting from the second pn junction portion 55. The foregoing issue becomes noteworthy as a result of the deviation (for example, around ±5%) of thickness of the concentration decreasing layer 17.

Therefore, regarding the diode chip 1, the concentration keeping layer 18 is formed on the concentration decreasing layer 17 to slow down the variation of the pn concentration in the second pn junction portion 55. Therefore, variation of withstand voltage (i.e., breakdown voltage VB) from the second pn junction portion 55 as the origin is suppressed.

Although withstand voltage varies because of the deviation of thickness of the concentration decreasing layer 17, the variation of withstand voltage is suppressed by the concentration keeping layer 18 of a specified thickness appropriately. Furthermore, even if the deviation of thickness of the concentration keeping layer 18 happens, the slow variation of the pn concentration will be conducive to the appropriate suppression of the withstand voltage variation otherwise caused by the deviation of thickness of the concentration keeping layer 18.

Figure 15B:
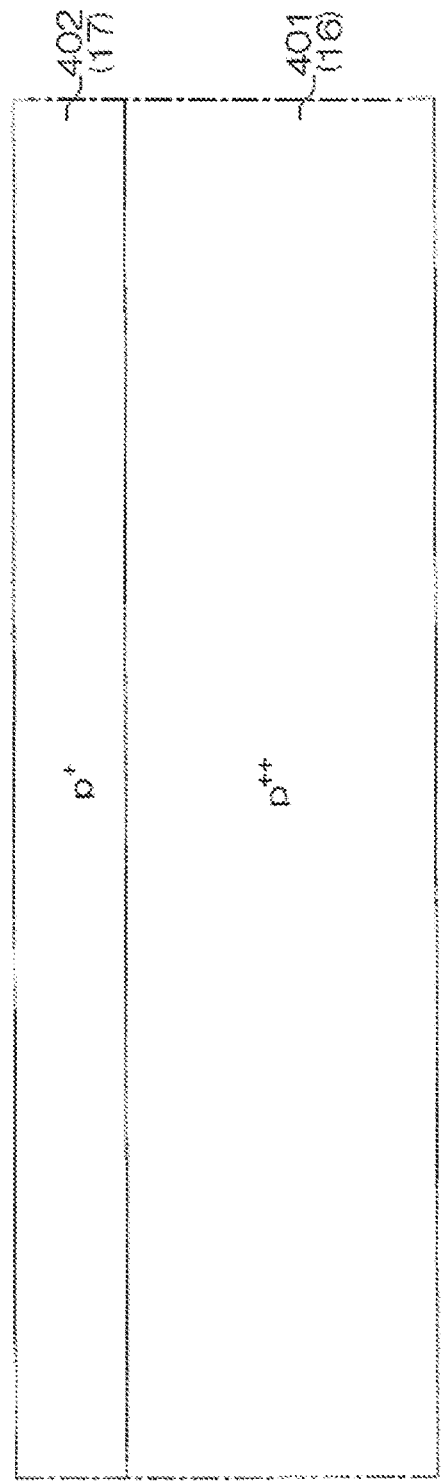
FIG. 15B is a cross-sectional view of the next step of FIG. 15A.
Figure 15C:
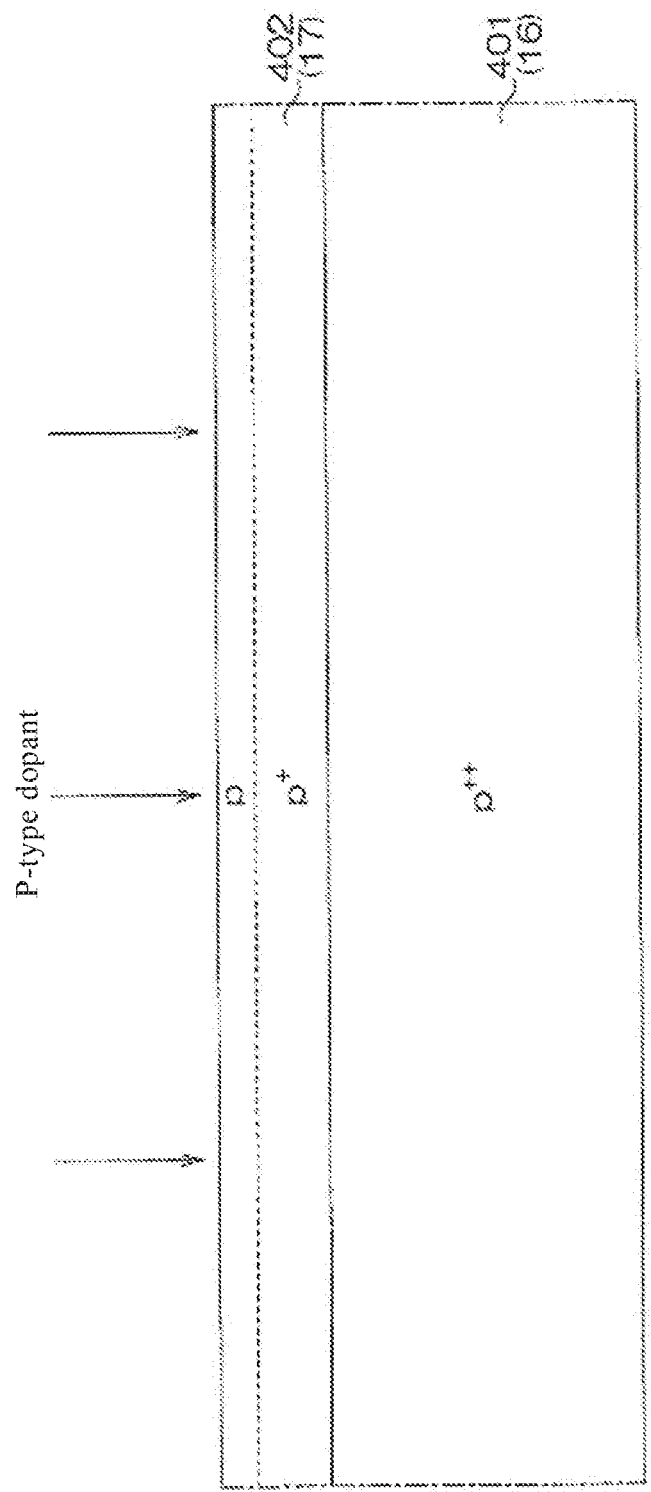
FIG. 15C is a cross-sectional view of the next step of FIG. 15B.
Figure 15D:
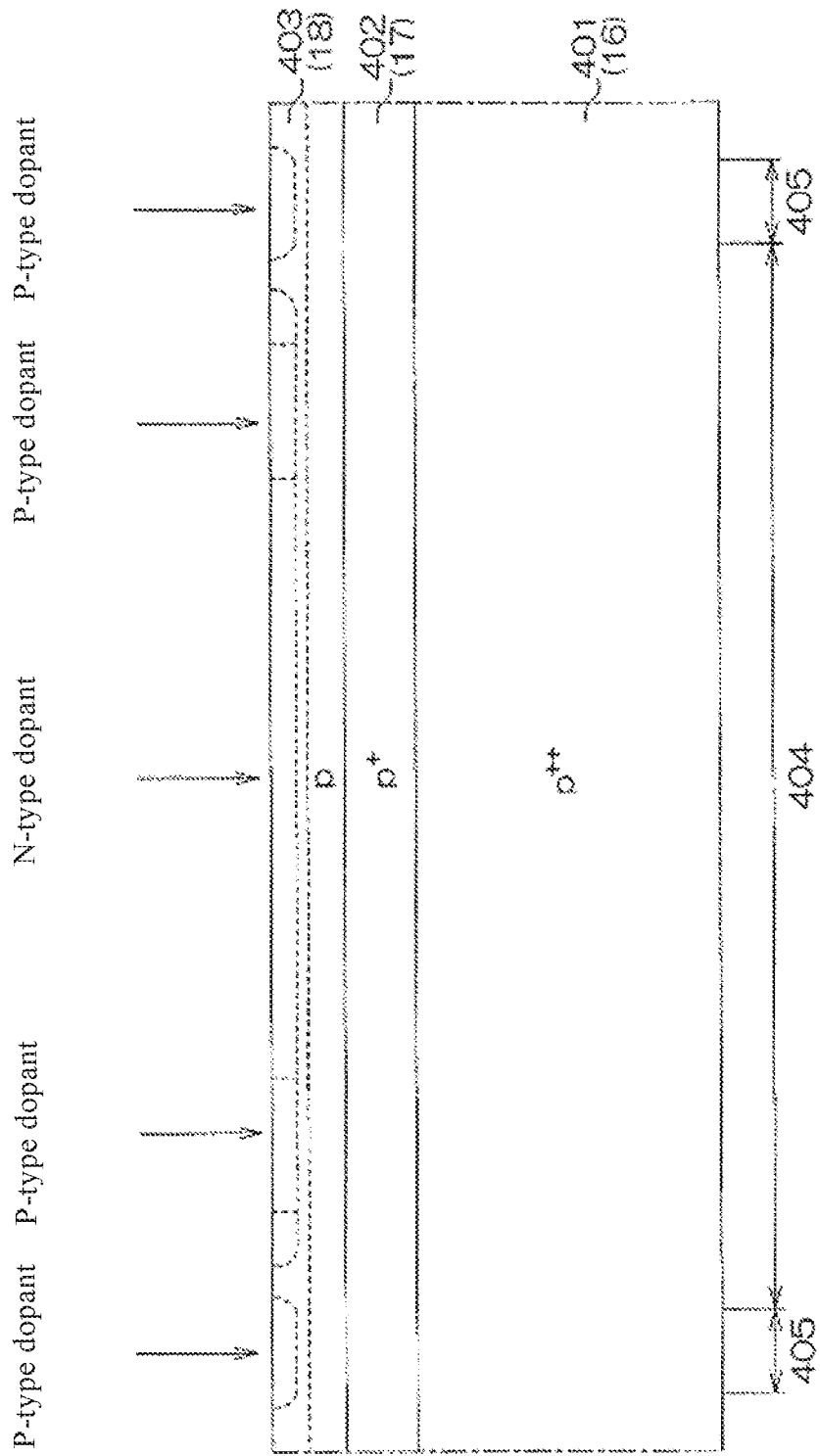
FIG. 15D is a cross-sectional view of the next step of FIG. 15C.
Figure 15E:
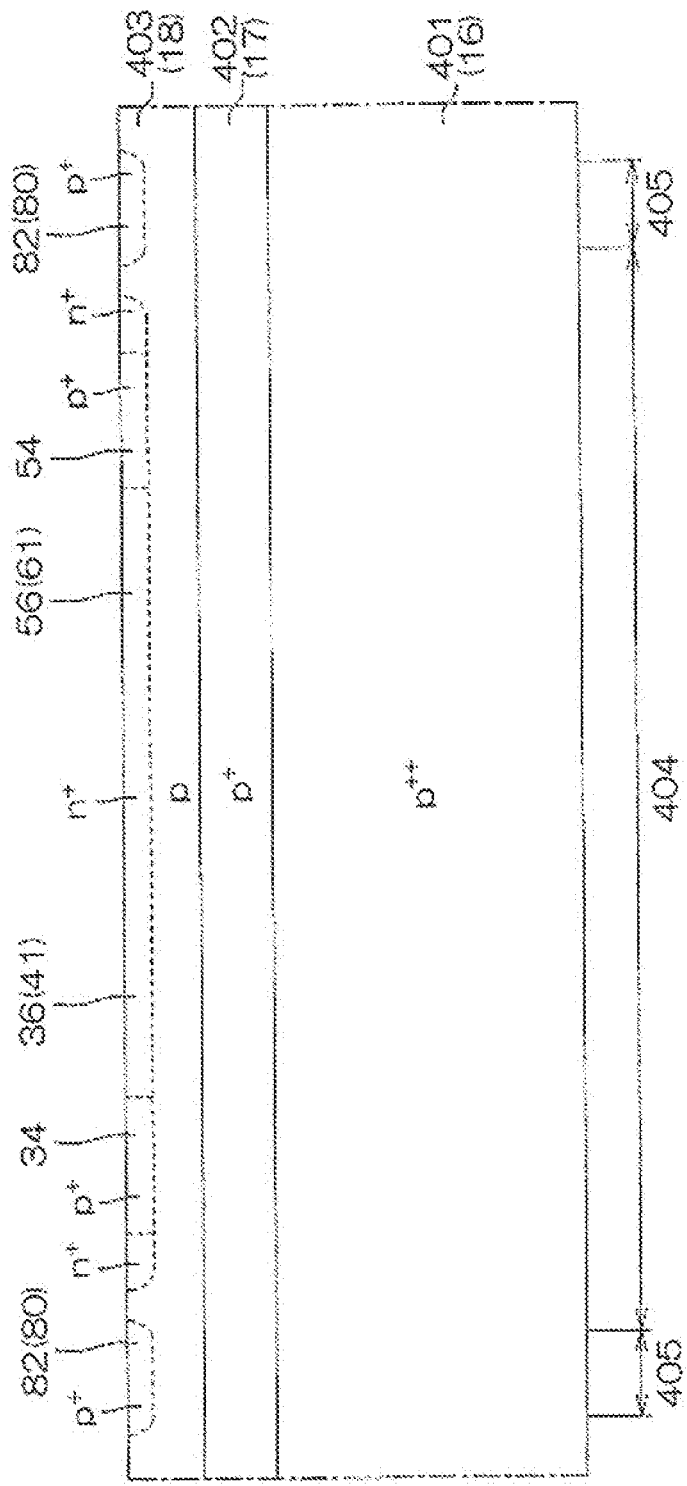
FIG. 15E is a cross-sectional view of the next step of FIG. 15D.
Figure 15F:
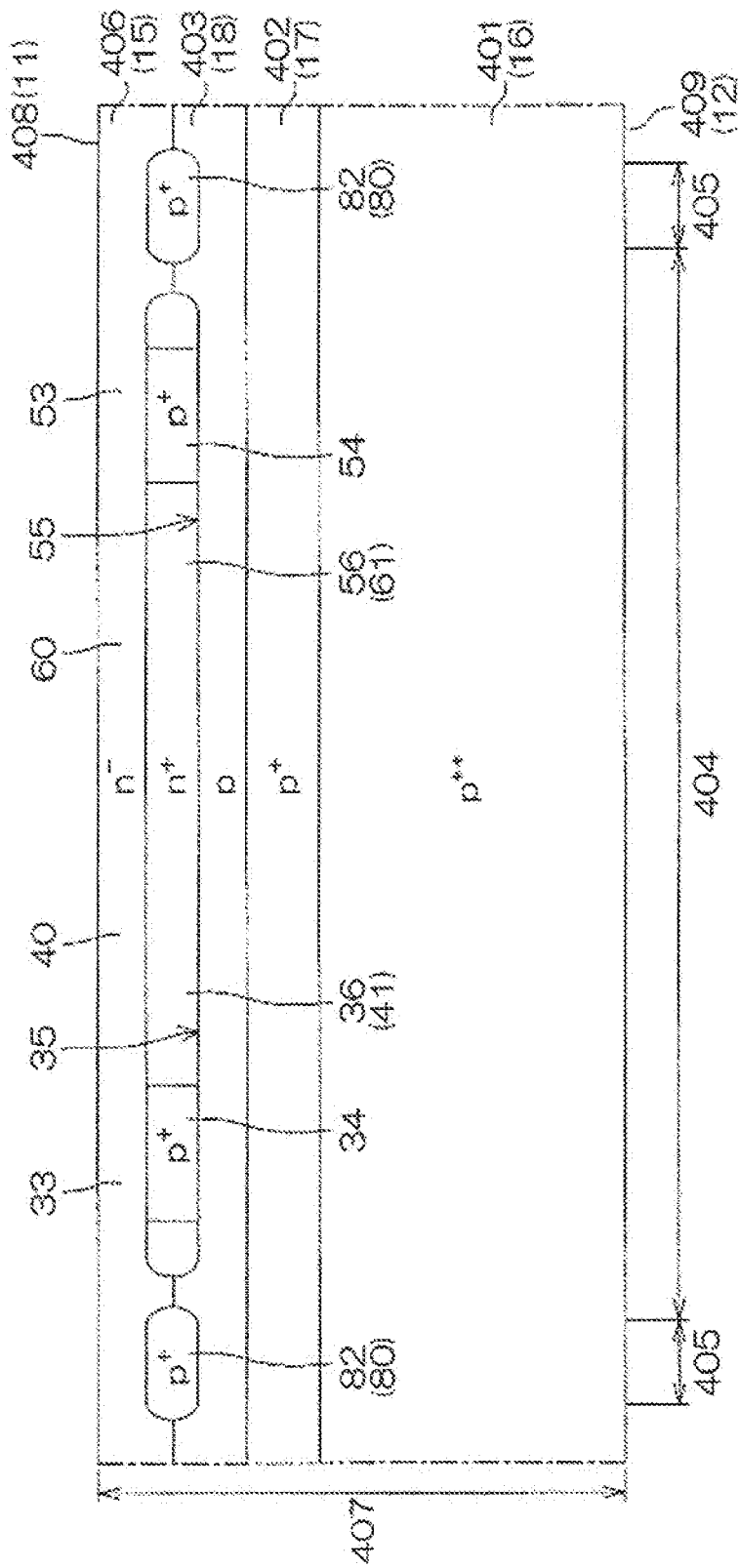
FIG. 15F is a cross-sectional view of the next step of FIG. 15E.
Figure 15G:
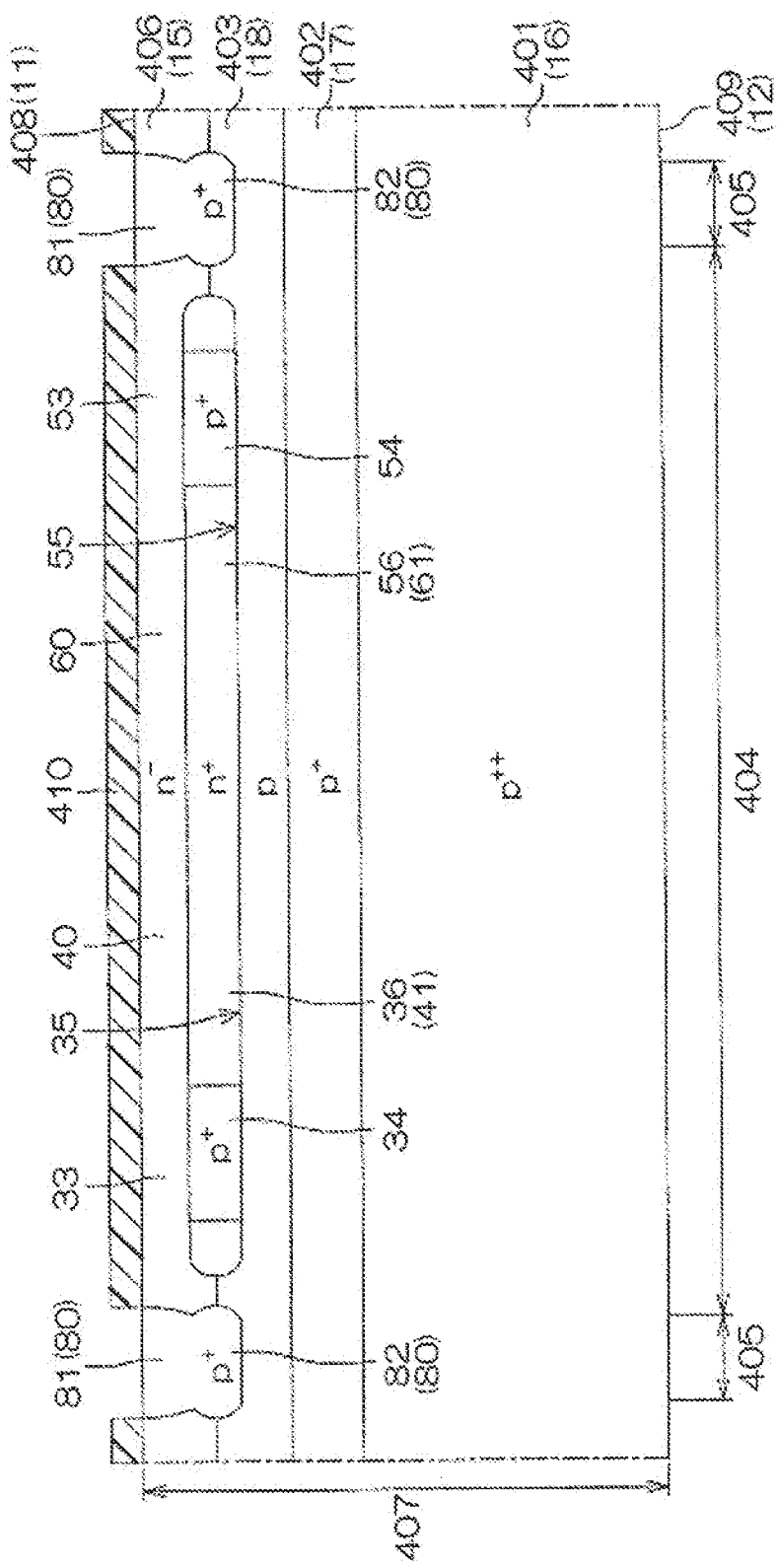
FIG. 15G is a cross-sectional view of the next step of FIG. 15F.
Figure 15H:
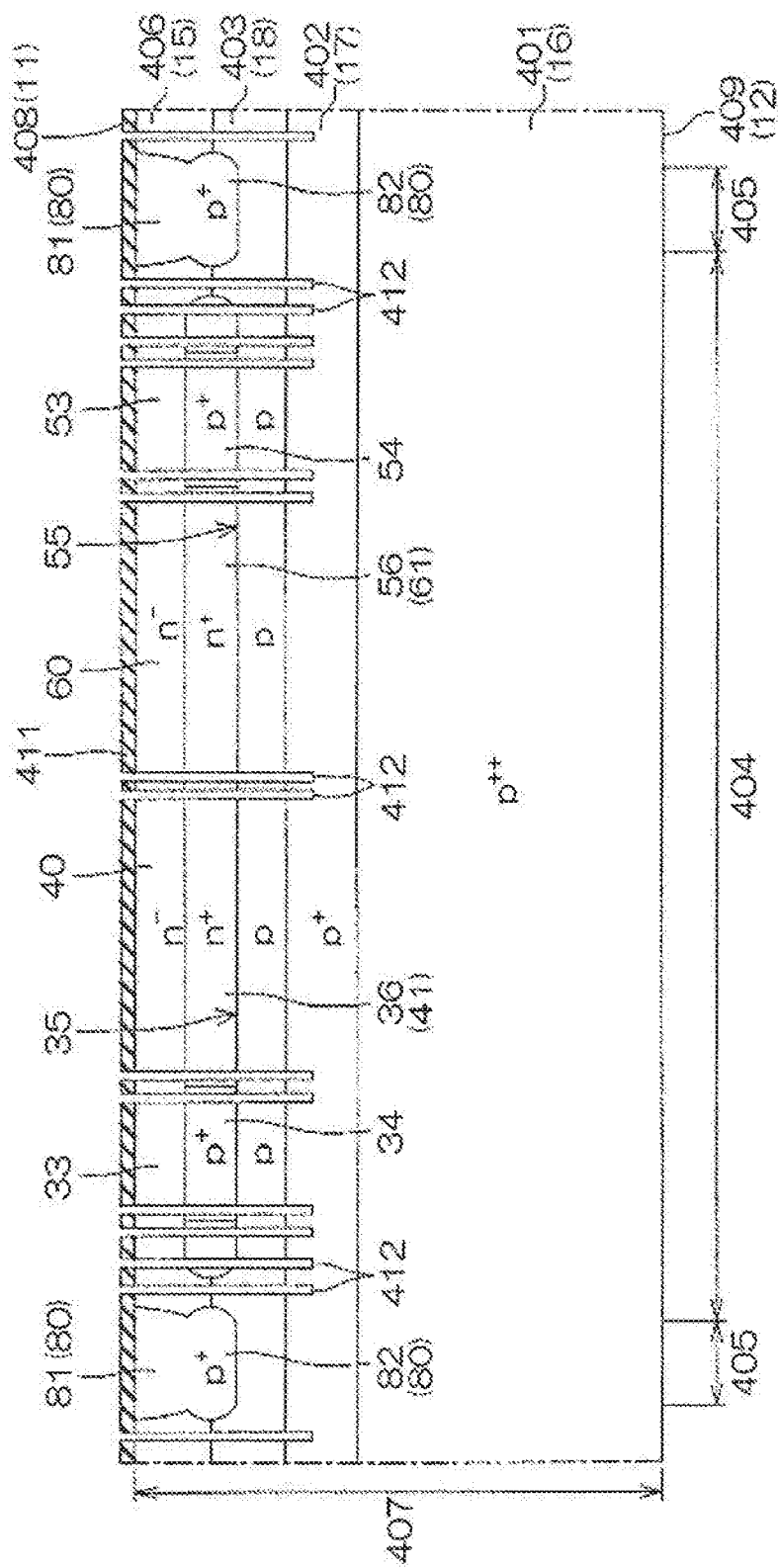
FIG. 15H is a cross-sectional view of the next step of FIG. 15G.
Figure 15I:
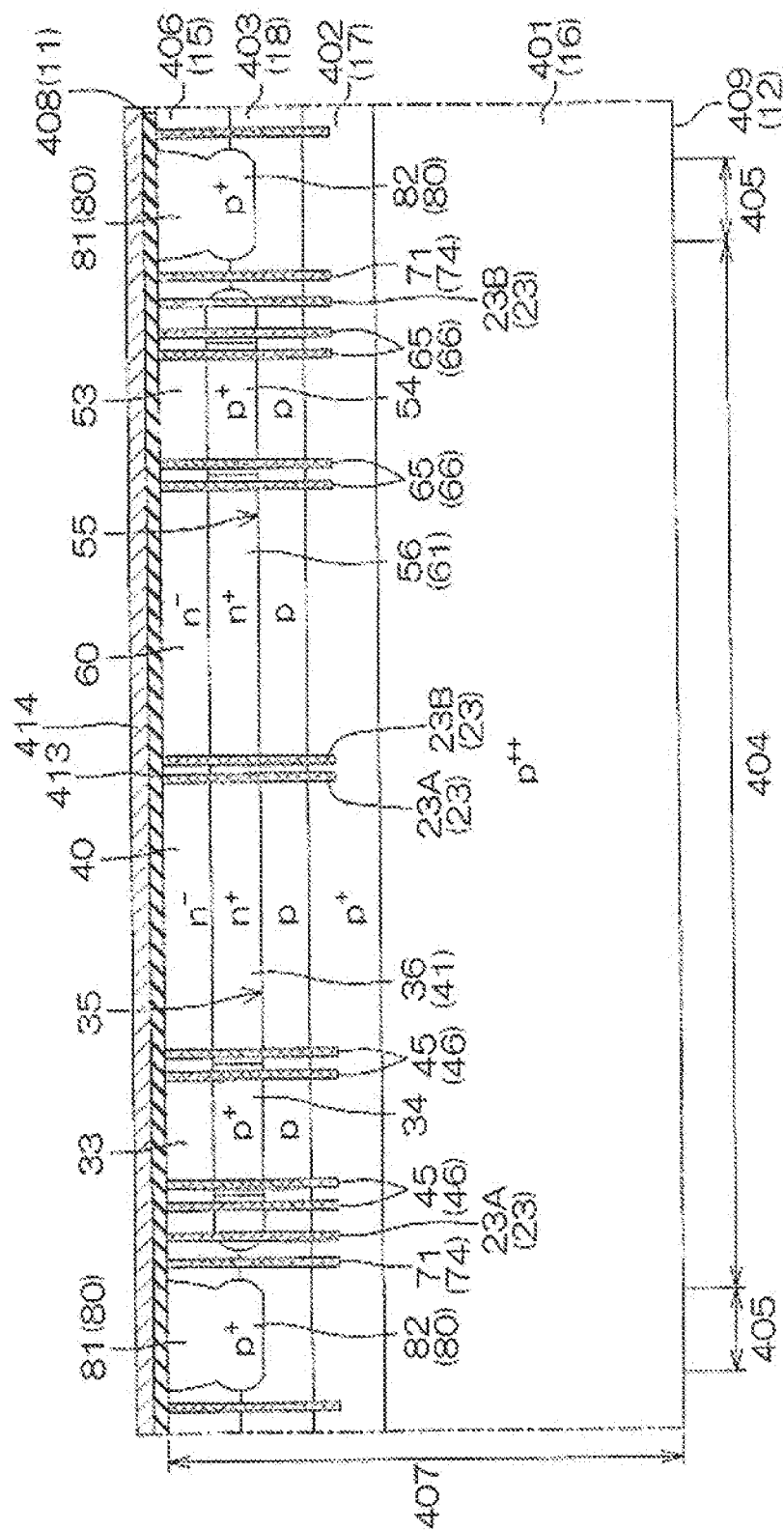
FIG. 15I is a cross-sectional view of the next step of FIG. 15H.
Figure 15J:
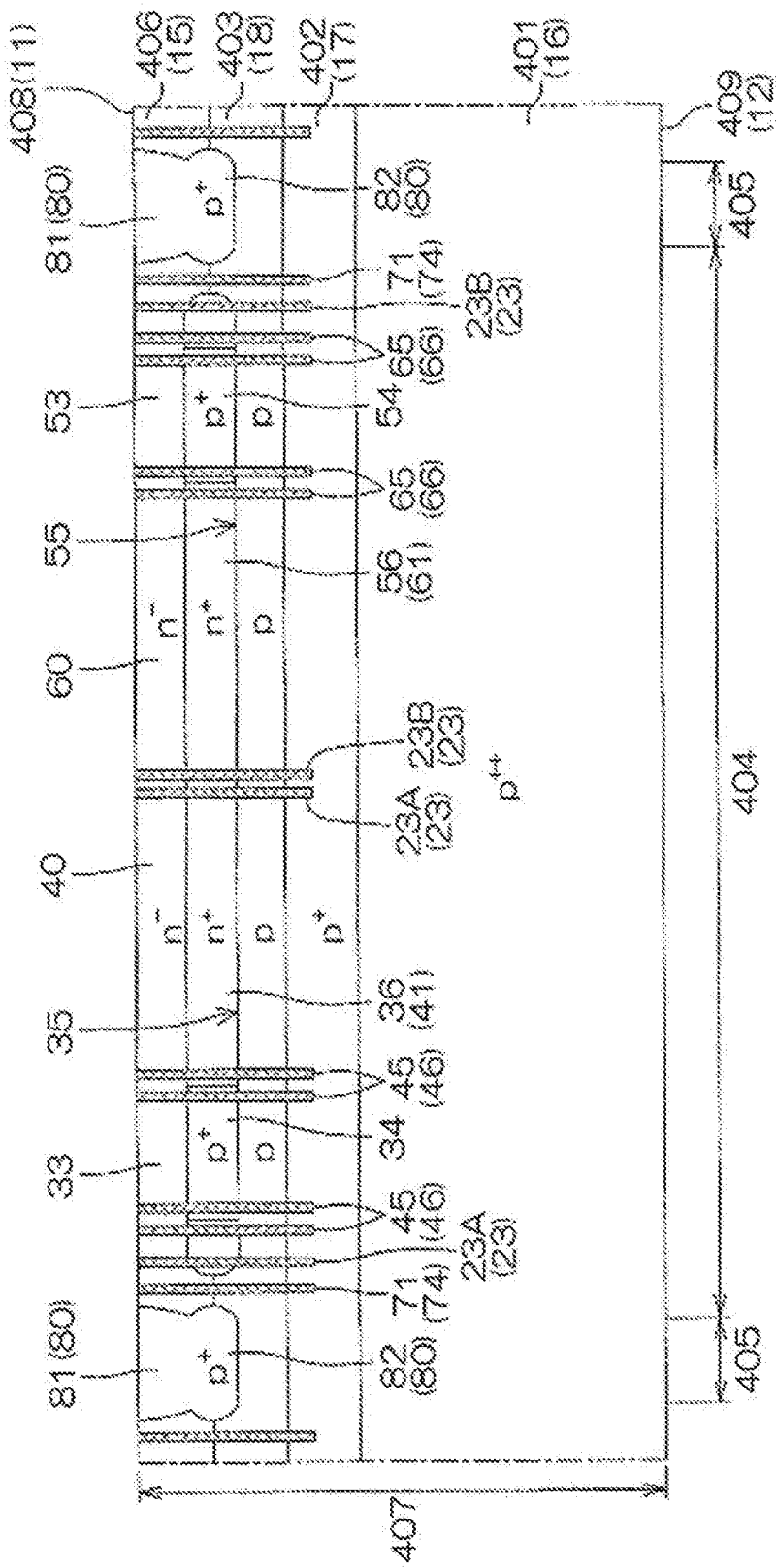
FIG. 15J is a cross-sectional view of the next step of FIG. 15I.
Figure 15K:
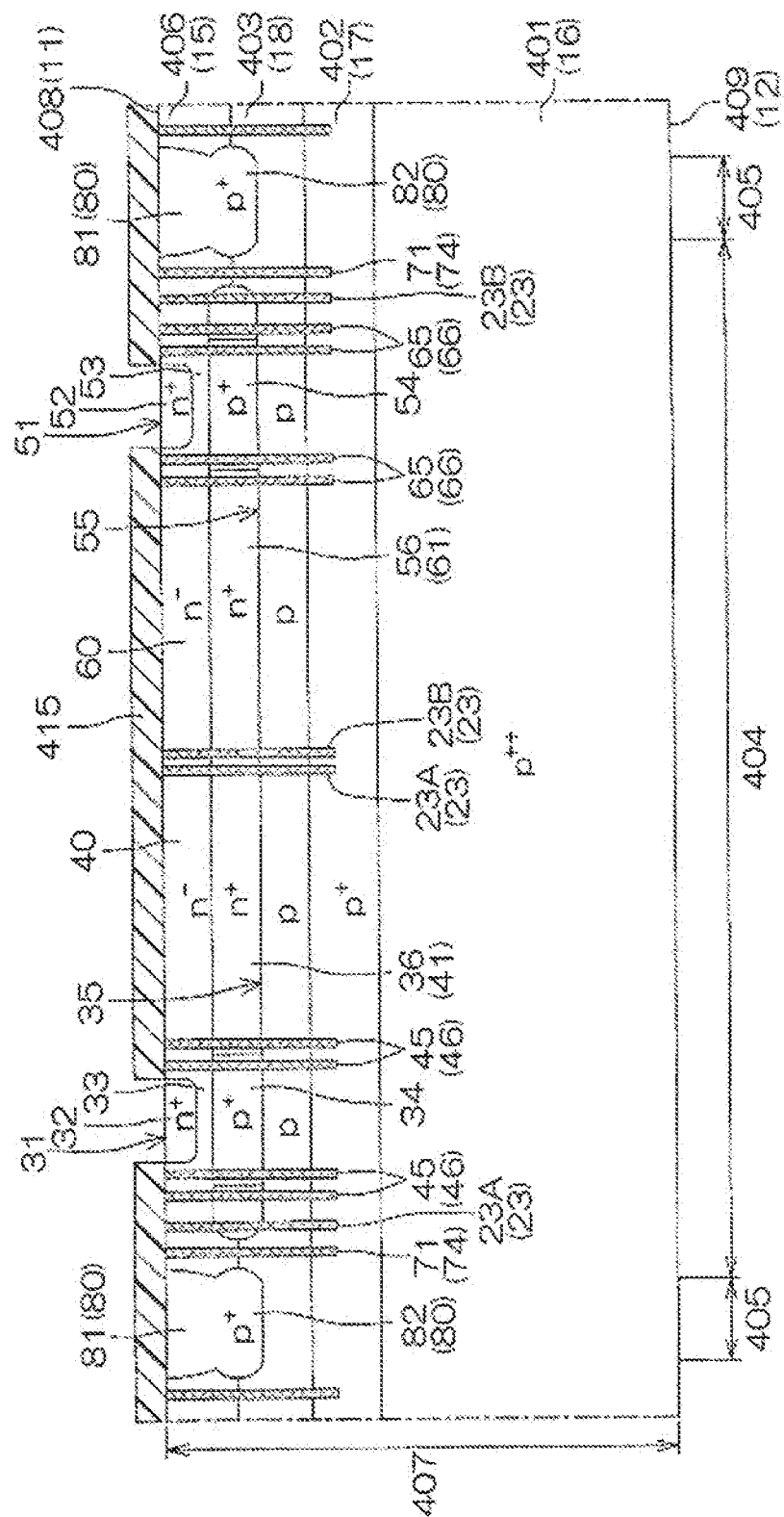
FIG. 15K is a cross-sectional view of the next step of FIG. 15J.
Figure 15L:
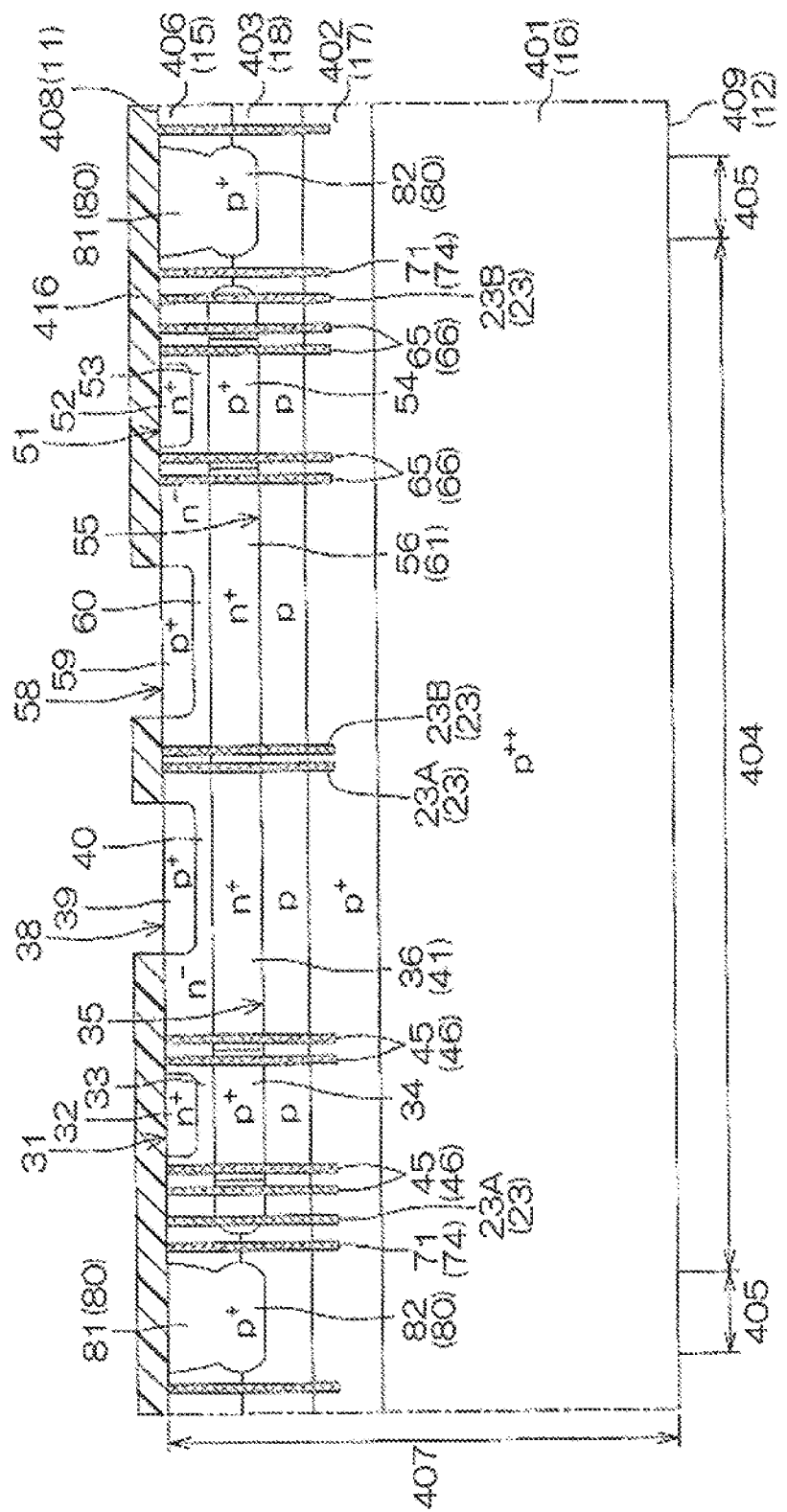
FIG. 15L is a cross-sectional view of the next step of FIG. 15K.
Figure 15M:
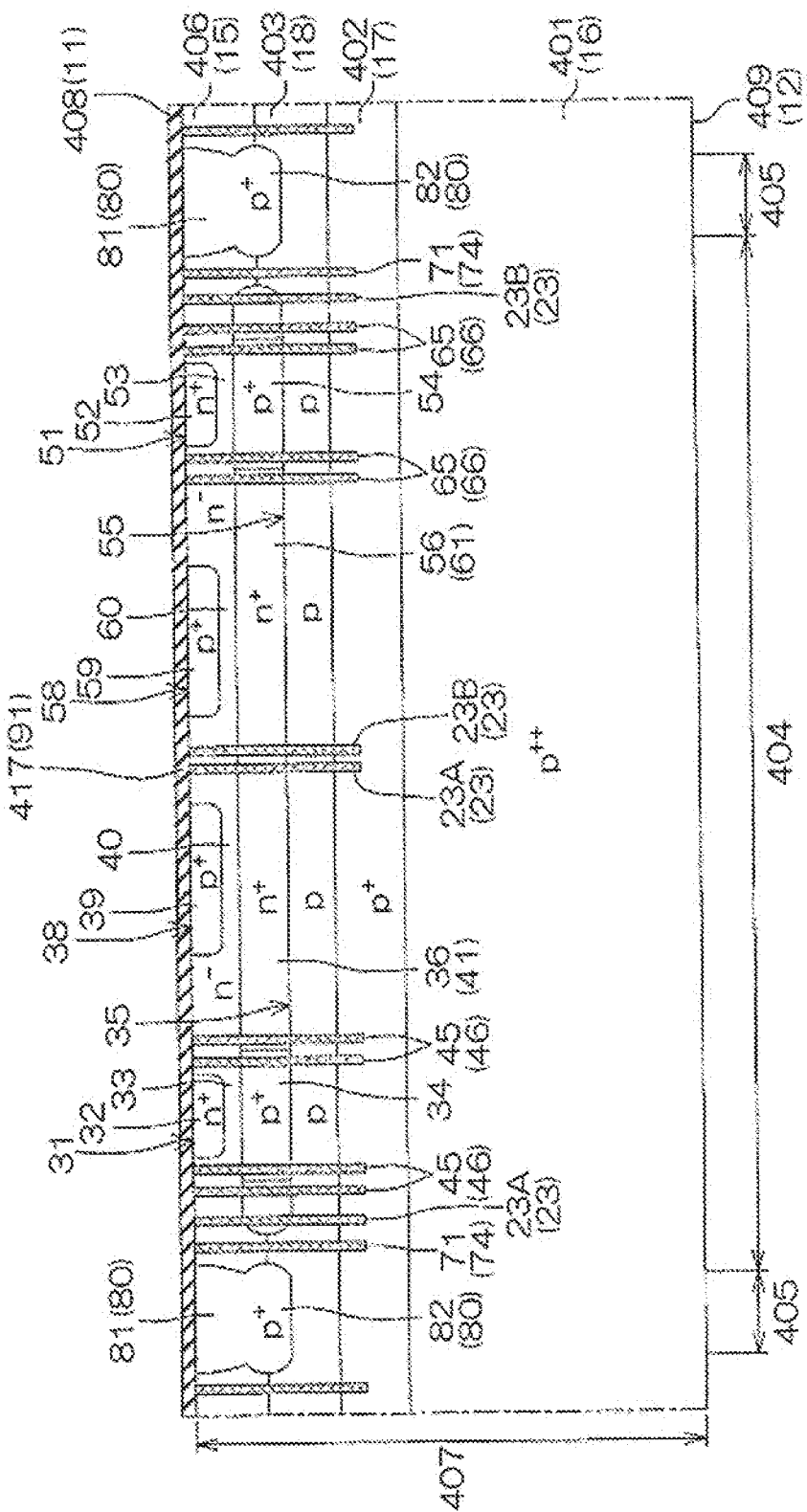
FIG. 15M is a cross-sectional view of the next step of FIG. 15L.
Figure 15N:
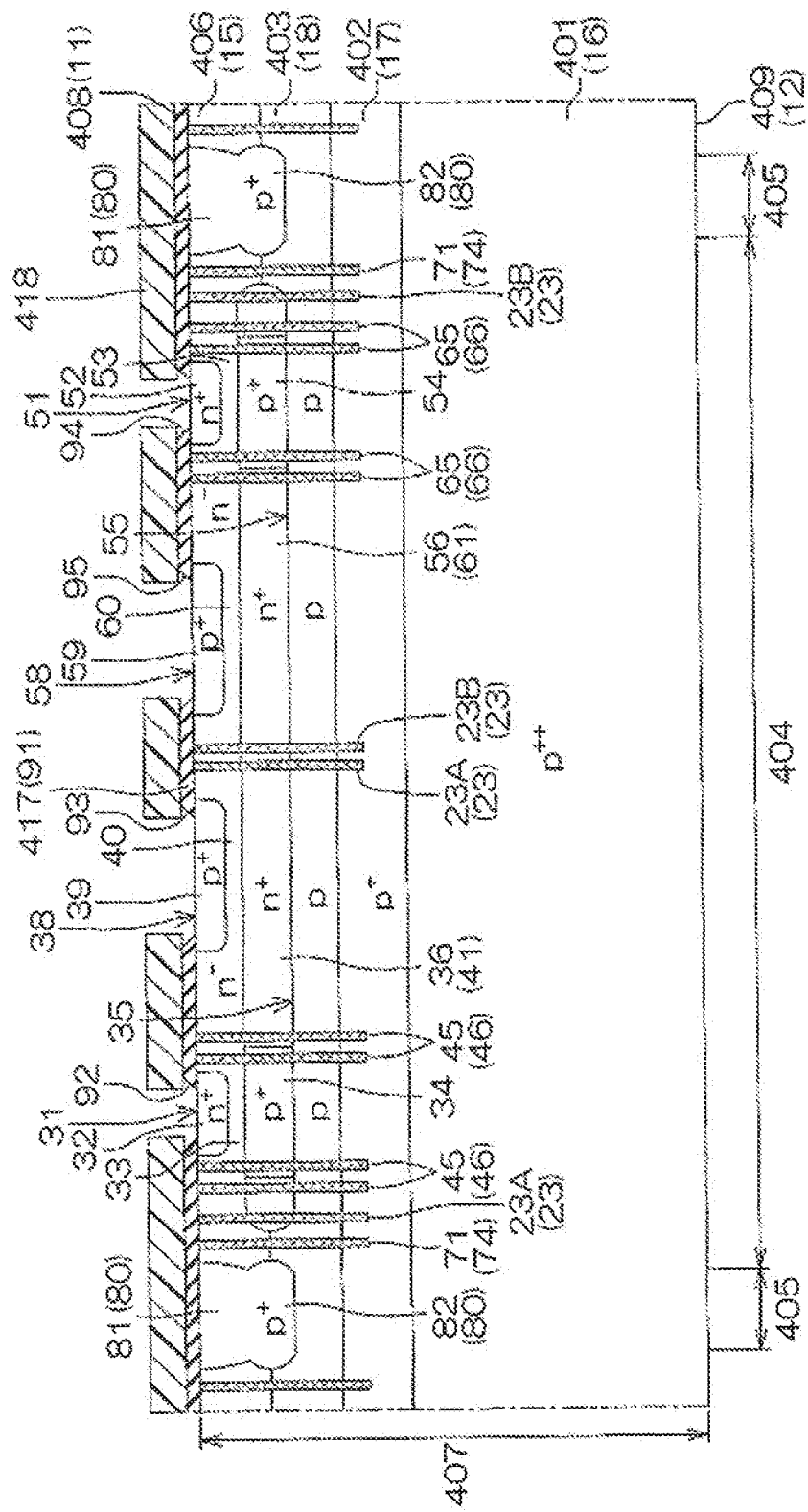
FIG. 15N is a cross-sectional view of the next step of FIG. 15M.
Figure 15O:
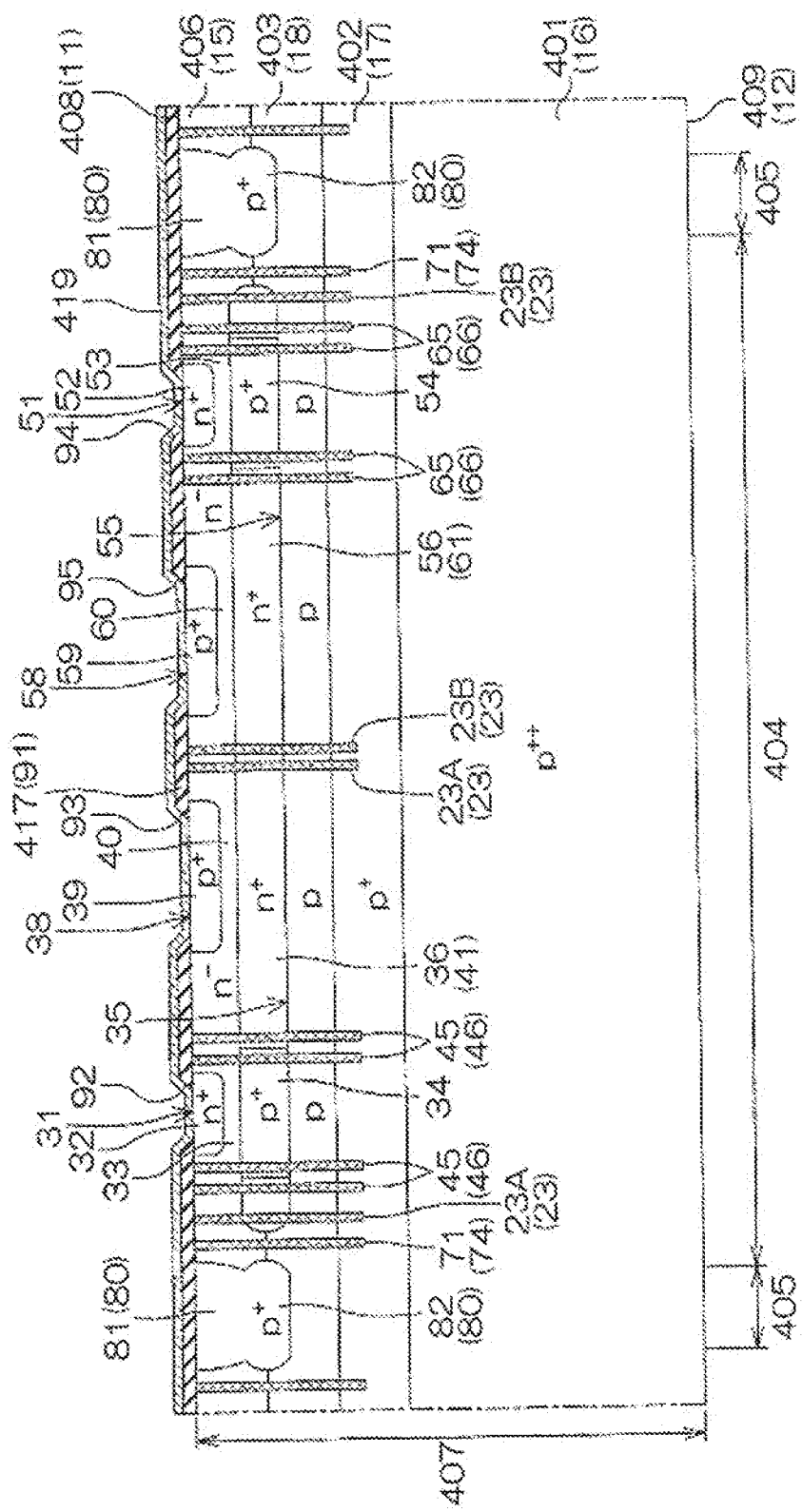
FIG. 15O is a cross-sectional view of the next step of FIG. 15N.
Figure 15P:
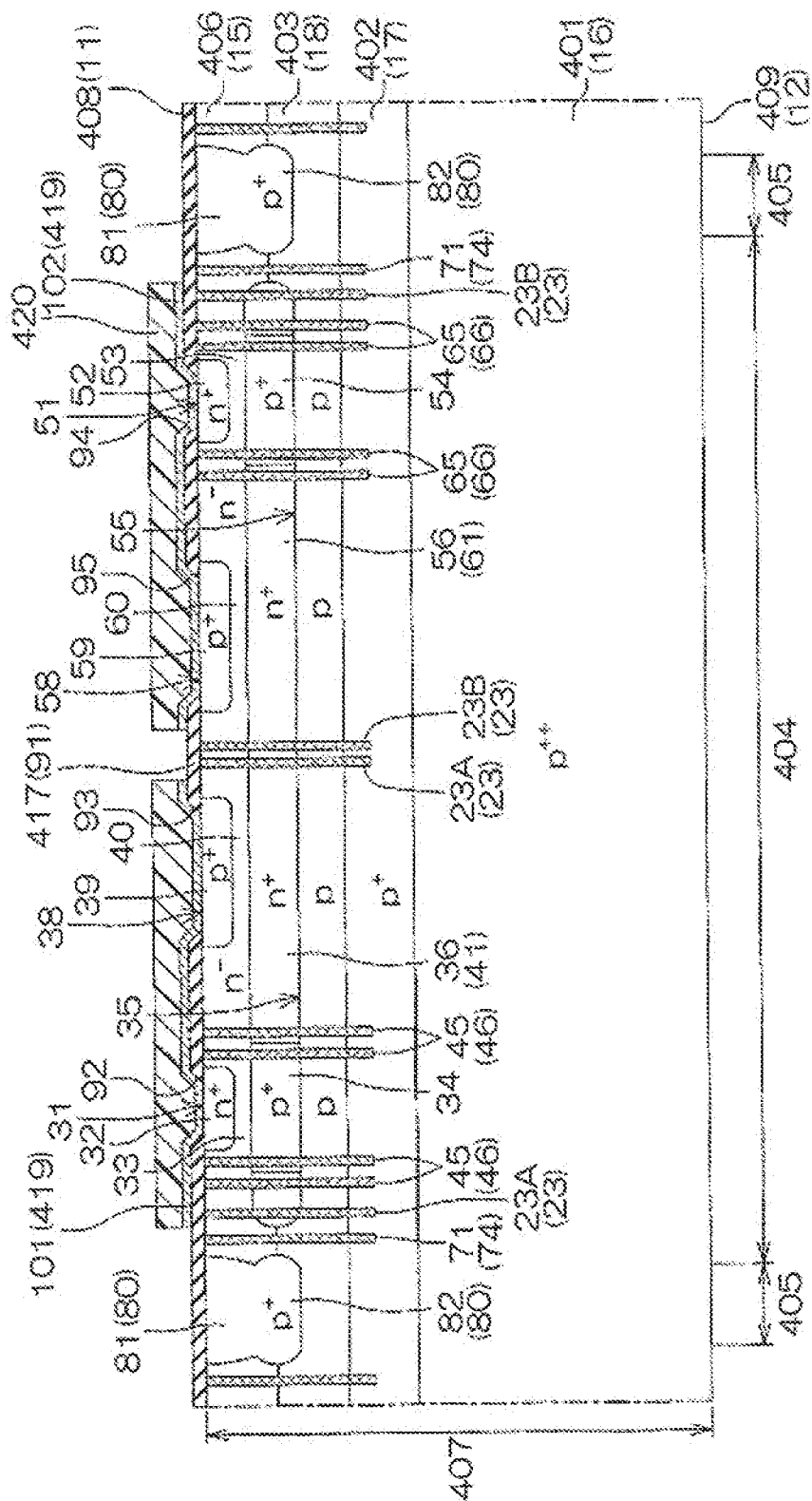
FIG. 15P is a cross-sectional view of the next step of FIG. 15O.
Figure 15Q:
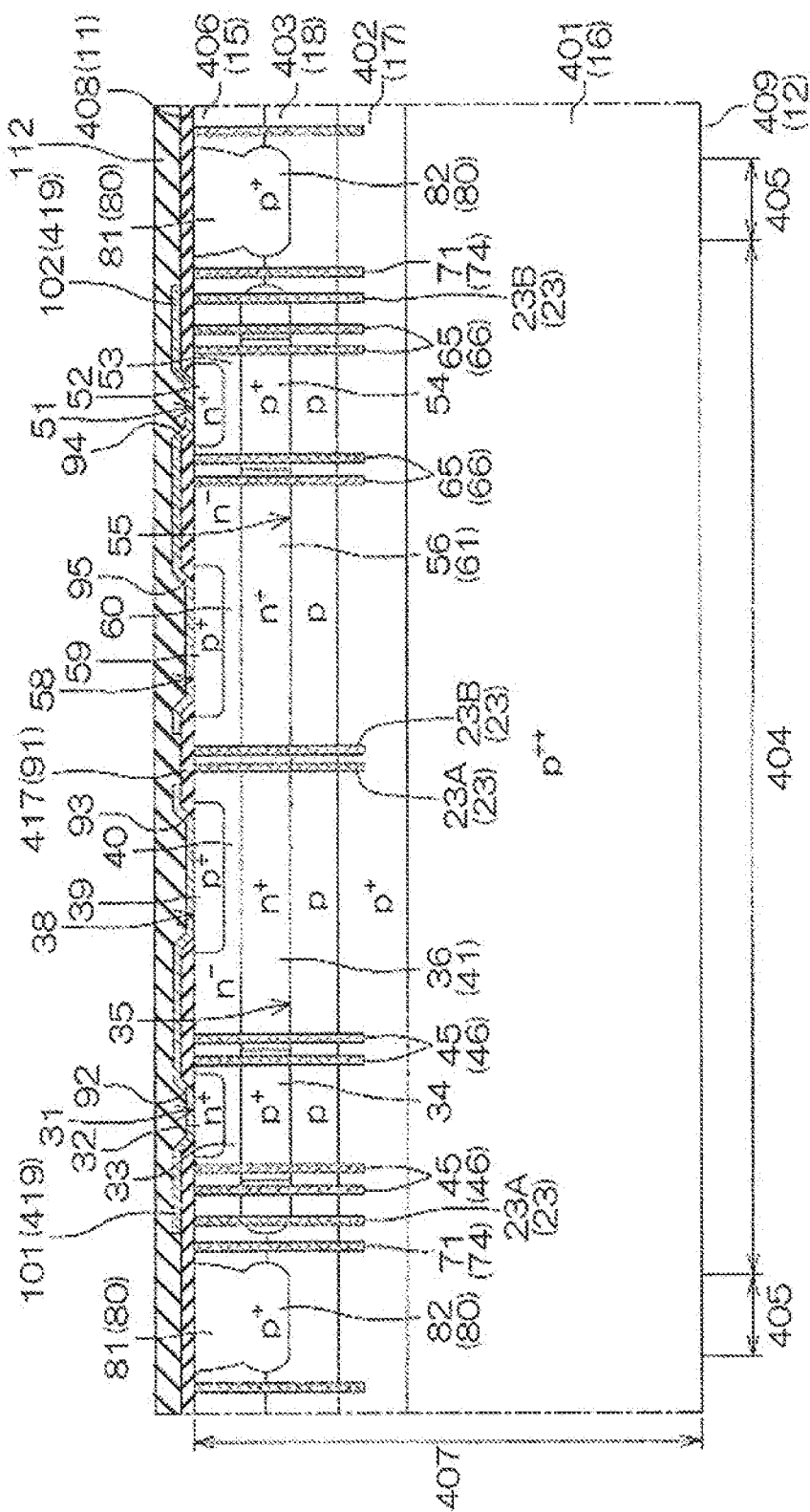
FIG. 15Q is a cross-sectional view of the next step of FIG. 15P.
Figure 15R:
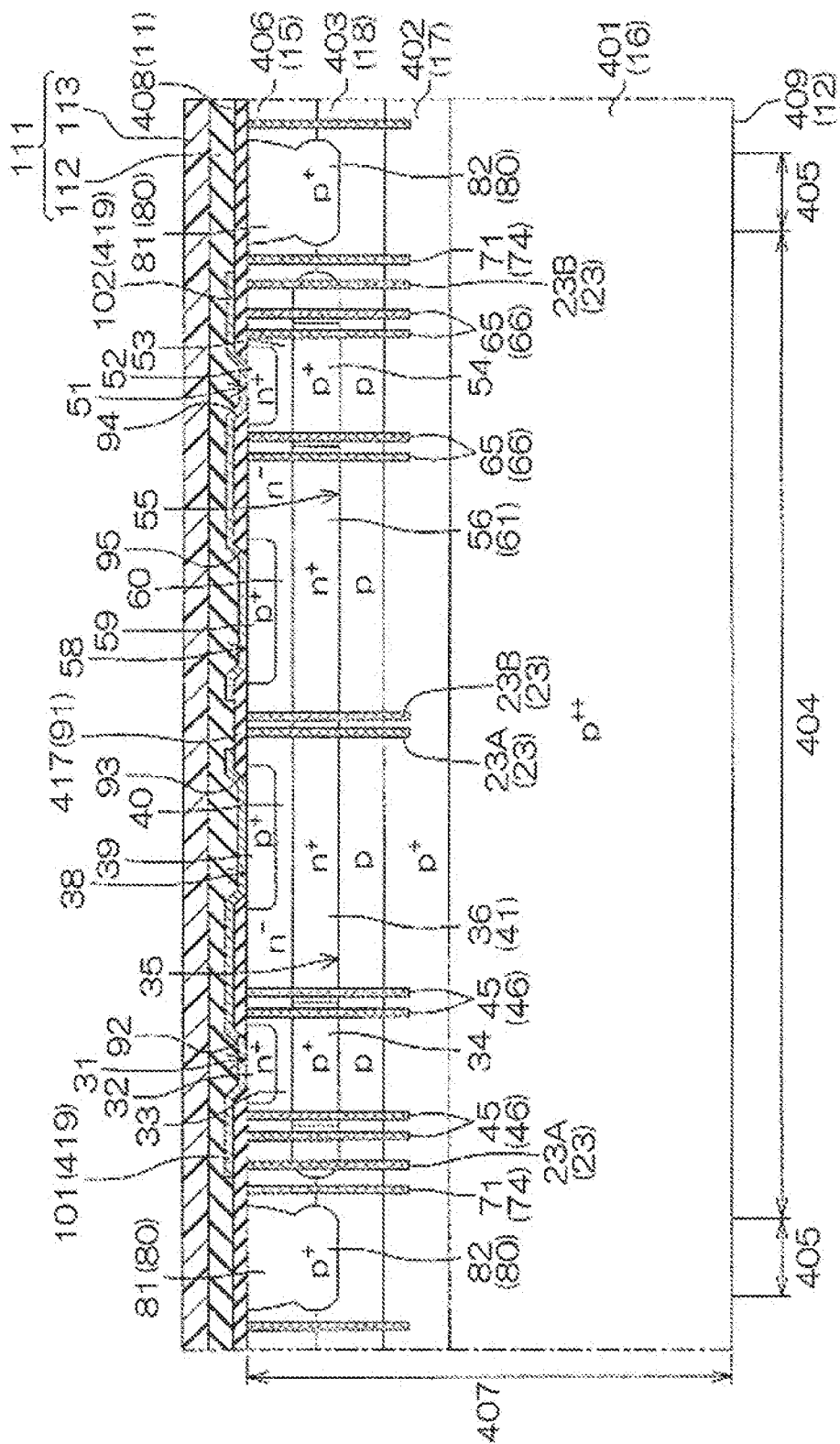
FIG. 15R is a cross-sectional view of the next step of FIG. 15Q.
Figure 15S:
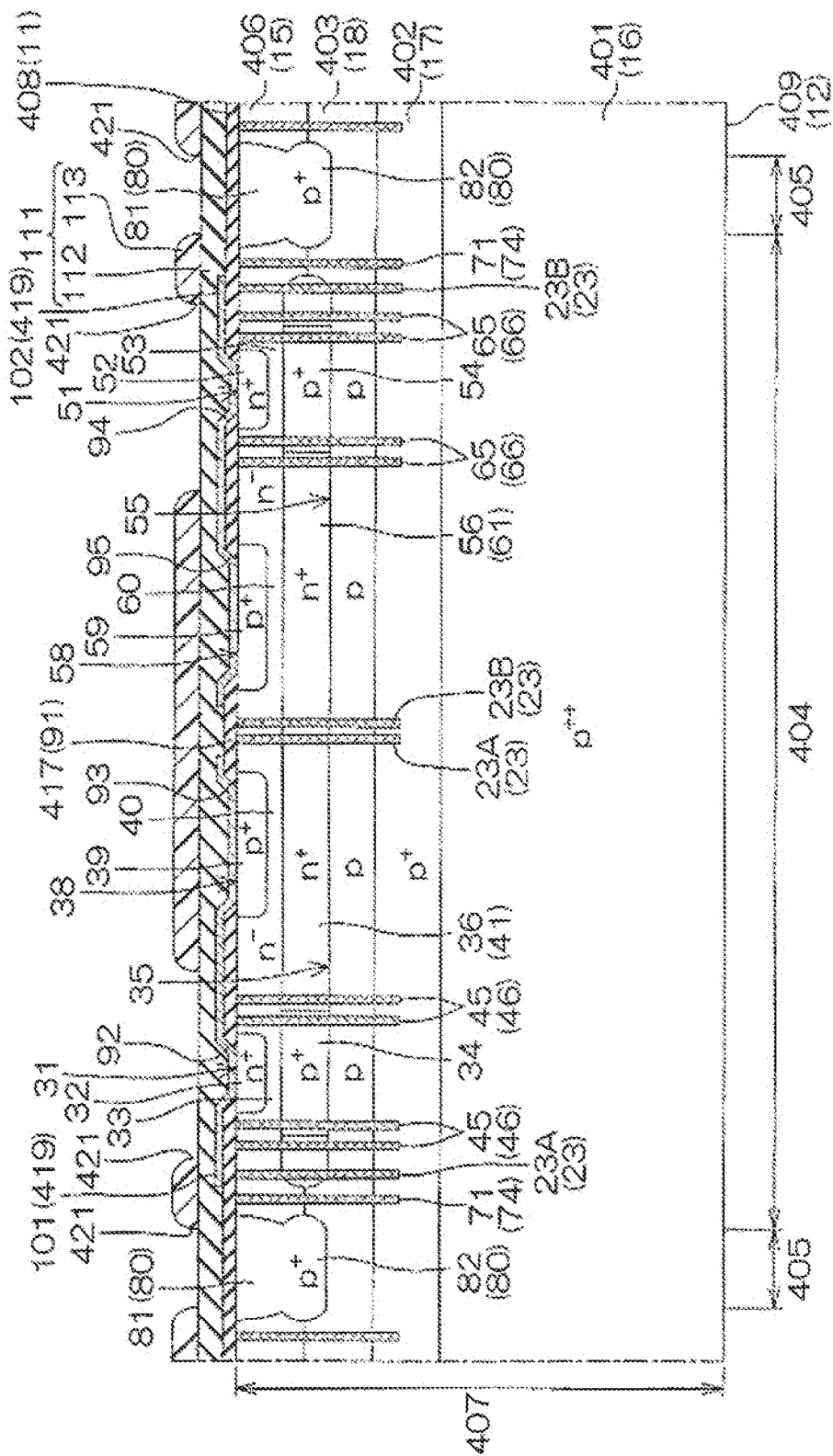
FIG. 15S is a cross-sectional view of the next step of FIG. 15R.
Figure 15T:
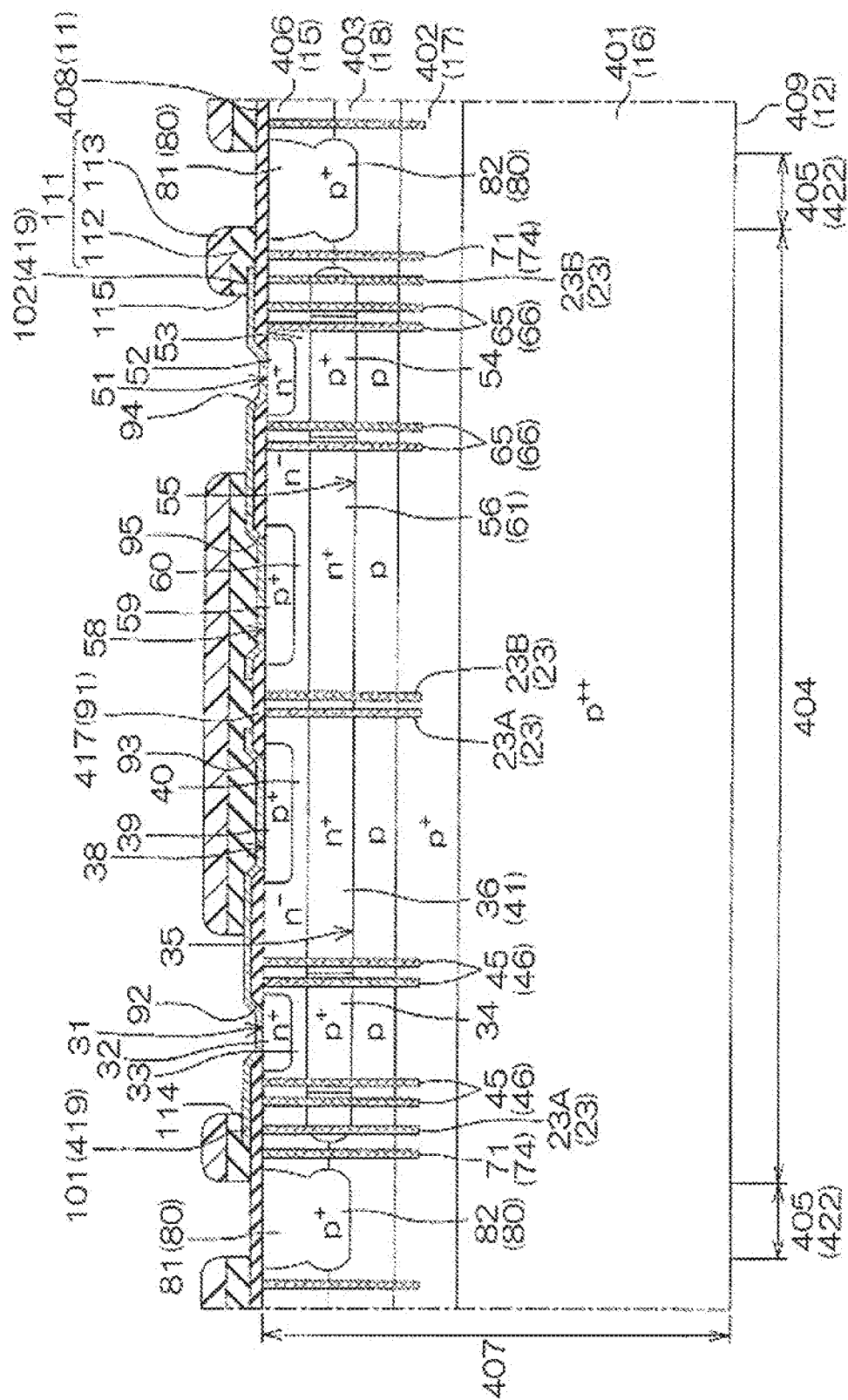
FIG. 15T is a cross-sectional view of the next step of FIG. 15S.
Figure 15U:
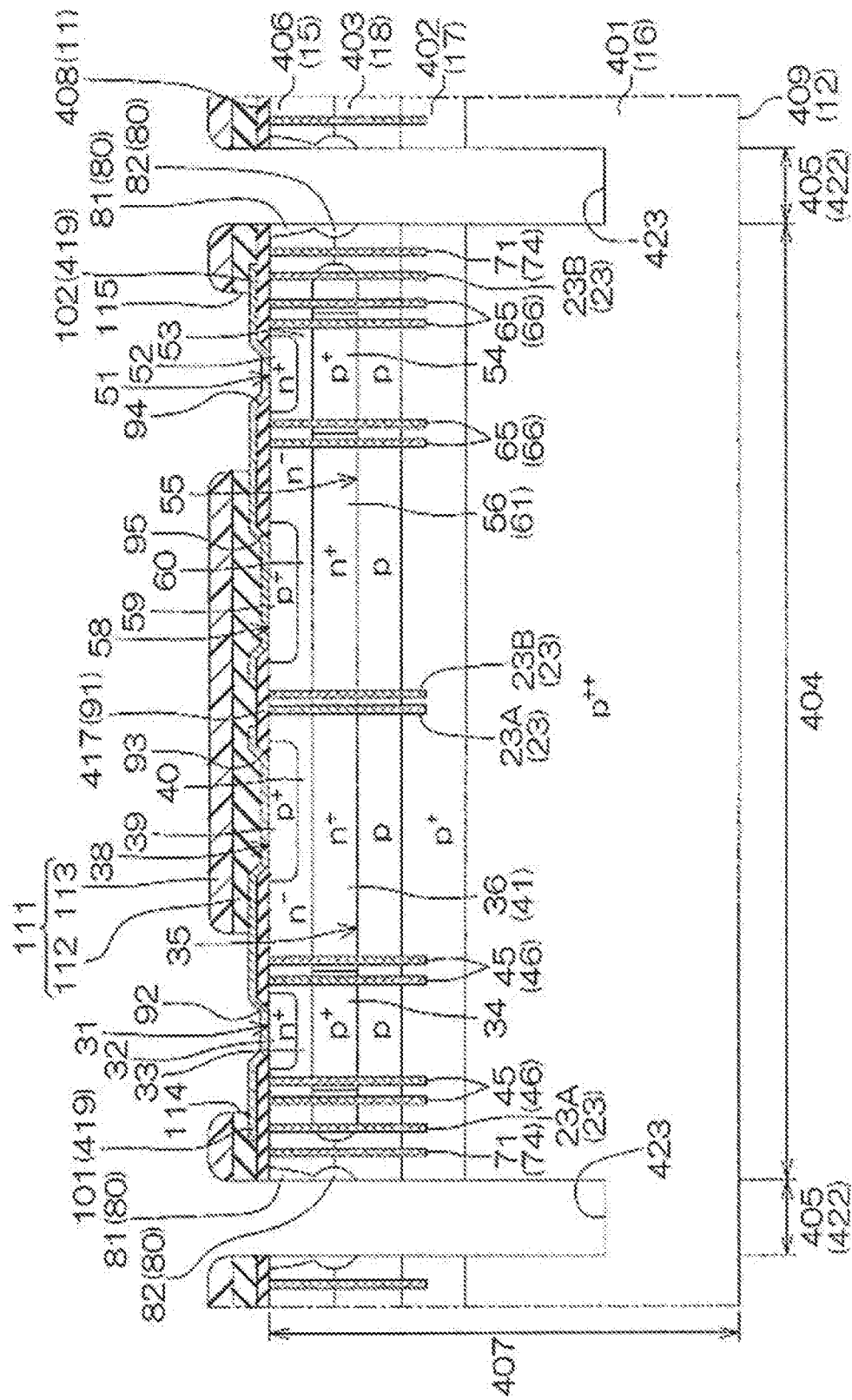
FIG. 15U is a cross-sectional view of the next step of FIG. 15T.
Figure 15V:
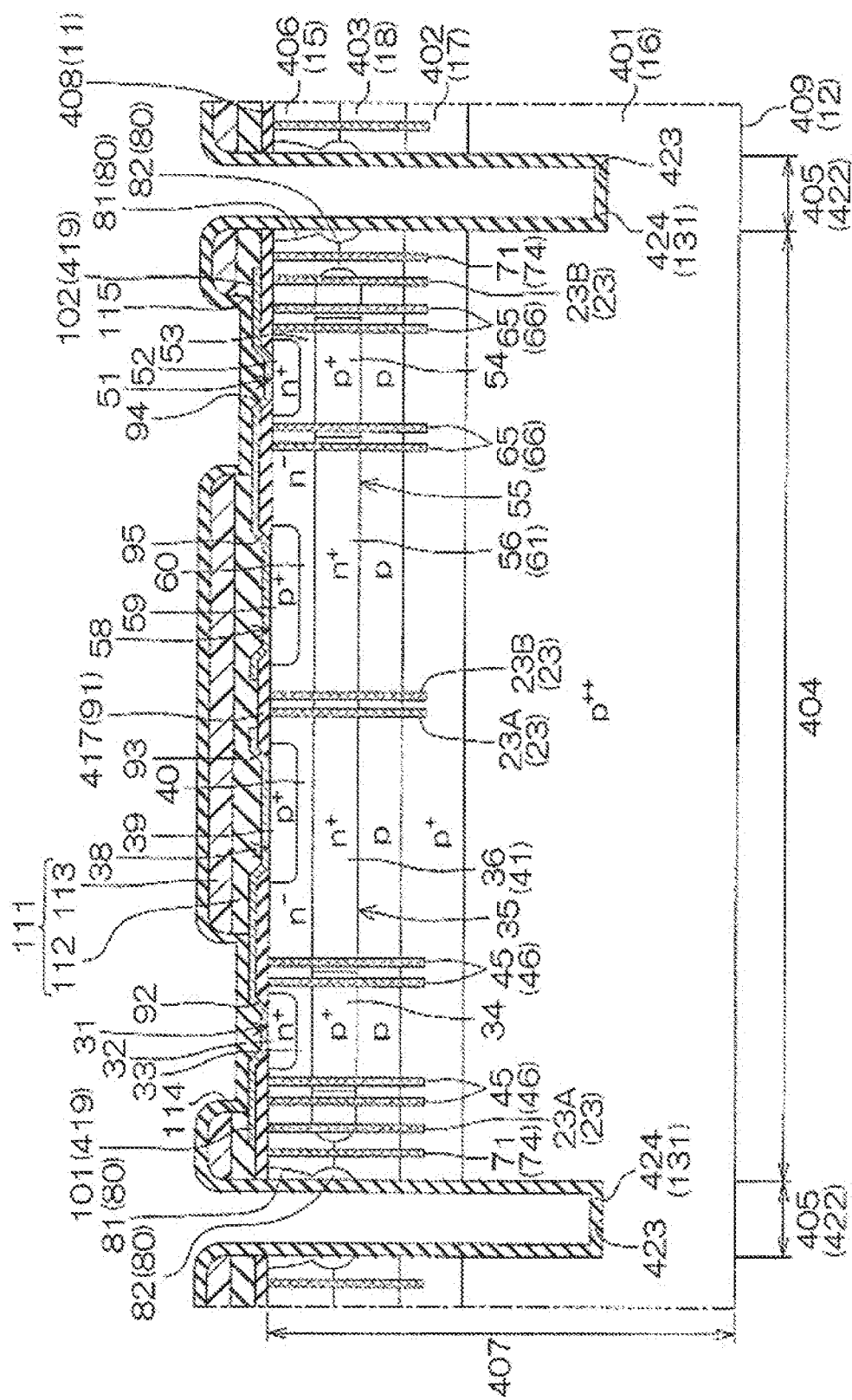
FIG. 15V is a cross-sectional view of the next step of FIG. 15U.
Figure 15W:
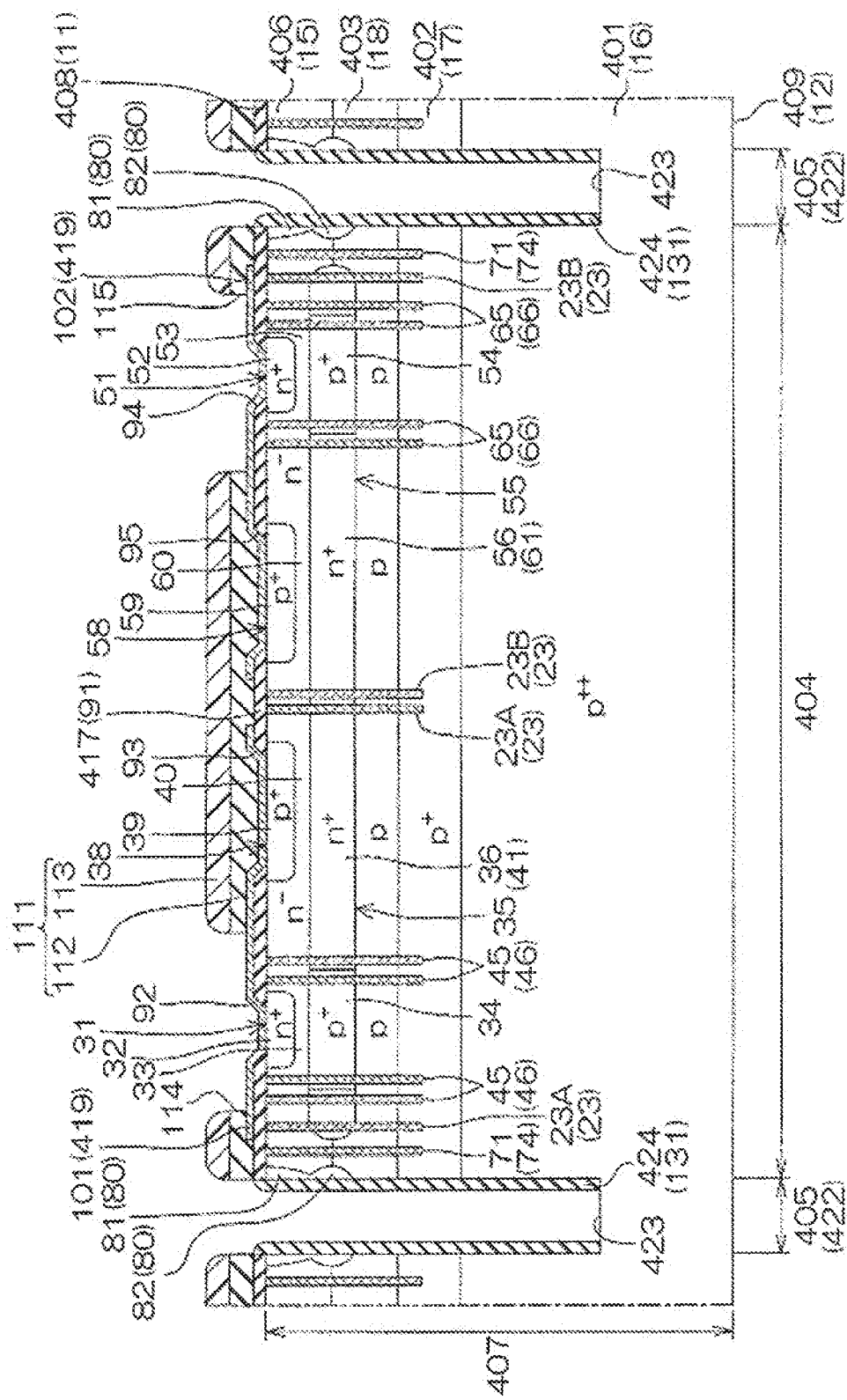
FIG. 15W is a cross-sectional view of the next step of FIG. 15V.
Figure 15X:
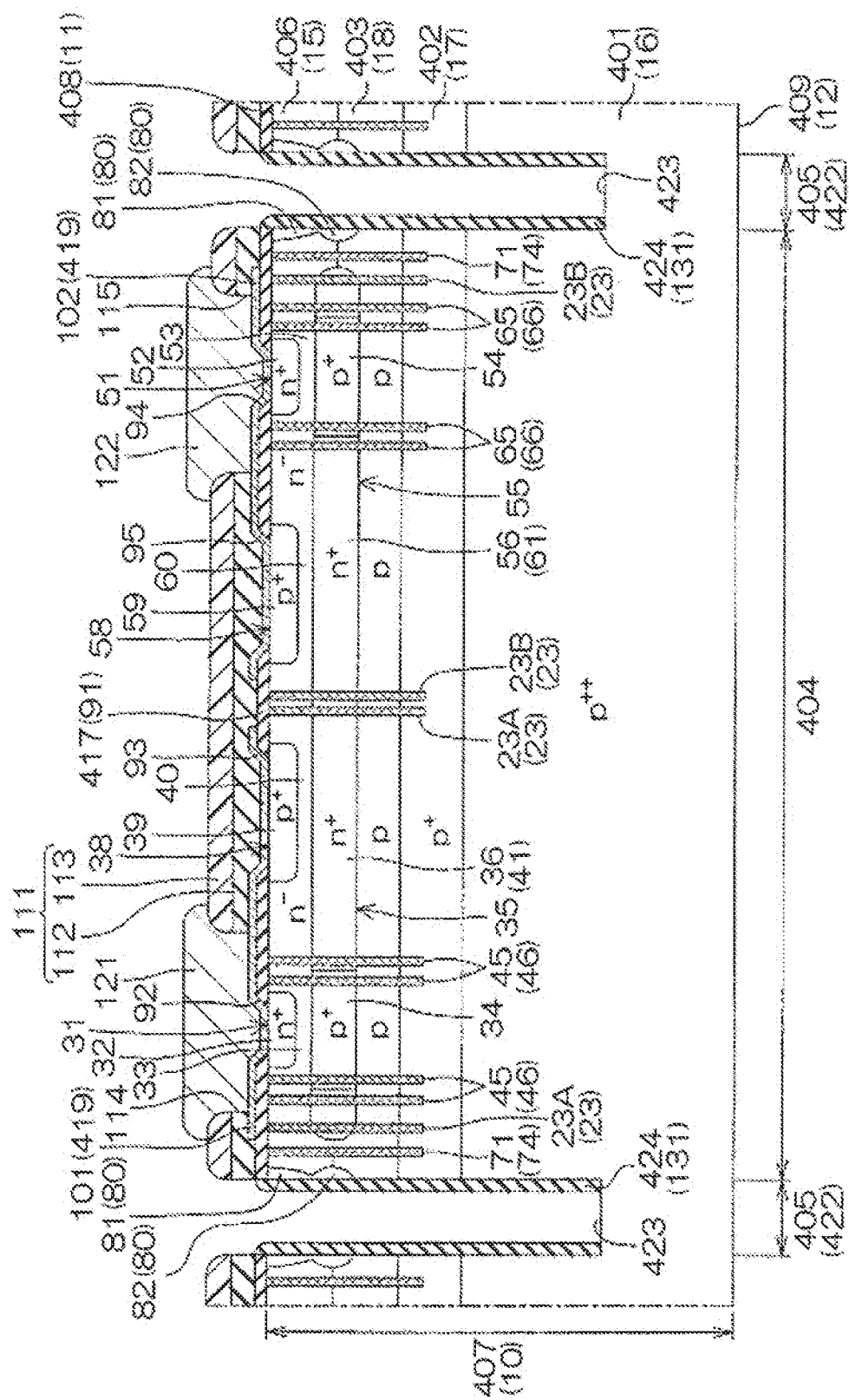
FIG. 15X is a cross-sectional view of the next step of FIG. 15W.
Figure 15Y:
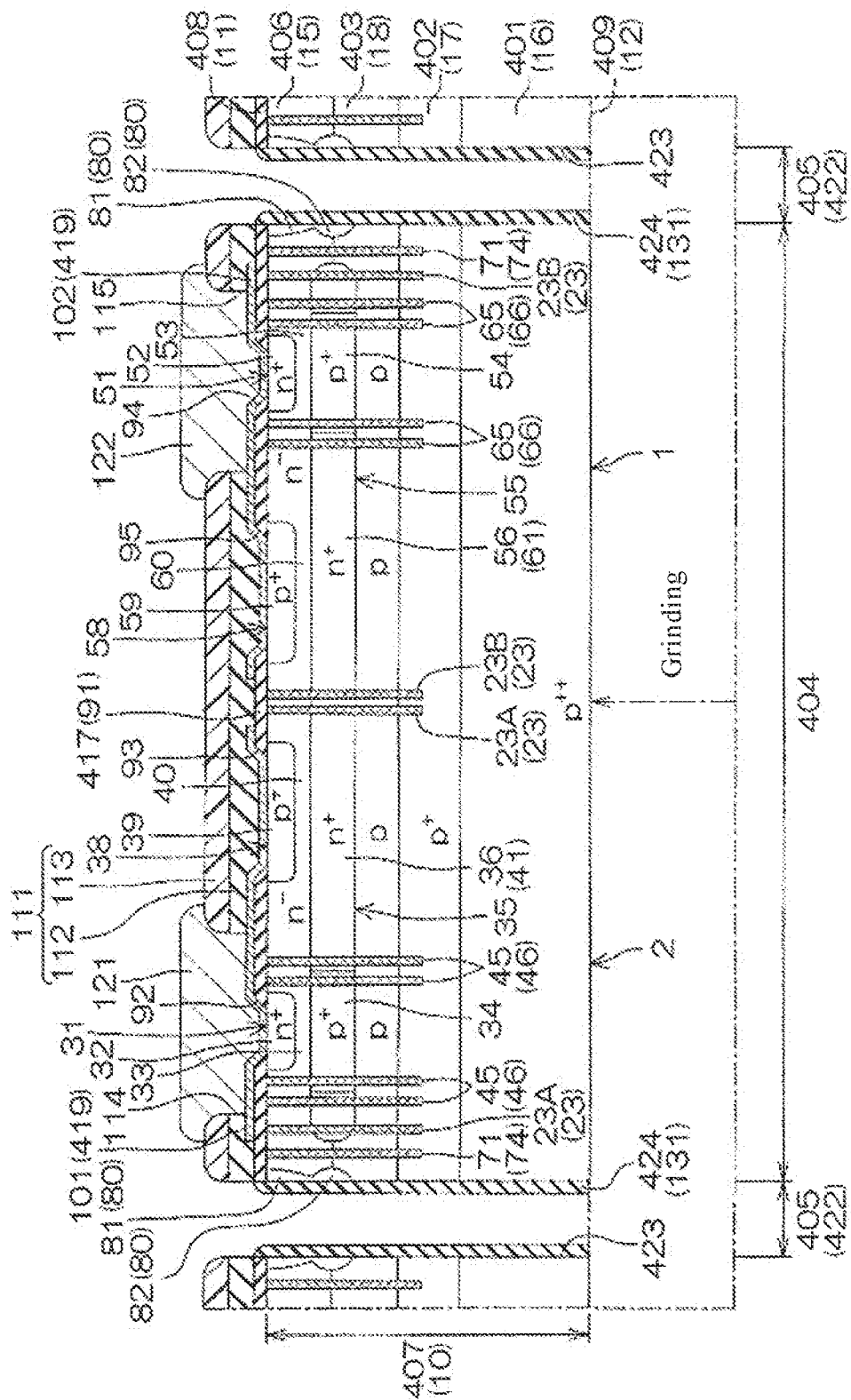
FIG. 15Y is a cross-sectional view of the next step of FIG. 15X.

FIG. 15A to FIG. 15Y are cross-sectional views of a manufacturing method applicable to the diode chip 1 shown in FIG. 1 in an embodiment of the present disclosure.

Referring to FIG. 15A, a p++-type, silicon-made semiconductor wafer 401 intended to be the base for the semiconductor chip 10 (i.e., high concentration layer 16) is provided. Alternatively, the p-type dopant of the semiconductor wafer 401 may be boron.

Referring to FIG. 15B, the silicon on the main surface of the semiconductor wafer 401 undergoes crystalline growth by epitaxial growth. In the foregoing step, the p-type dopant diffuses to the silicon currently undergoing crystalline growth on the semiconductor wafer 401. Therefore, a p+-type first epitaxial layer 402 intended to function as the base for the concentration decreasing layer 17 is formed on the semiconductor wafer 401.

Referring to FIG. 15C, a p-type dopant (for example, boron) is introduced onto the surface of the first epitaxial layer 402. Alternatively, the p-type dopant may be introduced onto the surface of the first epitaxial layer 402 by ion implantation. Therefore, the p-type dopant concentration on the surface of the first epitaxial layer 402 is increased.

Referring to FIG. 15D, the silicon on the first epitaxial layer 402 undergoes crystalline growth by epitaxial growth. Therefore, a p-type second epitaxial layer 403 intended to function as the base for the concentration keeping layer 18 is formed on the first epitaxial layer 402. The conductivity type of the second epitaxial layer 403 may be n-type or p-type.

Then, predetermined dicing regions 405 corresponding in position to multiple chip regions 404 of the diode chip 1 and separating the multiple chip regions 404, respectively, are configured. FIG. 15D shows only one chip region 404 for illustrative sake. The chip regions 404 are separated and spaced apart from each other in first direction X and second direction Y and configured to be arranged in a matrix. The predetermined dicing regions 405 are arranged in a lattice pattern extending in first direction X and second direction Y so as to separate the multiple chip regions 404.

After that, the n-type dopant (for example, arsenic and/or phosphorus) is selectively introduced to intended regions of the second epitaxial layer 403 of the chip regions 404. The intended regions of the second epitaxial layer 403 of the chip regions 404 are intended for the formation of the first inner N layer 36 of the first pn junction portion 35 (the first reversed N layer 41 of the first reversed pin junction portion 38) and the second inner N layer 56 of the second pn junction portion 55 (the second reversed N layer 61 of the second reversed pin junction portion 58). The n-type dopant may be introduced onto the surface of the second epitaxial layer 403 by ion implantation which requires spacing apart ion implantation masks (not shown).

Furthermore, the p-type dopant (for example, boron) is selectively introduced to intended regions of the second epitaxial layer 403 of the chip regions 404. The intended regions of the second epitaxial layer 403 of the chip regions 404 are intended for the formation of the first P layer 34 of the first pin junction portion 31 and the second P layer 54 of the second pin junction portion 51. Furthermore, the p-type dopant is selectively introduced to intended regions of the second epitaxial layer 403 of the chip regions 404. The intended regions of the second epitaxial layer 403 of the chip regions 404 are intended for the formation of the lower region 82 of the outer dopant layer 80. The p-type dopant for use in the outer dopant layer 80 traverses the predetermined dicing regions 405 in order to be introduced into the edge portions of the chip regions 404. Alternatively, the p-type dopant may be introduced onto the surface of the second epitaxial layer 403 by ion implantation which requires spacing apart ion implantation masks (not shown).

Referring to FIG. 15E, the p-type dopant introduced onto the surface of the first epitaxial layer 402 as well as the p-type dopant and n-type dopant introduced onto the surface of the second epitaxial layer 403 undergo a drive-in process and thereby diffuse. Therefore, the p-type dopant introduced onto the surface of the first epitaxial layer 402 diffuse inside the second epitaxial layer 403, thereby forming the concentration keeping layer 18.

After being introduced onto the surface of the second epitaxial layer 403, the p-type dopant and n-type dopant become the base for the first P layer 34, first inner N layer 36 (first reversed N layer 41), second P layer 54, second inner N layer 56 (second reversed N layer 61) and lower region 82. The semiconductor wafer 401, the first epitaxial layer 402 and the second epitaxial layer 403 become the base for the first semiconductor layer 14. Alternatively, the concentration keeping layer 18 may be formed by performing substitution ion implantation and dopant diffusion and forming the second epitaxial layer 403 of a relatively high concentration directly through epitaxial growth accompanied by introduction of the p-type dopant.

Referring to FIG. 15F, given the epitaxial growth accompanied by introduction of the n-type dopant, the silicon on the second epitaxial layer 403 undergoes crystalline growth. In the foregoing step, the p-type dopant and n-type dopant diffuse from the second epitaxial layer 403 to the silicon currently undergoing crystalline growth. Therefore, a third epitaxial layer 406 functioning as the base for the second semiconductor layer 15 is formed on the second epitaxial layer 403.

Furthermore, the first inner N layer 36 (first reversed N layer 41), second inner N layer 56 (second reversed N layer 61), first P layer 34, second P layer 54 and lower region 82 are formed at the junctional portion between the second epitaxial layer 403 and the third epitaxial layer 406. Furthermore, the first pn junction portion 35 and the second pn junction portion 55 are formed at the junctional portion between the second epitaxial layer 403 and the third epitaxial layer 406.

Upon completion of the steps illustrated by FIG. 15A to FIG. 15F, a semiconductor wafer structure 407 which includes the semiconductor wafer 401, the first epitaxial layer 402, the second epitaxial layer 403 and the third epitaxial layer 406 is formed. The semiconductor wafer structure 407 has a first wafer main surface 408 and an opposing second wafer main surface 409. The first wafer main surface 408 and the second wafer main surface 409 correspond in position to the first main surface 11 and the second main surface 12 of the semiconductor chip 10, respectively.

Referring to FIG. 15G, an ion implantation mask 410 with a specified pattern is formed on the first wafer main surface 408. Portions of the chip regions 404 and portions of the predetermined dicing regions 405 are intended for the formation of the upper region 81 of the outer dopant layer 80. The ion implantation mask 410 exposes the intended portions of the chip regions 404 and the intended portions of the predetermined dicing regions 405 but covers the other portions of the chip regions 404 and the other portions of the predetermined dicing regions 405.

Next, the p-type dopant (for example, boron) is introduced onto the surface of the first wafer main surface 408 (third epitaxial layer 406) through the ion implantation mask 410. Therefore, the upper region 81 of the outer dopant layer 80 is formed on the first wafer main surface 408 within the chip regions 404 and the predetermined dicing regions 405.

Referring to FIG. 15H, a hard mask 411 with a specified pattern is formed on the first wafer main surface 408. Portions of the chip regions 404 are intended for the formation of multiple grooves 412. The hard mask 411 exposes the intended portions of the chip regions 404 but covers the other portions of the chip regions 404. The multiple grooves 412 include the region separation trench 24, the first junction separation trench 46, the second junction separation trench 66 and the shielding groove 74.

The hard mask 411 may be formed by CVD (chemical vapor deposition) or oxidation processing (for example, thermal oxidation processing). The patterning of the hard mask 411 may also be achieved by carrying out etching with spaced etching masks. The etching may be wet etching and/or dry etching.

Then, by carrying out etching with the patterned hard mask 411, surplus portions of the first wafer main surface 408 are removed. The etching may be wet etching and/or dry etching. Preferably, the etching is achieved by RIE (reactive ion etching), which serves as an example of dry etching. Therefore, the multiple grooves 412 are formed on the first wafer main surface 408. After that, the hard mask 411 is removed.

Referring to FIG. 15, a first base insulation layer 413 is formed on the first wafer main surface 408. The first base insulation layer 413 functions as the base for the region separation insulation layer 25, the first junction separation insulation layer 47, the second junction separation insulation layer 67, and the shielding insulation layer 75.

The first base insulation layer 413 extends across the inner walls of the multiple grooves 412 and the first wafer main surface 408 and thus is film-like. The first base insulation layer 413 may be formed by CVD or oxidation processing (for example, thermal oxidation processing). In this embodiment, the first base insulation layer 413 is formed by thermal oxidation processing.

After that, a polysilicon layer 414 is formed on the first base insulation layer 413. The polysilicon layer 414 functions as the base for the polysilicon 26 of the region separation structure 23, the polysilicon 48 of the first junction separation structure 45, the polysilicon 68 of the second junction separation structure 65, and the polysilicon 76 of the shielding structure 71. The polysilicon layer 414 is spaced apart from the first base insulation layer 413, embedded in the multiple grooves 412, and adapted to cover the first wafer main surface 408. The polysilicon layer 414 may be formed by CVD.

Referring to FIG. 15J, surplus portions of the polysilicon layer 414 are removed by etching. The etching may be wet etching and/or dry etching. Removal of the surplus portions of the polysilicon layer 414 continues until the first base insulation layer 413 is exposed.

Next, surplus portions of the first base insulation layer 413 are removed by etching. The etching may be wet etching and/or dry etching. Removal of the surplus portions of the first base insulation layer 413 continues until the first wafer main surface 408 is exposed. A portion of the first base insulation layer 413 covers the first wafer main surface 408 and may serve as a residual portion of the inter-insulation layer 91. Therefore, the region separation structure 23, the first junction separation structure 45, the second junction separation structure 65 and the shielding structure 71 are formed within the chip regions 404.

Referring to FIG. 15K, an ion implantation mask 415 with a specified pattern is formed on the first wafer main surface 408. Portions of the chip regions 404 are intended for the formation of the first N layer 32 of the first pin junction portion 31 and the second N layer 52 of the second pin junction portion 51. The ion implantation mask 415 exposes the intended portions of the chip regions 404 but covers the other portions of the chip regions 404.

After that, the n-type dopant (for example, phosphorus) is introduced onto the first wafer main surface 408 (third epitaxial layer 406) through the ion implantation mask 415. Therefore, the first N layer 32 and second N layer 52 are formed on the first wafer main surface 408 within the chip regions 404. Furthermore, the first pin junction portion 31 including the first N layer 32, first I layer 33 and first P layer 34 and the second pin junction portion 51 including the second N layer 52, second I layer 53 and second P layer 54 are formed on the first wafer main surface 408 (third epitaxial layer 406) within the chip regions 404. Then, the ion implantation mask 415 is removed.

Referring to FIG. 15L, an ion implantation mask 416 with a specified pattern is formed on the first wafer main surface 408. Portions of the chip regions 404 are intended for the formation of the first reversed P layer 39 of the first reversed pin junction portion 38 and the second reversed P layer 59 of the second reversed pin junction portion 58. The ion implantation mask 416 exposes the intended portions of the chip regions 404 but covers the other portions of the chip regions 404.

Then, the p-type dopant (for example, boron) is introduced onto the first wafer main surface 408 (third epitaxial layer 406) through the ion implantation mask 416. Therefore, the first reversed P layer 39 and the second reversed P layer 59 are formed on the first wafer main surface 408 within the chip regions 404. Furthermore, the first reversed pin junction portion 38 including the first reversed P layer 39, first reversed I layer 40 and first reversed N layer 41 and the second reversed pin junction portion 58 including the second reversed P layer 59, second reversed I layer 60 and second reversed N layer 61 are formed on the first wafer main surface 408 (third epitaxial layer 406) within the chip regions 404. After that, the ion implantation mask 416 is removed. Alternatively, the step illustrated by FIG. 15L may precede the step illustrated by FIG. 15K.

Referring to FIG. 15M, a second base insulation layer 417 which functions as a base for the inter-insulation layer 91 is formed on the first wafer main surface 408. In this embodiment, the second base insulation layer 417 has an ONO laminate structure formed by laminating the first silicon oxide layer, silicon nitride layer and second silicon oxide layer sequentially from the first wafer main surface 408. The first silicon oxide layer may be formed by CVD or oxidation processing (for example, thermal oxidation processing). The silicon nitride layer and the second silicon oxide layer may be formed by CVD.

Referring to FIG. 15N, a resist mask 418 with a specified pattern is formed on the second base insulation layer 417. Portions of the second base insulation layer 417 of the chip regions 404 are intended for the formation of the first pin opening 92, first reversed pin opening 93, second pin opening 94 and second reversed pin opening 95. The resist mask 418 exposes the intended portions of the second base insulation layer 417 of the chip regions 404 but covers the other portions of the second base insulation layer 417 of the chip regions 404.

Then, surplus portions of the second base insulation layer 417 are removed by performing etching which entails spacing apart the resist masks 418. The etching may be wet etching and/or dry etching. Therefore, the first pin opening 92, first reversed pin opening 93, second pin opening 94 and second reversed pin opening 95 are formed on the second base insulation layer 417 of the chip regions 404. After that, the resist mask 418 is removed.

Referring to FIG. 15O, a base electrode layer 419 which functions as the base for the first electrode layer 101 and the second electrode layer 102 is formed on the second base insulation layer 417. The base electrode layer 419 may include at least one of a pure Cu layer (Cu layer of purity greater than 99%), pure Al layer (Al layer of purity greater than 99%), AlSi alloy layer, AlCu alloy layer and AlSiCu alloy layer. The base electrode layer 419 may be formed by sputtering and/or evaporation.

Referring to FIG. 15P, a resist mask 420 with a specified pattern is formed on the base electrode layer 419. Portions of the base electrode layer 419 of the chip regions 404 are intended for the formation of the first electrode layer 101 and the second electrode layer 102. The resist mask 420 covers the intended portions of the base electrode layer 419 of the chip regions 404 and exposes the other portions of the base electrode layer 419 of the chip regions 404.

Next, surplus portions of the base electrode layer 419 are removed by performing thereon etching which entails spacing apart the resist masks 420. The etching may be wet etching and/or dry etching. Therefore, the first electrode layer 101 and the second electrode layer 102 are formed within the chip regions 404. Afterward, the resist mask 420 is removed.

Referring to FIG. 15Q, the passivation layer 112 is formed on the second base insulation layer 417. The passivation layer 112 covers the first electrode layer 101 and the second electrode layer 102 above the second base insulation layer 417. In this embodiment, the passivation layer 112 includes silicon nitride. The passivation layer 112 may be formed by CVD.

Referring to FIG. 15R, the resin layer 113 is formed on the passivation layer 112. The resin layer 113 is formed by coating photosensitive resin (polyimide in the embodiment) on the passivation layer 112. Therefore, the uppermost insulation layer 111 including the passivation layer 112 and the resin layer 113 is formed.

Referring to FIG. 15S, after the resin layer 113 has undergone exposure while corresponding in pattern to the first bonding pad opening 114, the second bonding pad opening 115 and the predetermined dicing regions 405, the resin layer 113 undergoes development. Therefore, multiple openings 421, which correspond in pattern to the first bonding pad opening 114, the second bonding pad opening 115 and the predetermined dicing regions 405, are formed on the resin layer 113.

Referring to FIG. 15T, surplus portions of the passivation layer 112 are exposed from the openings 421 of the resin layer 113 and removed by etching which entails using the resin layer 113 as a mask. The etching may be wet etching and/or dry etching. Therefore, the first bonding pad opening 114, the second bonding pad opening 115 and a dicing street 422 are formed on the uppermost insulation layer 111. The dicing street 422 is lattice-shaped and extends along the predetermined dicing regions 405.

Referring to FIG. 15U, a portion of the second base insulation layer 417 is exposed from the dicing street 422 and removed by etching. The etching may be wet etching and/or dry etching. Therefore, a portion the second base insulation layer 417 covers the chip regions 404 and is diced to form the inter-insulation layer 91.

Next, a portion of the first wafer main surface 408 is exposed from the dicing street 422 and removed by etching. The etching may be wet etching and/or dry etching. Preferably, the etching is achieved by RIE, which serves as an example of dry etching. Preferably, the etching is Bosch process. Therefore, a dicing groove 423 which demarcates the multiple chip regions 404 is formed on the first wafer main surface 408.

The dicing groove 423 penetrates the third epitaxial layer 406, second epitaxial layer 403 and first epitaxial layer 402 and reaches a midway portion (in the thickness direction) of the semiconductor wafer 401 (i.e., high concentration layer 16), thereby allowing the first epitaxial layer 402 to function as the concentration decreasing layer 17, the second epitaxial layer 403 as the concentration keeping layer 18, and the third epitaxial layer 406 as the second semiconductor layer 15.

Referring to FIG. 15V, a third base insulation layer 424 functioning as a base for the lateral surface insulation layers 131 is formed on the first wafer main surface 408. The third base insulation layer 424 extends across the inner wall of the dicing groove 423 and thus is film-like, so as to cover collectively structural elements on the side of the first wafer main surface 408. In this embodiment, the third base insulation layer 424 includes silicon oxide. The third base insulation layer 424 may be formed by CVD.

Referring to FIG. 15W, a surplus portion of the third base insulation layer 424 is removed by etching. The etching may be wet etching and/or dry etching. Preferably, the etching is achieved by RIE, which serves as an example of dry etching.

Therefore, the third base insulation layer 424 is removed, except for its portion which covers lateral surfaces of the dicing groove 423.

Referring to FIG. 15X, the first terminal electrode 121 and the second terminal electrode 122 are formed within the chip regions 404. In this embodiment, the first terminal electrode 121 and the second terminal electrode 122 have a laminate structure formed by laminating together a Ni layer, a Pd layer and an Au layer sequentially from the first wafer main surface 408. The Ni layer, Pd layer and Au layer may be each formed by electroplating and/or electroless plating.

Referring to FIG. 15Y, the second wafer main surface 409 is ground until it comes into communication with the dicing groove 423. Therefore, the semiconductor wafer structure 407 is turned into the semiconductor chip 10, allowing one said semiconductor wafer structure 407 to be diced into multiple diode chips 1. Alternatively, the grinding step of the second wafer main surface 409 may continue even after the second wafer main surface 409 has come into communication with the dicing groove 423. In other words, the grinding step of the second wafer main surface 409 may also include a thinning step of the semiconductor chip 10 (high concentration layer 16). Therefore, the diode chips 1 are manufactured by the foregoing steps.

Figure 16:
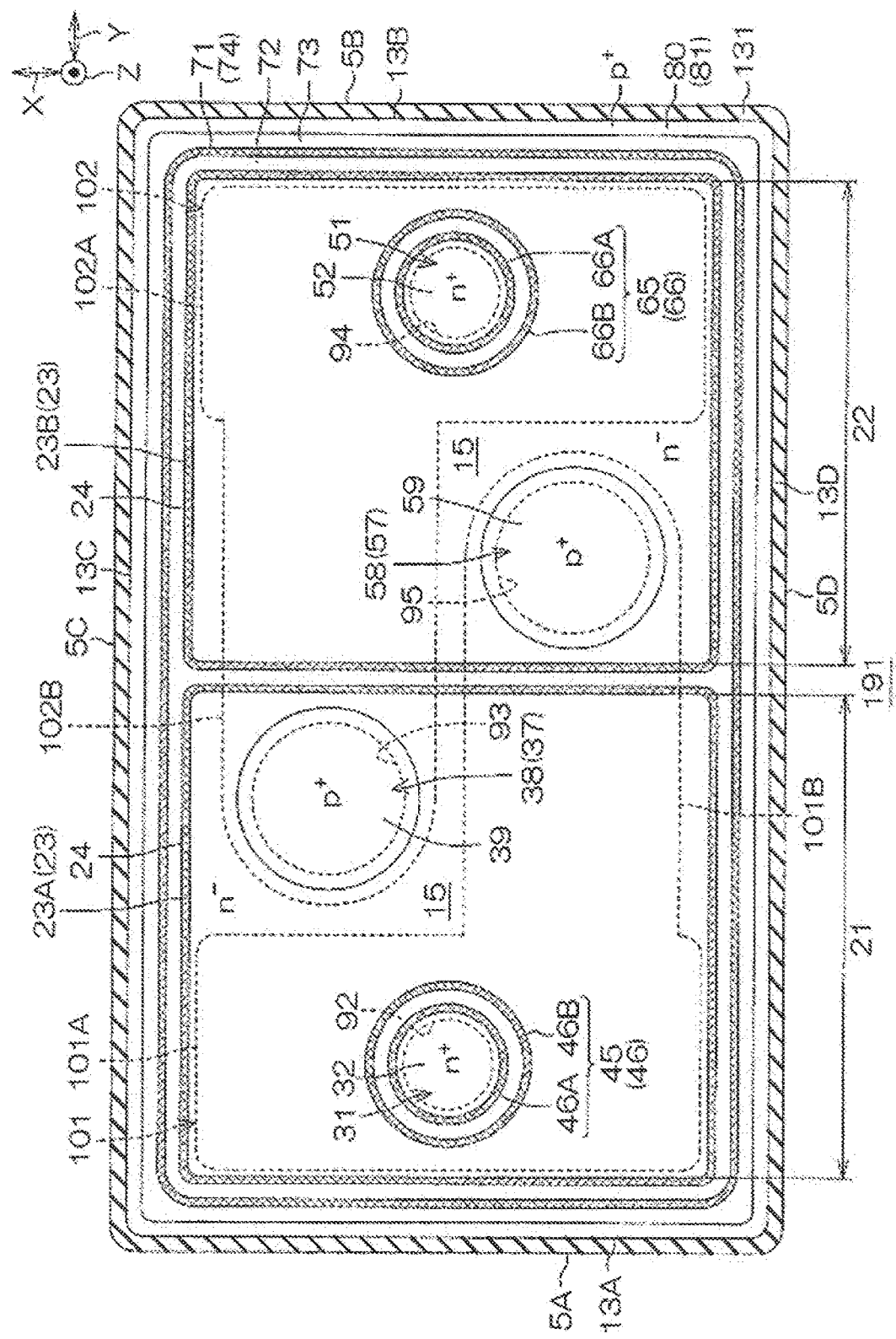
FIG. 16, which corresponds to FIG. 6, is a top view of another diode chip in the second embodiment of the present disclosure.

FIG. 16, which corresponds to FIG. 6, is a top view of a diode chip 191 in the second embodiment of the present disclosure.

In the first embodiment, the first parallel-connected circuit 42 is formed between the first diode pair 37 and the first pin junction portion 31, whereas the second parallel-connected circuit 62 is formed between the second diode pair 57 and the second pin junction portion 51.

By contrast, in the diode chip 191, a first parallel-connected circuit 192 is formed between the second pin junction portion 51 and the first diode pair 37, whereas a second parallel-connected circuit 193 is formed between the second diode pair 57 and the first pin junction portion 31. The diode chip 191 is described in detail below, and its technical features are, for the sake of brevity, not described hereunder when denoted by the same reference numerals with those of the diode chip 1.

Referring to FIG. 16, the diode chip 191 includes, within the first device region 21, one first pin junction portion 31, one first pn junction portion 35, and one first reversed pin junction portion 38. The first pin junction portion 31 in the second embodiment is formed in such a manner as to have the same layout as its counterpart in the first embodiment. Alternatively, the first pin junction portion 31 is of any layout.

When viewed from above, the first reversed pin junction portion 38 is separated from the first pin junction portion 31 and formed on the other side of the surface of the first device region 21 (i.e., on the side of the second lateral surface 13B). When the first reversed pin junction portion 38 is configured with a central line which traverses a central portion of the first main surface 11 in second direction Y, the second device region 22 is formed in such a manner as to deviate from the central line to the third lateral surface 13C.

The first reversed pin junction portion 38 may be opposite the first pin junction portion 31 in second direction Y or may not be opposite the first pin junction portion 31 in second direction Y. The first diode pair 37 is formed between the first reversed pin junction portion 38 and the first pn junction portion 35.

The diode chip 191 includes, within the second device region 22, one second pin junction portion 51, one second pn junction portion 55, and one second reversed pin junction portion 58. The second pin junction portion 51 in the second embodiment is formed in such a manner as to have the same layout as its counterpart in the first embodiment.

In this embodiment, the first parallel-connected circuit 192 is formed between the second pin junction portion 51 and the first diode pair 37 through the semiconductor chip 10 (first semiconductor layer 14). The second pin junction portion 51 is of any layout; however, the layout of the second pin junction portion 51 is preferably linearly symmetrical and/or point-symmetrical to the layout of the first pin junction portion 31.

When viewed from above, the second reversed pin junction portion 58 is separated from the second pin junction portion 51 and formed on one side of the surface of the second device region 22 (i.e., on the side of the first lateral surface 13A). When the second reversed pin junction portion 58 is configured with a central line which traverses the central portion of the first main surface 11 in second direction Y, the second reversed pin junction portion 58 is formed in such a manner as to deviate from the central line to the fourth lateral surface 13D.

The second reversed pin junction portion 58 is not opposite the first reversed pin junction portion 38 in second direction Y. Alternatively, the second reversed pin junction portion 58 may be opposite the second pin junction portion 51 in second direction Y or may not be opposite the second pin junction portion 51 in second direction Y. The second reversed pin junction portion 58 is preferably formed in such a manner as to be point-symmetrical to the first reversed pin junction portion 38 with respect to the central portion of the first main surface 11.

The second diode pair 57 is formed between the second reversed pin junction portion 58 and the second pn junction portion 55. In this embodiment, the second parallel-connected circuit 193 is formed between the second diode pair 57 and the first pin junction portion 31 through the semiconductor chip 10 (first semiconductor layer 14). A TVS circuit 194 is formed between the second parallel-connected circuit 193 and the first parallel-connected circuit 192.

Within the first device region 21, the first electrode layer 101 penetrates the inter-insulation layer 91 and connects to the first pin junction portion 31. Within the second device region 22, the first electrode layer 101 penetrates the inter-insulation layer 91 and electrically connects to the second diode pair 57.

The first electrode layer 101 includes the first bonding pad portion 101A and the first wiring portion 101B. When viewed from above, the first bonding pad portion 101A is separated from the first reversed pin junction portion 38 and formed on one side of the first device region 21 (i.e., on the side of the first lateral surface 13A). When viewed from above, the first bonding pad portion 101A is formed in such a manner as to overlap the first pin junction portion 31 but not to overlap the first reversed pin junction portion 38.

The first bonding pad portion 101A enters the first pin opening 92 from above the inter-insulation layer 91. The first bonding pad portion 101A is, in the first pin opening 92, electrically connected to the first pin junction portion 31. An ohmic contact is formed between the first bonding pad portion 101A and the first pin junction portion 31 (first N layer 32).

The first wiring portion 101B is extended outward, in a band-shaped manner, from the first bonding pad portion 101A to traverse the juncture of the first device region 21 and the second device region 22 and extend toward the second reversed pin junction portion 58. The width (in first direction X) of the first wiring portion 101B is less than the width (in first direction X) of the first bonding pad portion 101A. The first wiring portion 101B is of any width in first direction X.

The first wiring portion 101B enters the second reversed pin opening 95 from above the inter-insulation layer 91. The first wiring portion 101B is, in the second reversed pin opening 95, electrically connected to the second reversed pin junction portion 58. An ohmic contact is formed between the first wiring portion 101B and the second reversed pin junction portion 58 (second reversed P layer 59).

Therefore, the first electrode layer 101 is, in the first device region 21, connected to the first pin junction portion 31 and is, in the second device region 22, electrically connected to the second diode pair 57. In other words, the first electrode layer 101 allows the first pin junction portion 31 to be parallel-connected to the second diode pair 57.

Within the second device region 22, the second electrode layer 102 penetrates the inter-insulation layer 91 and connects to the second pin junction portion 51. Within the first device region 21, the second electrode layer 102 penetrates the inter-insulation layer 91 and electrically connects to the first diode pair 37.

The second electrode layer 102 includes the second bonding pad portion 102A and the second wiring portion 102B. When viewed from above, the second bonding pad portion 102A is separated from the second reversed pin junction portion 58 and formed on the other side of the second device region 22 (i.e., on the side of the second lateral surface 13B). When viewed from above, the second bonding pad portion 102A is formed in such a manner as to overlap the second pin junction portion 51 but not to overlap the second reversed pin junction portion 58.

The second bonding pad portion 102A enters the second pin opening 94 from above the inter-insulation layer 91. The second bonding pad portion 102A is, in the second pin opening 94, electrically connected to the second pin junction portion 51. An ohmic contact is formed between the second bonding pad portion 102A and the second pin junction portion 51 (second N layer 52).

The second wiring portion 102B is extended outward, in a band-shaped manner, from the second bonding pad portion 102A to traverse the juncture of the first device region 21 and the second device region 22 and extend toward the first reversed pin junction portion 38. The second wiring portion 102B and the first wiring portion 101B are separated and spaced apart from each other in first direction X and extend parallelly relative to the first wiring portion 101B.

The width (in first direction X) of the second wiring portion 102B is less than the width (in first direction X) of the second bonding pad portion 102A. The second wiring portion 102B is of any width in first direction X. The width (in first direction X) of the second wiring portion 102B is preferably equal to the width (in first direction X) of the first wiring portion 101B.

The second wiring portion 102B enters the first reversed pin opening 93 from above the inter-insulation layer 91. The second wiring portion 102B is, in the first opening 93, electrically connected to the first reversed pin junction portion 38. An ohmic contact is formed between the second wiring portion 102B and the first reversed pin junction portion 38 (first reversed P layer 39).

Therefore, the second electrode layer 102 is connected to the second pin junction portion 51 within the second device region 22 and electrically connected to the first diode pair 37 within the first device region 21. In other words, the second electrode layer 102 allows the second pin junction portion 51 to be parallel-connected to the first diode pair 37.

Figure 17:
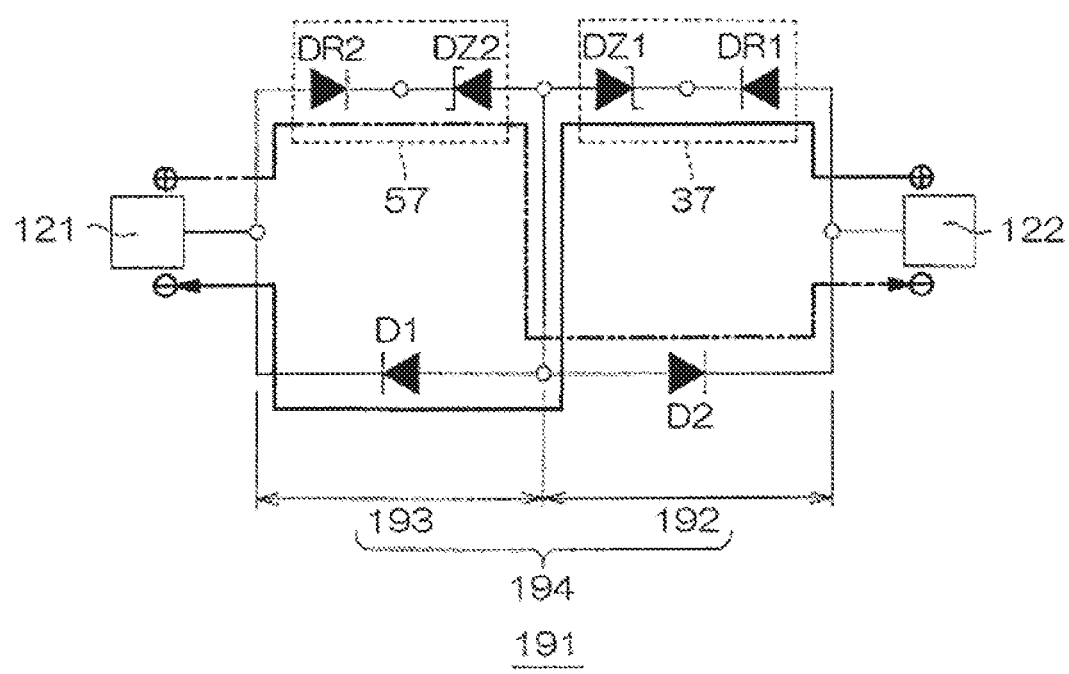
FIG. 17 is a circuit diagram of the diode chip shown in FIG. 16.

FIG. 17 is a circuit diagram of the diode chip 191 shown in FIG. 16. Referring to FIG. 16, the diode chip 191 includes the first terminal electrode 121, the second terminal electrode 122 and the TVS circuit 194. The TVS circuit 194 includes a series-connection circuit series-connecting the first parallel-connected circuit 192 and the second parallel-connected circuit 193 and electrically connected to the first terminal electrode 121 and the second terminal electrode 122.

The first parallel-connected circuit 192 includes the second pin diode D2 and the first diode pair 37. The first diode pair 37 includes a first reversed pin diode DR1 and a first Zener diode DZ1. The cathode of the second pin diode D2 is electrically connected to the second terminal electrode 122.

The first diode pair 37 includes a reversed series-connection circuit in which the cathode of the first reversed pin diode DR1 is connected in reverse biased to the cathode of the first Zener diode DZ1. The anode of the first reversed pin diode DR1 is electrically connected to the second terminal electrode 122. The anode of the first Zener diode DZ1 is connected in reverse biased to the anode of the second pin diode D2.

The second parallel-connected circuit 193 includes the first pin diode D1 and a second diode pair 57. The second diode pair 57 includes the second reversed pin diode DR2 and the second Zener diode DZ2. The cathode of the first pin diode D1 is electrically connected to the first terminal electrode 121. The anode of the first pin diode D1 is connected in reverse biased to the anode of the first Zener diode DZ1 and the second pin diode D2.

The second diode pair 57 includes a reversed series-connection circuit in which the cathode of the second reversed pin diode DR2 is connected in reverse biased to the cathode of the second Zener diode DZ2. The anode of the second reversed pin diode DR2 is electrically connected to the first terminal electrode 121. The anode of the second Zener diode DZ2 is connected in reverse biased to the anode of the first pin diode D1, the anode of the first Zener diode DZ1, and the anode of the second pin diode D2.

The diode chip 191 is a bidirectional device whereby a current flows in the direction of the first terminal electrode 121 and in the direction of the second terminal electrode 122. Thus, if a voltage greater than a specified threshold voltage (with the first terminal electrode 121 being the positive terminal) is applied to between the first terminal electrode 121 and the second terminal electrode 122, the current will flow from the first terminal electrode 121 to the second terminal electrode 122 through the second diode pair 57 and the second pin diode D2.

If a voltage greater than a specified threshold voltage (with the second terminal electrode 122 being the positive terminal) is applied to between the first terminal electrode 121 and the second terminal electrode 122, the current will flow from the second terminal electrode 122 to the first terminal electrode 121 through the first diode pair 37 and the first pin diode D1.

The electrical characteristics of the diode chip 191 functioning as a bidirectional device are enhanced, by augmenting the symmetry of the layout of the second pin junction portion 51, the second pn junction portion 55 and the second reversed pin junction portion 58 relative to the layout of the first pin junction portion 31, the first pn junction portion 35 and the first reversed pin junction portion 38. In other words, the electrical characteristics of the current flowing from the first terminal electrode 121 to the second terminal electrode 122 are identical to the electrical characteristics of the current flowing from the second terminal electrode 122 to the first terminal electrode 121.

Therefore, the diode chip 191 is as effective as the diode chip 1. Furthermore, from the perspective of electrical connection, the electrical characteristics of the diode chip 191 is also enhanced.

Regarding the diode chip 1, the current flows from the first diode pair 37 to the semiconductor chip 10 (first semiconductor layer 14) and traverses the juncture of the first device region 21 and the second device region 22 to flow to the second pin junction portion 51. Likewise, the current flows from the second diode pair 57 to the semiconductor chip 10 (first semiconductor layer 14) and traverses the juncture of the first device region 21 and the second device region 22 to flow to the first pin junction portion 31. Therefore, the diode chip 1 has a structure susceptible to the resistance component of the semiconductor chip 10 (first semiconductor layer 14).

Therefore, regarding the diode chip 191, the first parallel-connected circuit 192 is formed between the second pin junction portion 51 and the first diode pair 37, whereas the second parallel-connected circuit 193 is formed between the second diode pair 57 and the first pin junction portion 31. In the diode chip 191, the first electrode layer 101 is electrically connected to the first pin junction portion 31 and the second diode pair 57, whereas the second electrode layer 102 is electrically connected to the first diode pair 37 and the second pin junction portion 51.

Owing to the foregoing structural features, the current flows to the first pin junction portion 31 through the first diode pair 37 within the first device region 21. Furthermore, the current flows to the second pin junction portion 51 through the second diode pair 57 within the second device region 22. Therefore, the required current path is shortened, and thus the effect of the resistance component of the semiconductor chip 10 (first semiconductor layer 14) decreases. Consequently, maximum current capacity IPP increases according to the decrease in the resistance component, thereby lowering clamping voltage VCL.

The embodiments of the present disclosure may be further implemented by any other variant embodiments.

In each of the foregoing embodiments, the first pin junction portion 31 and the first reversed pin junction portion 38 may be interchanged, whereas the second pin junction portion 51 and the second reversed pin junction portion 58 may be interchanged.

In each of the foregoing embodiments, multiple first pin junction portions 31 and multiple second pin junction portions 51 may also be formed. The multiple second pin junction portions 51 are preferably linearly symmetrical and/or point-symmetrical to the multiple first pin junction portions 31.

In each of the foregoing embodiments, alternatively, multiple first reversed pin junction portions 38 and multiple second reversed pin junction portions 58 may be formed. Under this condition, the multiple first reversed pin junction portions 38 are parallel-connected to each other, and one first diode pair 37 is formed between each of the multiple first reversed pin junction portions 38 and one first pn junction portion 35. Likewise, the multiple second reversed pin junction portions 58 are parallel-connected to each other, and one second diode pair 57 is formed between each of the multiple second reversed pin junction portions 58 and one second pn junction portion 55. The multiple second reversed pin junction portions 58 are preferably linearly symmetrical and/or point-symmetrical to the multiple first reversed pin junction portions 38.

Alternatively, in the foregoing embodiments, each semiconductor may have its conductivity type reversed. In other words, each semiconductor may also change from p-type to n-type, and from n-type to p-type. Under this condition, the polarity directions of the first pin diode D1, the first Zener diode DZ1, the first reversed pin diode DR1, the second pin diode D2, the second Zener diode DZ2, and the second reversed pin diode DR2 reverse, respectively.

Alternatively, the foregoing embodiments may dispense with the shielding structure 71. Alternatively, the foregoing embodiments may dispense with the outer dopant layer 80. Alternatively, the foregoing embodiments may dispense with the lateral surface insulation layers 131. Under this condition, the lateral surfaces 13A to 13D of the semiconductor chip 10 form portions of the chip lateral surfaces 5A to 5D of the chip body 2, respectively.

The technical features described above and depicted by the accompanying drawings are summarized below.

The objective of [A1] to [A19] is to provide a semiconductor device capable of attaining excellent electrical characteristics.

[A1] A semiconductor device, including: a first conductivity type first semiconductor layer, including a first conductivity type high concentration layer, formed on the high concentration layer and having a first conductivity type concentration decreasing layer with a concentration gradient defining a decrease in a first conductivity type dopant concentration from the high concentration layer, and a first conductivity type concentration keeping layer formed on the concentration decreasing layer and keeping a specified first conductivity type dopant concentration to thereby suppress a decrease in the dopant concentration in the concentration decreasing layer; a second conductivity type second semiconductor layer formed on the concentration keeping layer; and a second conductivity type inner semiconductor layer formed at a juncture between the concentration keeping layer and the second semiconductor layer and having a second conductivity type dopant concentration greater than the second conductivity type dopant concentration in the second semiconductor layer, wherein a pn junction is formed between the second conductivity type inner semiconductor layer and the concentration keeping layer.

The withstand voltage of the semiconductor device depends on the pn junction concentration at the pn junction. In the situation where the first semiconductor layer dispenses with the concentration keeping layer, a pn junction is formed between the inner semiconductor layer and the concentration decreasing layer. Under this condition, variation of the pn concentration in the pn junction becomes abrupt, and thus actual withstand voltage is likely to vary from target withstand voltage, starting from the pn junction. The foregoing issue becomes noteworthy as a result of the deviation of the thickness of the concentration decreasing layer.

Therefore, in the semiconductor device, the concentration keeping layer is formed on the concentration decreasing layer to slow down the variation of the pn concentration in the pn junction between the concentration keeping layer and the inner semiconductor layer. Given the foregoing structure, even when deviation of the thickness of the concentration keeping layer happens, the slow variation of the pn concentration appropriately suppresses the withstand voltage variation otherwise caused by the deviation of the thickness of the concentration keeping layer. Thus, the withstand voltage variation starting from the pn junction is suppressed. Therefore, the present disclosure can provide a semiconductor device capable of attaining excellent electrical characteristics.

[A2] Regarding the semiconductor device described in A1, the concentration keeping layer is formed on the concentration decreasing layer in such a manner as to be spaced apart from a concentration changing layer with a concentration gradient characterized by slope stopping.

[A3] Regarding the semiconductor device described in A1 or A2, the concentration keeping layer has a first conductivity type dopant concentration greater than the lowest level of the first conductivity type dopant concentration of the concentration decreasing layer.

[A4] Regarding the semiconductor device described in any one of A1 to A3, the concentration keeping layer has a concentration gradient of an increasing first conductivity type dopant concentration.

[A5] Regarding the semiconductor device described in any one of A1 to A4, the high concentration layer has the first conductivity type dopant concentration ranging from equal to or more than $1 \times 10^{19}$ cm$^{-3}$ to equal to or less than $1 \times 10^{21}$ cm$^{-3}$.

[A6] Regarding the semiconductor device described in any one of A1 to A5, the concentration decreasing layer has the first conductivity type dopant concentration ranging from equal to or more than $1 \times 10^{15}$ cm$^{-3}$ to equal to or less than $1 \times 10^{17}$ cm$^{-3}$.

[A7] Regarding the semiconductor device described in any one of A1 to A6, the concentration keeping layer has a first conductivity type dopant concentration ranging from equal to or more than $5 \times 10^{15}$ cm$^{-3}$ to equal to or less than $5 \times 10^{17}$ cm$^{-3}$.

[A8] Regarding the semiconductor device described in any one of A1 to A7, the concentration keeping layer is of a thickness of equal to or more than 1 µm to equal to or less than 8 µm.

[A9] Regarding the semiconductor device described in any one of A1 to A8, the concentration keeping layer is equal to or less than 5 µm in thickness.

[A10] Regarding the semiconductor device described in any one of A1 to A9, the high concentration layer includes a semiconductor substrate.

[A11] Regarding the semiconductor device described in any one of A1 to A10, the concentration decreasing layer includes an epitaxial layer.

[A12] Regarding the semiconductor device described in any one of A1 to A11, the concentration keeping layer includes an epitaxial layer.

[A13] Regarding the semiconductor device described in any one of A1 to A12, the second semiconductor layer includes an epitaxial layer.

[A14] The semiconductor device described in any one of A1 to A13 further includes a second conductivity type upper semiconductor layer which has a first conductivity type dopant concentration greater than the second conductivity type dopant concentration of the second semiconductor layer and is formed on the surface of the second semiconductor layer in such a manner as to be spaced apart from a portion of the second semiconductor layer and be opposite the inner semiconductor layer.

[A15] Regarding the semiconductor device described in A14, the upper semiconductor layer has a pin junction formed between the second semiconductor layer and the inner semiconductor layer and is reversed connected to the pn junction.

[A16] Regarding the semiconductor device described in any one of A1 to A15, the pn junction forms a Zener diode.

[A17] The semiconductor device described in any one of A1 to A16 includes a chip scale package.

[A18] The semiconductor device described in any one of A1 to A17 includes a diode chip.

[A19] The semiconductor device described in any one of A1 to A18 includes an ESD protection chip.

Although the embodiments of the present disclosure are described above, the embodiments are merely intended to illustrate the technical features of the present disclosure. The embodiments are not restrictive of the present disclosure in terms of interpretation thereof. The scope of the present disclosure can be defined only by the appended claims.

What is claimed is:

1. A diode chip, comprising:
   a semiconductor chip, comprising a main surface;
   a pin junction portion, formed on a surface of the main surface with a first polarity direction, wherein the pin junction portion comprises a first P layer, a first I layer over the P layer and a first N layer over the first I layer, and the first N layer is exposed at the surface;
   a rectifier pair, comprising a pn junction portion and a reversed pin junction portion, wherein the pn junction portion is separated from the pin junction portion and formed in the semiconductor chip with the first polarity direction, and the reversed pin junction portion is connected to the pn junction portion in reversed direction and formed on the surface of the main surface with a second polarity direction;
   a junction separation trench, formed on the main surface and between the pin junction portion and the rectifier pair in a manner of separating the pin junction portion and the rectifier pair; and
   a terminal electrode formed over the surface and electrically connected to the pin junction portion and the reversed pin junction portion, wherein from a top-view perspective, the terminal electrode overlaps the exposed first N layer,
   wherein the reversed pin junction portion comprises a second N layer, a second I layer over the second N layer and a second P layer over the second I layer, and the pn junction portion and the reversed pin junction portion share the second N layer, and
   wherein the pn junction portion comprises the second N layer and a third P layer under the second N layer, and the second N layer and the third P layer are separated from the first P layer by the junction separation trench.

2. The diode chip of claim 1, wherein the first polarity direction is a direction in which a forward current flows in a thickness direction of the semiconductor chip, and the second polarity direction is a direction in which the forward current flows oppositely to the first polarity direction and in the thickness direction of the semiconductor chip.

3. The diode chip of claim 1, wherein, when viewed from perspective view, the junction separation trench is in annular shape to surround the pin junction portion.

4. The diode chip of claim 1, wherein the junction separation trench comprises a dual-groove structure, and the dual-groove structure comprises an inner groove and an outer groove, with the inner groove surrounding the pin junction portion when viewed from perspective view, and the outer groove separated from the inner groove, spaced apart from the inner grove, and surrounding the inner groove when viewed from perspective view.

5. The diode chip of claim 4, wherein the outer groove and the inner groove are disposed between the pin junction portion and the pn junction portion.

6. The diode chip of claim 4, wherein the outer groove and the inner groove are separated by a distance of equal to or more than 1 µm to equal to or less than 10 µm.

7. The diode chip of claim 1, wherein the junction separation trench comprises an aspect ratio of more than 1 to equal to or less than 20.

8. The diode chip of claim 1, further comprising a junction separation insulation layer formed in the junction separation trench.

9. The diode chip of claim 8, further comprising a junction separation polysilicon disposed in the junction separation trench with the junction separation insulating layer.

10. The diode chip of claim 1, further comprising a region separation trench for allocating a portion of the semiconductor chip as a device region where the pin junction portion, the rectifier pair and the junction separation trench are formed.

11. The diode chip of claim 10, further comprising a region separation insulation layer formed in the region separation trench.

12. The diode chip of claim 11, further comprising a region separation polysilicon disposed in the region separation trench with the region separation insulation layer.

13. The diode chip of claim 10, wherein, when viewed from above, the region separation trench is in annular shape to surround a portion of the semiconductor chip.

14. The diode chip of claim 10, wherein the region separation trench comprises an aspect ratio of more than 1 to equal to or less than 20.

15. The diode chip of claim 10, wherein the junction separation trench is of the same depth as the region separation trench.

16. The diode chip of claim 1, wherein the pn junction portion forms a Zener diode.

17. The diode chip of claim 1, further comprising a chip scale package.

18. A diode chip, comprising:
a semiconductor chip;
a region separation structure, dividing the semiconductor chip into a first device region and a second device region;
a first pin junction portion, formed on a surface of the first device region with a first polarity direction, wherein the first pin junction portion comprises a first P layer, a first I layer over the first P layer and a first N layer over the first I layer, and the first N layer is exposed at a surface of the semiconductor chip;
a first rectifier pair, comprising a first pn junction portion and a first reversed pin junction portion, wherein the first pn junction portion is separated from the first pin junction portion and formed in the first device region with the first polarity direction, and the first reversed pin junction portion is connected to the first pn junction portion in reversed direction and formed on the surface of the first device region with a second polarity direction, wherein the first reversed pin junction portion comprises a second N layer, a second I layer over the second N layer and a second P layer over the second I layer, and the first pn junction portion and the first reversed pin junction portion share the second N layer;
a first junction separation trench, formed in the first device region and between the first pin junction portion and the first rectifier pair in a manner of separating the first pin junction portion and the first rectifier pair;
a second pin junction portion, formed on a surface of the second device region with the first polarity direction, wherein the second pin junction portion comprises a third P layer, a third I layer over the third P layer and a third N layer over the third I layer, and the third N layer is exposed at the surface of the semiconductor chip;
a second rectifier pair, comprising a second pn junction portion and a second reversed pin junction portion, wherein the second pn junction portion is separated from the second pin junction portion and formed in the second device region with the first polarity direction, and the second reversed pin junction portion is connected to the second pn junction portion in reversed direction and formed on the surface of the second device region with the second polarity direction, wherein the second reversed pin junction portion comprises a fourth N layer, a fourth I layer over the fourth N layer and a fourth P layer over the fourth I layer, and the second pn junction portion and the second reversed pin junction portion share the fourth N layer; and
a second junction separation trench, formed in the second device region and between the second pin junction portion and the second rectifier pair in a manner of separating the second pin junction portion and the second rectifier pair;
wherein the first rectifier pair and the second rectifier pair are disposed between the first pin junction portion and the second pin junction portion and between the first junction separation trench and the second junction separation trench; and
wherein the first pn junction portion comprises the second N layer and a fifth P layer under the second N layer, and the second N layer and the fifth P layer are separated from the first P layer by the first junction separation trench, and the second pn junction portion comprises the fourth N layer and a sixth P layer under the fourth N layer, and the fourth N layer and the sixth P layer are separated from the third P layer by the second junction separation trench.

19. The diode chip of claim 18, wherein the first polarity direction is a direction in which a forward current flows in a thickness direction of the semiconductor chip, and the second polarity direction is a direction in which the forward current flows oppositely to the first polarity direction and in the thickness direction of the semiconductor chip.

20. The diode chip of claim 18, further comprising:
an inter-insulation layer, covering the semiconductor chip;
a first electrode, disposed in the first device region, penetrating the inter-insulation layer, and electrically connected to the first pin junction portion and the first rectifier pair; and
a second electrode, disposed in the second device region, penetrating the inter-insulation layer, and electrically connected to the second pin junction portion and the second rectifier pair.

21. The diode chip of claim 20, further comprising:
a first terminal electrode, electrically connected to the first electrode; and
a second terminal electrode, electrically connected to the second electrode.

22. The diode chip of claim 21, further comprising an uppermost insulation layer for covering the inter-insulation layer,
wherein the first terminal electrode penetrates the uppermost insulation layer and connects to the first electrode,
wherein the second terminal electrode penetrates the uppermost insulation layer and connects to the second electrode.

23. The diode chip of claim 18, further comprising:
a first terminal electrode formed over the surface of the first device region and electrically connected to the first pin junction portion and the first reversed pin junction portion; and
a second terminal electrode formed over the surface of the second device region and electrically connected to the second pin junction portion and the second reversed pin junction portion,
wherein from a top-view perspective, the first terminal electrode overlaps the exposed first N layer, and the second terminal electrode overlaps the exposed third N layer.

24. The diode chip of claim 18, further comprising:
a first terminal electrode formed over the surface of the first device region and electrically connected to the first pin junction portion and the first reversed pin junction portion; and
a second terminal electrode formed over the surface of the second device region and electrically connected to the second pin junction portion and the second reversed pin junction portion,
wherein the first junction separation trench is directly under the first terminal electrode, and the second junction separation trench is directly under the second terminal electrode.

* * * * *